(12) United States Patent
Maeda et al.

(10) Patent No.: US 7,339,238 B2
(45) Date of Patent: Mar. 4, 2008

(54) SEMICONDUCTOR DEVICE INCLUDING A CAPACITANCE

(75) Inventors: Shigenobu Maeda, Tokyo (JP); Takashi Ipposhi, Tokyo (JP); Yuuichi Hirano, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/510,582

(22) Filed: Aug. 28, 2006

(65) Prior Publication Data

US 2006/0289906 A1    Dec. 28, 2006

Related U.S. Application Data

(62) Division of application No. 10/995,193, filed on Nov. 24, 2004, now Pat. No. 7,112,835, which is a division of application No. 10/216,722, filed on Aug. 13, 2002, now Pat. No. 6,858,918.

(30) Foreign Application Priority Data

Sep. 19, 2001    (JP)    ............................. 2001-284866

(51) Int. Cl.
*H01L 29/76*    (2006.01)
(52) U.S. Cl. ...................... 257/369; 257/288; 257/213; 257/312; 257/296; 257/E27.05; 257/E21.703; 257/E29.345
(58) Field of Classification Search ..................... None
See application file for complete search history.

(56) References Cited

U.S. PATENT DOCUMENTS 4,973,922 A    11/1990    Embree et al.
5,955,764 A *    9/1999    Katsube ...................... 257/355
5,965,912 A    10/1999    Stolfa et al.
6,097,269 A    8/2000    Hernandez
6,204,138 B1    3/2001    Krishnan et al.
6,262,618 B1    7/2001    Maggiolino
6,294,834 B1    9/2001    Yeh et al.
6,358,815 B2    3/2002    Maeda (Continued)

FOREIGN PATENT DOCUMENTS

JP    2-184081    7/1990

(Continued)

*Primary Examiner*—Sue A. Purvis
*Assistant Examiner*—Fazli Erdem
(74) *Attorney, Agent, or Firm*—Oblon, Spivak, McClelland, Maier & Neustadt, P.C.

(57) ABSTRACT

It is an object to obtain a semiconductor device including a capacitance having a great Q-value. In an SOI substrate comprising a support substrate (165), a buried oxide film (166) and an SOI layer (171), an isolating oxide film 167 (167a to 167c) is selectively formed in an upper layer portion of the SOI layer (171) with a part of the SOI layer (171) remaining as a $P^-$ well region (169). Consequently, an isolation (partial isolation) structure is obtained. An $N^+$ diffusion region (168) is formed in the SOI layer (171) between the isolating oxide films (167a) and (167b) and a $P^+$ diffusion region (170) is formed in the SOI layer (171) between the isolating oxide films (167b) and (167c). Consequently, there is obtained a junction type variable capacitance (C23) having a PN junction surface of the $P^-$ well region (169) provided under the isolating oxide film (167b) and the $N^+$ diffusion region (168).

4 Claims, 46 Drawing Sheets

U.S. PATENT DOCUMENTS

| | | |
|---|---|---|
| 6,407,412 B1 | 6/2002 | Iniewski et al. |
| 6,462,379 B2 | 10/2002 | Higashi et al. |
| 2001/0000414 A1 | 4/2001 | Fukayama et al. |
| 2003/0052389 A1 | 3/2003 | Maeda et al |

FOREIGN PATENT DOCUMENTS

| | | |
|---|---|---|
| JP | 4-37070 | 2/1992 |
| JP | 9-092815 | 4/1997 |
| JP | 11-233799 | 8/1999 |
| JP | 2000-307112 | 11/2000 |

* cited by examiner

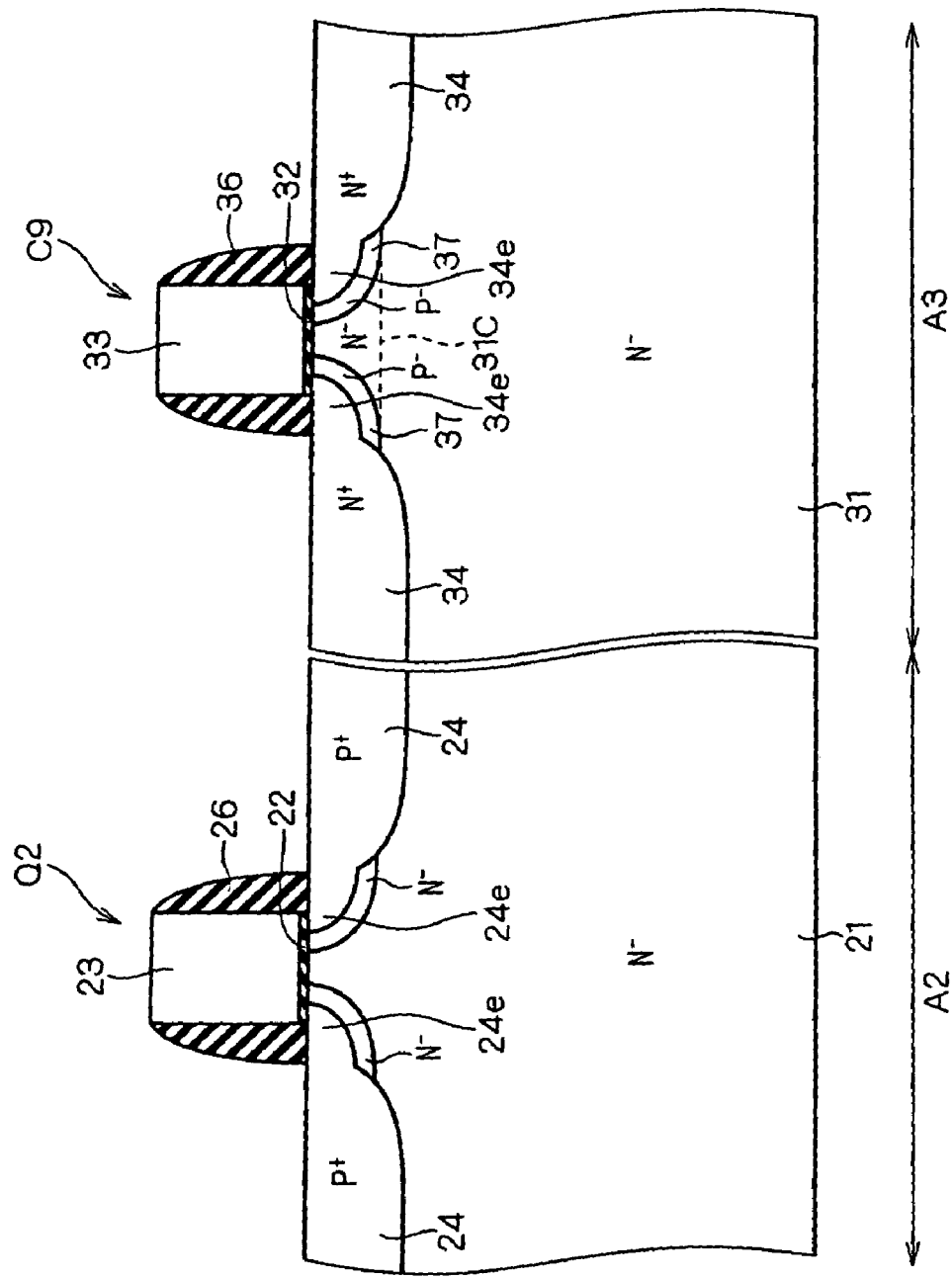

F I G . 2 1
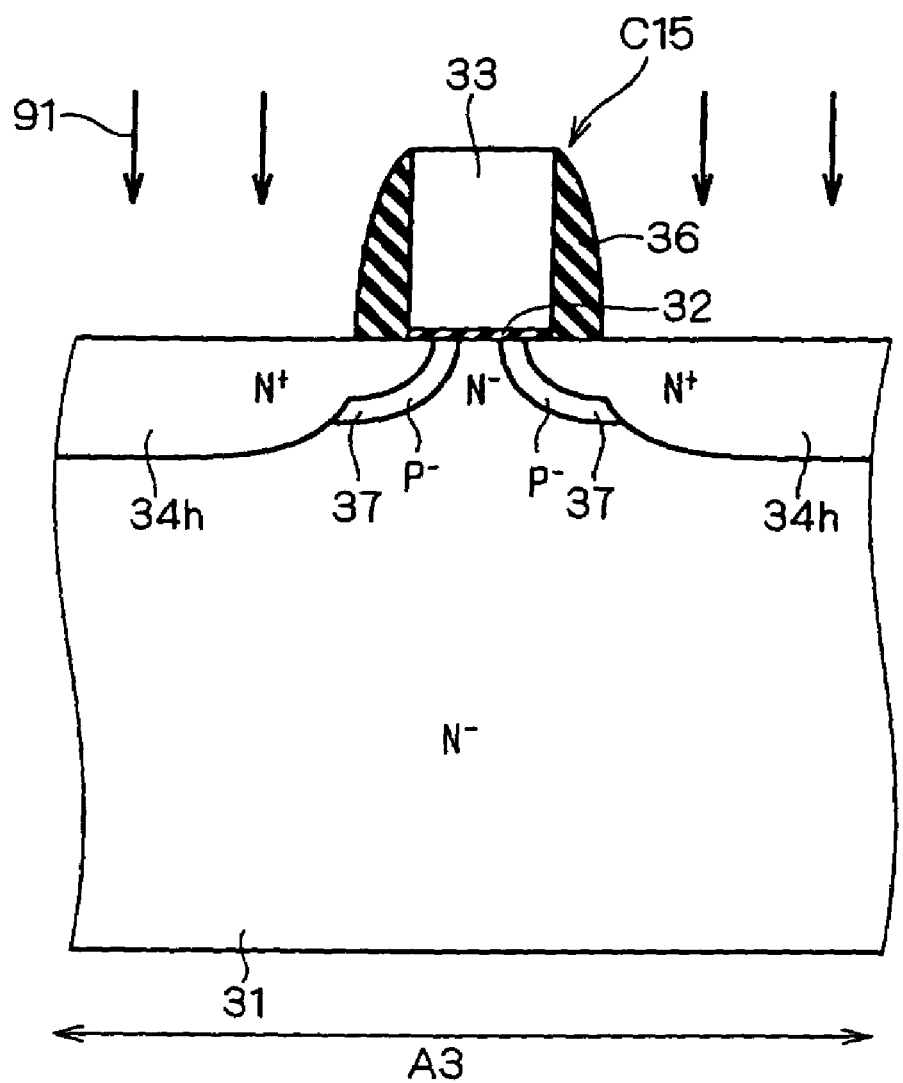

F I G . 3 1
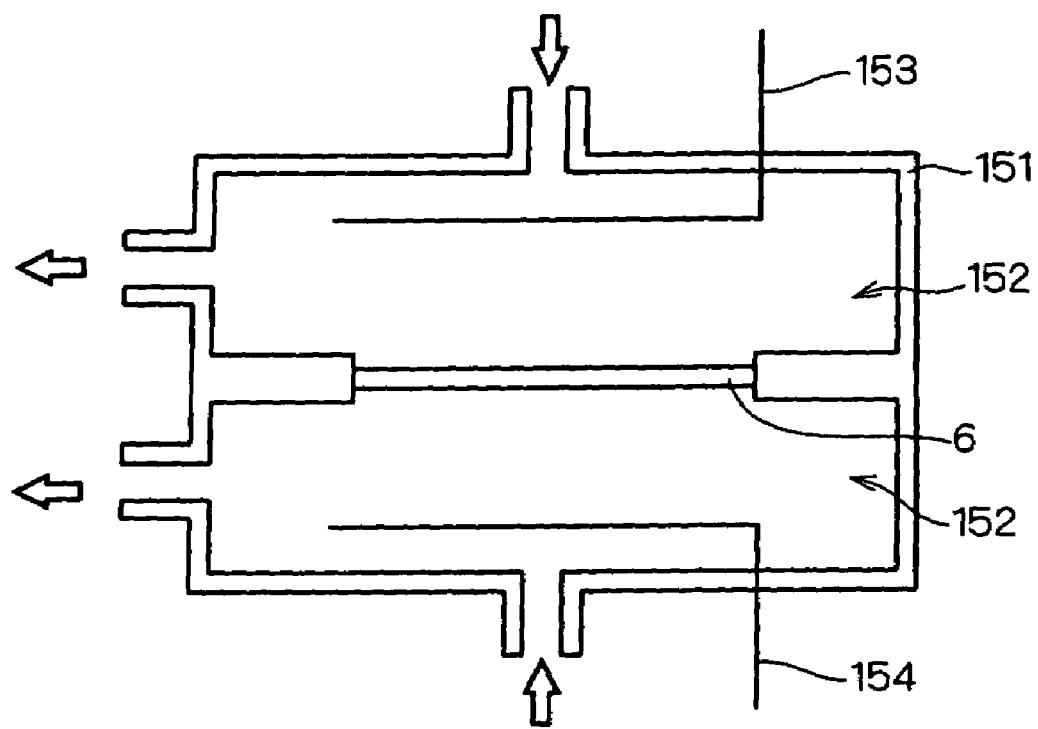

F I G . 4 3
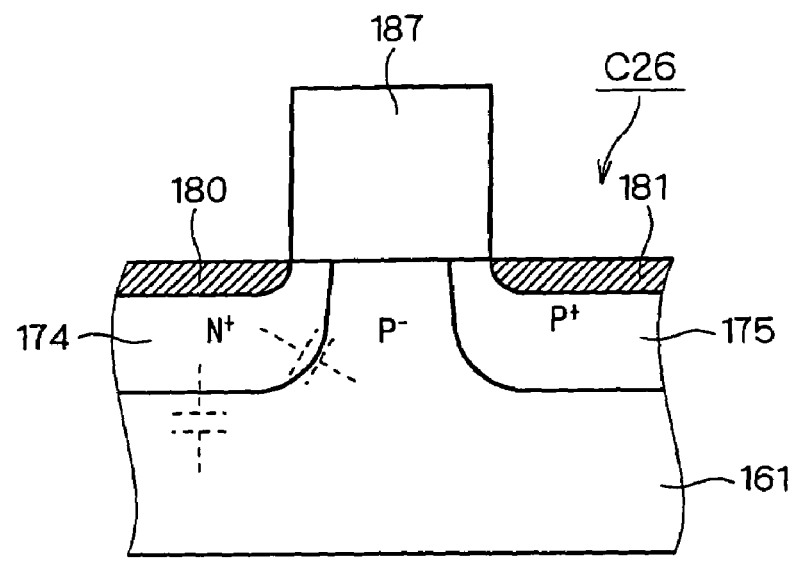
F I G . 4 4
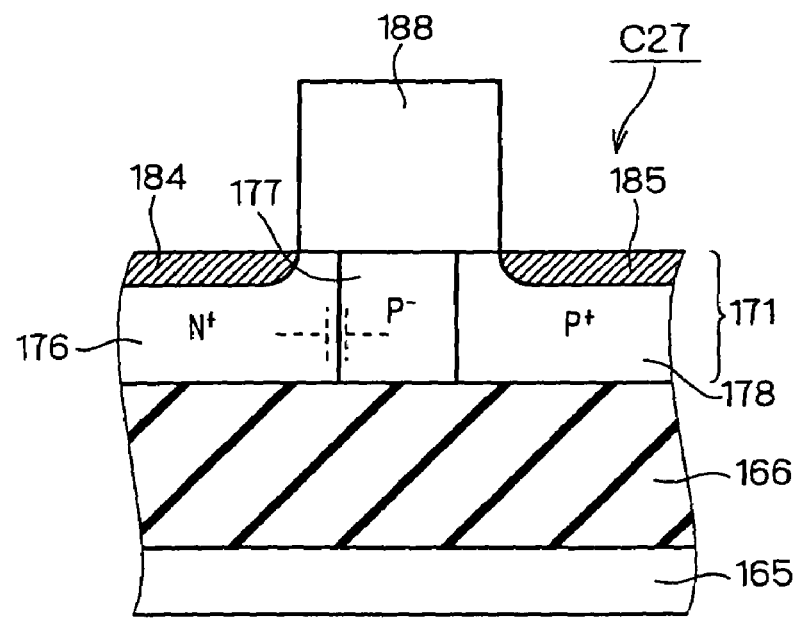

SEMICONDUCTOR DEVICE INCLUDING A CAPACITANCE

This application is a Division of and is based upon and claims the benefit of priority under 35 U.S.C. §120 from U.S. Ser. No. 10/995,193, filed Nov. 24, 2004, which is a Division of U.S. Pat. No. 6,858,918, issued Feb. 22, 2005, and under 35 U.S.C. § 119 from Japanese Application 2001-284866, filed Sep. 19, 2001, the entire contents of each of which are incorporated herein by reference.

BACKGROUND OF THE INVENTION

1. Field of the Invention

The present invention relates to a semiconductor device having an insulated gate type transistor and an insulated gate type capacitance and a method of manufacturing the semiconductor device.

2. Description of the Background Art

In a transistor having a gate length of a subquarter micron or less, a pocket injecting process for forming a pocket region is executed in order to suppress a short channel effect. The pocket injection is also referred to as NUDC (Non Uniformly Doped Channel).

FIG. 52 is a sectional view showing the pocket injecting process. As shown in FIG. 52, in the formation of a CMOS transistor, an NMOS formation region A11 and a PMOS formation region A12 are isolated from each other through an isolating film 102 provided in an upper layer portion of a semiconductor substrate 101.

In the NMOS formation region A11, a gate oxide film 112 and a gate electrode 113 are formed on a surface of a P well region 111 and a P-type impurity ion 103 is implanted and diffused by using the gate electrode 113 as a mask. Consequently, a P-type impurity implantation region 119 to be a pocket region of an NMOS transistor is formed.

In the PMOS formation region A12, similarly, a gate oxide film 122 and a gate electrode 123 are formed on a surface of an N well region 121 and an N-type impurity ion 104 is implanted and diffused by using the gate electrode 123 as a mask. Consequently, an N-type impurity implantation region 129 to be a pocket region of a PMOS transistor is formed.

More specifically, in the pocket injecting process, an impurity of the same conductivity type as that of a channel region of each MOS transistor is implanted into each of the NMOS formation region A11 and the PMOS formation region A12. In the pocket injecting process, the distribution of an impurity in a direction of a channel length becomes nonuniform and an effective channel impurity concentration is increased when a gate length becomes smaller. As a result, it is possible to suppress the short channel effect.

FIG. 53 is a sectional view showing a state in which a CMOS transistor is finished after the pocket injecting process.

As shown in FIG. 53, in the NMOS formation region A11, $N^+$ source-drain regions 114 and 114 are formed to interpose therebetween a channel region provided under the gate electrode 113 and tip regions opposed to each other between the $N^+$ source-drain regions 114 and 114 are extension portions 114e, respectively.

In a vicinal region of the extension portion 114e, the P-type impurity implantation region 119 remains as a $P^-$ pocket region 117 from the extension portion 114e to a part of the channel region. Moreover, side walls 116 and 116 are formed on both side surfaces of the gate electrode 113, respectively.

Thus, an NMOS transistor Q11 is formed by the gate oxide film 112, the gate electrode 113, the $N^+$ source-drain region 114, the side wall 116 and the $P^-$ pocket region 117.

In the PMOS formation region A12, $P^+$ source-drain regions 124 and 124 are formed to interpose therebetween a channel region provided under the gate electrode 123 and tip regions opposed to each other between the $P^+$ source-drain regions 124 and 124 are extension portions 124e, respectively.

In a vicinal region of the extension portion 124e, the N-type impurity implantation region 129 remains as an $N^-$ pocket region 127 from the extension portion 124e to a part of the channel region. Moreover, side walls 126 and 126 are formed on both side surfaces of the gate electrode 123, respectively.

Thus, a PMOS transistor Q12 is formed by the gate oxide film 122, the gate electrode 123, the $P^+$ source-drain region 124, the side wall 126 and the $N^-$ pocket region 127.

On the other hand, in a high-frequency analog circuit or a high-speed digital circuit, it is necessary to manufacture an LC type VCO (Voltage Controlled Oscillator) by using an inductor (L) and a variable capacitance (C).

In the case in which the variable capacitance to be an insulated gate type capacitance which has a small loss is to be obtained by utilizing the structure of the MOS transistor, it is necessary to generate an accumulation type variable capacitance in which impurities in a substrate (a body region) and a fetch electrode portion have the same conductivity type.

FIG. 54 is a sectional view showing a structure of the accumulation type variable capacitance. As shown in FIG. 54, in the formation of the accumulation type variable capacitance, a P-type variable capacitance formation region A13 and an N-type variable capacitance formation region A14 are isolated from each other through an isolating film 102 provided in an upper layer portion of a semiconductor substrate 101.

In the P-type variable capacitance formation region A13, $P^+$ fetch electrode regions 134 and 134 are formed to interpose therebetween a channel region provided under a gate electrode 133 and tip regions opposed to each other between the $P^+$ fetch electrode regions 134 and 134 are extension portions 134e, respectively.

In a vicinal region of the extension portion 134e, an $N^-$ pocket region 137 is formed from the extension portion 134e to a part of the channel region. Moreover, side walls 136 and 136 are formed on both side surfaces of the gate electrode 133, respectively.

Thus, a P-type variable capacitance C11 is formed by a gate oxide film 132, the gate electrode 133, the $P^+$ fetch electrode region 134, the side wall 136 and the $N^-$ pocket region 137. In other words, the P-type variable capacitance C11 acts as an insulated gate type capacitance in which the $P^+$ fetch electrode region 134 is set to one of electrodes, the gate electrode 133 is set to the other electrode and the gate oxide film 132 is set to an interelectrode insulating film.

In the N-type variable capacitance formation region A14, $N^+$ fetch electrode regions 144 and 144 are formed to interpose therebetween a channel region provided under a gate electrode 143 and tip regions opposed to each other between the $N^+$ fetch electrode regions 144 and 144 are extension portions 144e, respectively.

In a vicinal region of the extension portion 144e, a $P^-$ pocket region 147 is formed from the extension portion 144e to a part of the channel region. Moreover, side walls 146 and 146 are formed on both side surfaces of the gate electrode 143, respectively.

Thus, an N-type variable capacitance C12 is formed by a gate oxide film 142, the gate electrode 143, the N+ fetch electrode region 144, the side wall 146 and the P− pocket region 147. In other words, the N-type variable capacitance C12 acts as an insulated gate type capacitance in which the N+ fetch electrode region 144 is set to one of electrodes, the gate electrode 143 is set to the other electrode and the gate oxide film 142 is set to an interelectrode insulating film.

FIGS. 55 and 56 are views illustrating a degree of a change in a capacitance value of the N-type variable capacitance C12. In the case in which a gate voltage VG to be applied to the gate electrode 143 is lower than 0 V, a depletion layer 148 is extended downward in an N well region 121 provided under the gate electrode 143 as shown in FIG. 55 so that a capacitance value of the N-type variable capacitance C12 is decreased. On the other hand, in the case in which the gate electrode VG is higher than 0 V, the depletion layer 148 is reduced in the N well region 121 provided under the gate electrode 143 as shown in FIG. 56 so that the capacitance value of the N-type variable capacitance C12 is increased. Thus, it is possible to variably set the capacitance value of the N-type variable capacitance C12 based on the gate voltage VG to be applied to the gate electrode 143. Also in the P-type variable capacitance C11, similarly, it is possible to change the capacitance value based on the gate voltage to be applied to the gate electrode 133.

However, when the pocket injecting process shown in FIG. 52 is executed in order to enhance a short channel characteristic (to suppress the short channel effect), a pocket region of a reverse conductivity type to that of the body region is formed with the accumulation type variable capacitance in a fetch electrode region and the body region to be a region of the semiconductor substrate 101 which is provided just below the gate electrode. Therefore, there has been a problem in that a series resistance is increased.

FIG. 57 is a circuit diagram showing an equivalent circuit of the variable capacitance in FIG. 54. As shown in FIG. 57, the variable capacitance is equivalently represented by a series connection of a capacitance component C10 and a resistance component R10.

On the other hand, an index representing an electrical characteristic of the variable capacitance includes a Q—factor (Q-value). The Q-value is expressed in the following equation (1), wherein Q represents a Q-value, ω represents an angular frequency, C represents a capacitance value of the capacitance component C10 and R represents a resistance value of the resistance component R10.

[Equation 1]

$$Q = \frac{1}{\omega CR} \quad (1)$$

When the Q-value is increased, an energy efficiency of the capacitance is enhanced. There has been a problem in that the resistance value R of the resistance component R10 is increased by the presence of the pocket region so that the Q-value is decreased in accordance with the equation (1). In addition, there has been a problem in that an insulated gate type capacitance generally has a small Q-value.

SUMMARY OF THE INVENTION

It is an object of the present invention to obtain a semiconductor device comprising a capacitance having a great Q-value.

According to a first aspect of the present invention, a semiconductor device includes a fixed capacitance and a variable capacitance. The fixed capacitance is formed in a semiconductor substrate and has a capacitance value fixed, and the variable capacitance is formed in the semiconductor substrate and is capable of variably controlling a capacitance value. The fixed capacitance and the variable capacitance are connected to each other in parallel.

A capacitance having a great Q-value is used for at least one of the fixed capacitance and the variable capacitance. Consequently, it is possible to enhance the Q-value of a composite capacitance of the fixed capacitance and the variable capacitance.

According to a second aspect of the present invention, a semiconductor device has a junction capacitance formed in an SOI layer of an SOI substrate constituted by a substrate, at least a surface of which is insulative, and the SOI layer of a first conductivity type provided on the surface of the substrate. The junction capacitance includes first and second junction semiconductor regions. The first junction semiconductor region is of a second conductivity type and is formed on the SOI layer, and the second semiconductor region is of a first conductivity type and is formed on the SOI layer. The first and second semiconductor regions have a PN junction portion.

The junction capacitance is formed on the SOI substrate. Consequently, it is possible to obtain the junction capacitance which is less influenced by the parasitic capacitance.

The junction capacitance further includes a first semiconductor region of the second conductivity type, a second semiconductor region of the first conductivity type and an isolating region. The first semiconductor region is formed on the SOI layer. The second semiconductor region is formed on the SOI layer independently of the first semiconductor region. The isolating region is provided in an upper layer portion of the SOI layer and serves to isolate the first and second semiconductor regions from each other.

The isolating region includes a partial isolating region constituted by a partial insulating region provided in an upper layer portion of the SOI layer and an isolating semiconductor region of the first conductivity type which is a part of the SOI layer present in a lower layer portion. The first junction semiconductor region includes the first semiconductor region. The second junction semiconductor region includes the second semiconductor region and the isolating semiconductor region. The isolating semiconductor region has a PN junction portion together with the first semiconductor region.

According to a third aspect of the present invention, a semiconductor device has a junction capacitance formed in an SOI layer of an SOI substrate constituted by a substrate, at least a surface of which is insulative, and the SOI layer of a first conductivity type provided on the surface of the substrate. The junction capacitance includes first and second junction semiconductor regions. The first junction semiconductor region is of a second conductivity type and is formed on the SOI layer, and the second semiconductor region is of a first conductivity type and is formed on the SOI layer. The first and second semiconductor regions have a PN junction portion.

The junction capacitance is formed on the SOI substrate. Consequently, it is possible to obtain the junction capacitance which is less influenced by the parasitic capacitance.

For a capacitance of the first conductivity type, the junction capacitance includes a body region, a first semiconductor region of the second conductivity type and a second semiconductor region of the first conductivity type.

The body region for a capacitance is formed in a surface of the SOI layer. The first and second semiconductor regions are formed to interpose therebetween the body region for a capacitance, the second semiconductor region having an impurity concentration to be set higher than that in the body region for a capacitance.

The first junction semiconductor region includes the first semiconductor region. The second junction semiconductor region includes the second semiconductor region and the body region for a capacitance. The first semiconductor region has a PN junction portion together with the body region for a capacitance.

According to a fourth aspect of the present invention, a semiconductor device includes an insulated gate type capacitance formed in a semiconductor substrate. The insulated gate type capacitance includes a gate insulating film for a capacitance, a gate electrode for a capacitance and extraction electrode regions. The gate insulating film for a capacitance is selectively formed on the semiconductor substrate, the gate electrode for a capacitance is formed on the gate insulating film for a capacitance, and the extraction electrode regions are formed to interpose therebetween a body region for a capacitance which is provided under the gate electrode for a capacitance in a surface of the semiconductor substrate. The gate electrode for a capacitance has, on one of ends and the other end, first and second contact pad portions capable of being electrically connected to an external wiring.

The electrical connection to the external wiring can be carried out through the first and second contact pad portions. Consequently, it is possible to reduce a resistance value attendant on the gate electrode for a capacitance.

According to a fifth aspect of the present invention, a semiconductor device includes an insulated gate type capacitance formed in a semiconductor substrate. The insulated gate type capacitance includes a gate insulating film for a capacitance, a gate electrode for a capacitance and extraction electrode regions. The gate insulating film for a capacitance is selectively formed on the semiconductor substrate, the gate electrode for a capacitance is formed on the gate insulating film for a capacitance, and the extraction electrode regions are formed to interpose therebetween a body region for a capacitance which is provided under the gate electrode for a capacitance in a surface of the semiconductor substrate. Each of the extraction electrode regions have a hollow portion in a central region seen on a plane, and the gate electrode for a capacitance has a plurality of partial gate portions extended from the hollow portion radially as seen on a plane.

The gate electrode for a capacitance is constituted by a plurality of partial gate portions. Consequently, a length of each partial gate portion is defined as a gate width. Thus, it is possible to reduce the resistance value of the gate electrode.

These and other objects, features, aspects and advantages of the present invention will become more apparent from the following detailed description of the present invention when taken in conjunction with the accompanying drawings.

BRIEF DESCRIPTION OF THE DRAWINGS

FIG. 20 is a sectional view showing a structure of a semiconductor device according to an eighth embodiment of the present invention, FIG. 21 is a sectional view showing a part of a method of manufacturing a semiconductor device having a MOS transistor and a variable capacitance according to a ninth embodiment of the present invention, FIGS. 31 to 35 are sectional views showing a method of forming a porous silicon layer, FIG. 43 is a sectional view showing a structure of a third mode of the junction type variable capacitance according to the sixteenth embodiment of the present invention, FIG. 44 is a sectional view showing a structure of a fourth mode of the junction type variable capacitance according to the sixteenth embodiment of the present invention.

DESCRIPTION OF THE PREFERRED EMBODIMENTS

First Embodiment

Figure 1:
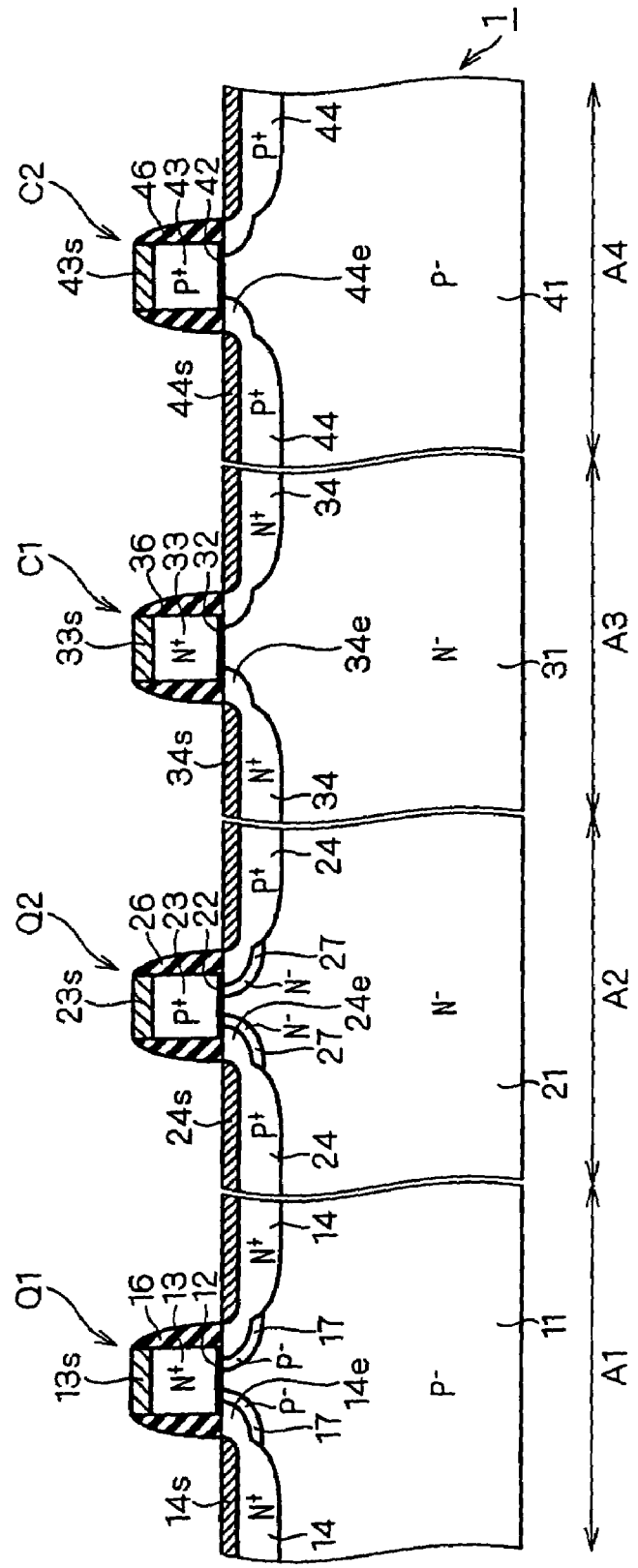
FIG. 1 is a sectional view showing a structure of a semiconductor device having a MOS transistor and a variable capacitance according to a first embodiment of the present invention.

FIG. 1 is a sectional view showing a structure of a semiconductor device having a MOS transistor and a variable capacitance according to a first embodiment of the present invention.

As shown in FIG. 1, an NMOS transistor Q1, a PMOS transistor Q2, an N-type variable capacitance C1 and a P-type variable capacitance C2 are formed in an NMOS formation region A1, a PMOS formation region A2, an N-type variable capacitance formation region A3 and a P-type variable capacitance formation region A4, respectively. Each of the formation regions A1 to A4 is isolated by an isolating film (not shown) or the like. Moreover, well regions 11, 21, 31 and 41 to be body regions are formed in the formation regions A1, A2, A3 and A4, respectively.

In the NMOS formation region A1, a gate oxide film 12 is selectively formed on a surface of the P well region 11 and an $N^+$-type gate electrode 13 is formed on the gate oxide film 12. $N^+$ source-drain regions 14 and 14 are formed to interpose therebetween a channel region to be a surface region of the P well region 11 provided under the gate electrode 13, and tip regions protruded and opposed to each other between the $N^+$ source-drain regions 14 and 14 are extension portions 14e, respectively.

In a vicinal region of the extension portion 14e, $P^-$ pocket regions 17 are formed from the extension portion 14e to a part of the channel region. Moreover, side walls 16 and 16 are formed on both side surfaces of the gate electrode 13, respectively. Furthermore, a silicide region 14s and a silicide region 13s are formed in a surface of the $N^+$ source-drain regions 14 and an upper layer portion of the gate electrode 13, respectively.

Thus, the NMOS transistor Q1 is formed by the gate oxide film 12, the gate electrode 13, the $N^+$ source-drain regions 14, the side wall 16 and the $P^-$ pocket regions 17.

In the PMOS formation region A2, a gate oxide film 22 is selectively formed on a surface of the N well region 21 and a $P^+$-type gate electrode 23 is formed on the gate oxide film 22. $P^+$ source-drain regions 24 and 24 are formed to interpose therebetween a channel region provided under the gate electrode 23, and tip regions protruded and opposed to each other between the $P^+$ source-drain regions 24 and 24 are extension portions 24e, respectively.

In a vicinal region of the extension portion 24e, $N^-$ pocket regions 27 are formed from the extension portion 24e to a part of the channel region. Moreover, side walls 26 and 26 are formed on both side surfaces of the gate electrode 23, respectively. Furthermore, a silicide region 24s and a silicide region 23s are formed in a surface of the $P^+$ source-drain regions 24 and an upper layer portion of the gate electrode 23, respectively.

Thus, a PMOS transistor Q2 is formed by the gate oxide film 22, the gate electrode 23, the $P^+$ source-drain regions 24, the side wall 26 and the $N^-$ pocket regions 27.

In the N-type variable capacitance formation region A3, a gate oxide film 32 is selectively formed on a surface of the N well region 31 and an $N^+$-type gate electrode 33 is formed on the gate oxide film 32. $N^+$ extraction electrode regions 34 and 34 are formed to interpose therebetween a body surface region to be a surface of the N well region 31 provided under the gate electrode 33. Tip regions protruded and opposed to each other between the $N^+$ extraction electrode regions 34 and 34 are extension portions 34e, respectively.

Moreover, side walls 36 and 36 are formed on both side surfaces of the gate electrode 33, respectively. Furthermore, a silicide region 34s and a silicide region 33s are formed in a surface of the $N^+$ extraction electrode regions 34 and an upper layer portion of the gate electrode 33, respectively.

Thus, an N-type ($N^+$ gate/$N^-$ body type) variable capacitance C1 is formed by the gate oxide film 32, the gate electrode 33, the $N^+$ extraction electrode regions 34 and the side wall 36. More specifically, the N-type variable capacitance C1 becomes an insulated gate type capacitance in which the $N^+$ extraction electrode regions 34 are set to one of electrodes, the gate electrode 33 is set to the other electrode and the gate oxide film 32 is set to an interelectrode insulating film. By a gate voltage to be applied to the gate electrode 33, it is possible to variably set a capacitance value by changing the extension of a depletion layer in the N well region 31 provided under the gate electrode 33.

In the P-type variable capacitance formation region A4, a gate oxide film 42 is selectively formed on a surface of the P well region 41 and a $P^+$-type gate electrode 43 is formed on the gate oxide film 42. $P^+$ extraction electrode regions 44 and 44 are formed to interpose therebetween a body surface region provided under the gate electrode 43. Tip regions protruded and opposed to each other between the P⁺ extraction electrode regions 44 and 44 are extension portions 44e, respectively.

Moreover, side walls 46 and 46 are formed on both side surfaces of the gate electrode 43, respectively. Furthermore, a silicide region 44s and a silicide region 43s are formed in a surface of the P⁺ extraction electrode region 44 and an upper layer portion of the gate electrode 43, respectively.

Thus, a P-type (P⁺ gate/P⁻ body type) variable capacitance C2 is formed by the gate oxide film 42, the gate electrode 43, the P⁺ extraction electrode regions 44 and the side wall 46. More specifically, the P-type variable capacitance C2 becomes an insulated gate type capacitance in which the P⁺ extraction electrode regions 44 are set to one of electrodes, the gate electrode 43 is set to the other electrode and the gate oxide film 42 is set to an interelectrode insulating film. By a gate voltage to be applied to the gate electrode 43, it is possible to variably set a capacitance value by changing the extension of a depletion layer in the P well region 41 provided under the gate electrode 43.

As described above, in the semiconductor device according to the first embodiment, the pocket regions are present in the MOS transistor. Therefore, it is possible to obtain a MOS transistor in which a short channel effect is suppressed.

On the other hand, pocket regions (regions of a reverse conductivity type which are adjacent to extraction electrode regions) are not present in the variable capacitance. More specifically, the region of a reverse conductivity type to that of the extraction electrode regions is not present at all in a region provided in the vicinity of the extraction electrode regions of the variable capacitance. Therefore, a series resistance is low and a Q-value is not deteriorated.

As the semiconductor device according to the first embodiment, thus, it is possible to obtain a semiconductor device comprising a MOS transistor suppressing a short channel effect and a variable capacitance in which a series resistance is low and a Q-value is not deteriorated.

FIGS. 2 to 7 are sectional views showing a method of manufacturing the semiconductor device according to the first embodiment. A procedure for manufacturing the semiconductor device according to the first embodiment will be described below with reference to these drawings.

Figure 2:
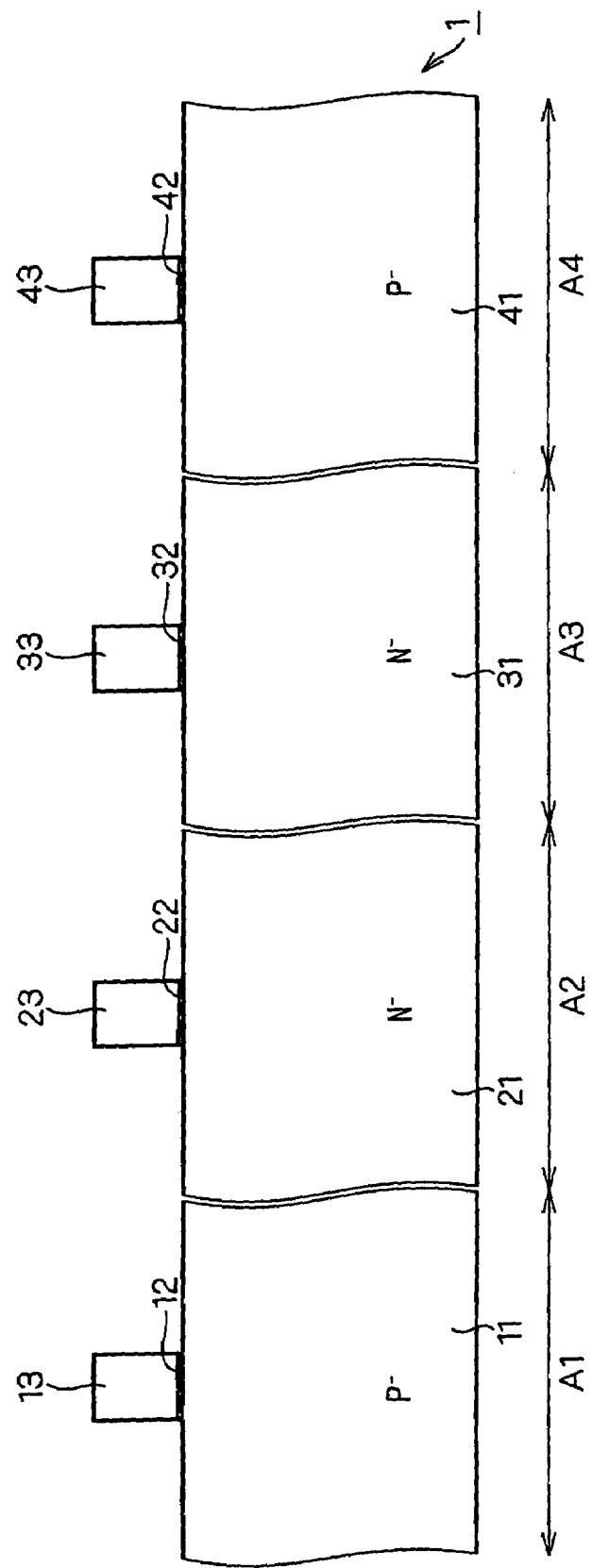
FIGS. 2 to 7 are sectional views showing a method of manufacturing the semiconductor device according to the first embodiment.

As shown in FIG. 2, first of all, a P well region 11, an N well region 21, an N well region 31 and a P well region 41 which are to be body regions are formed, by an existing method, in an NMOS formation region A1, a PMOS formation region A2, an N-type variable capacitance formation region A3 and a P-type variable capacitance formation region A4 which are isolated from each other. Then, a gate oxide film 12 and an N⁺-type gate electrode 13 are selectively formed on a surface of the P well region 11, a gate oxide film 22 and a P⁺-type gate electrode 23 are selectively formed on a surface of the N well region 21, a gate oxide film 32 and an N⁺-type gate electrode 33 are selectively formed on a surface of the N well region 31, and a gate oxide film 42 and a P⁺-type gate electrode 43 are selectively formed on a surface of the P well region 41.

Figure 3:
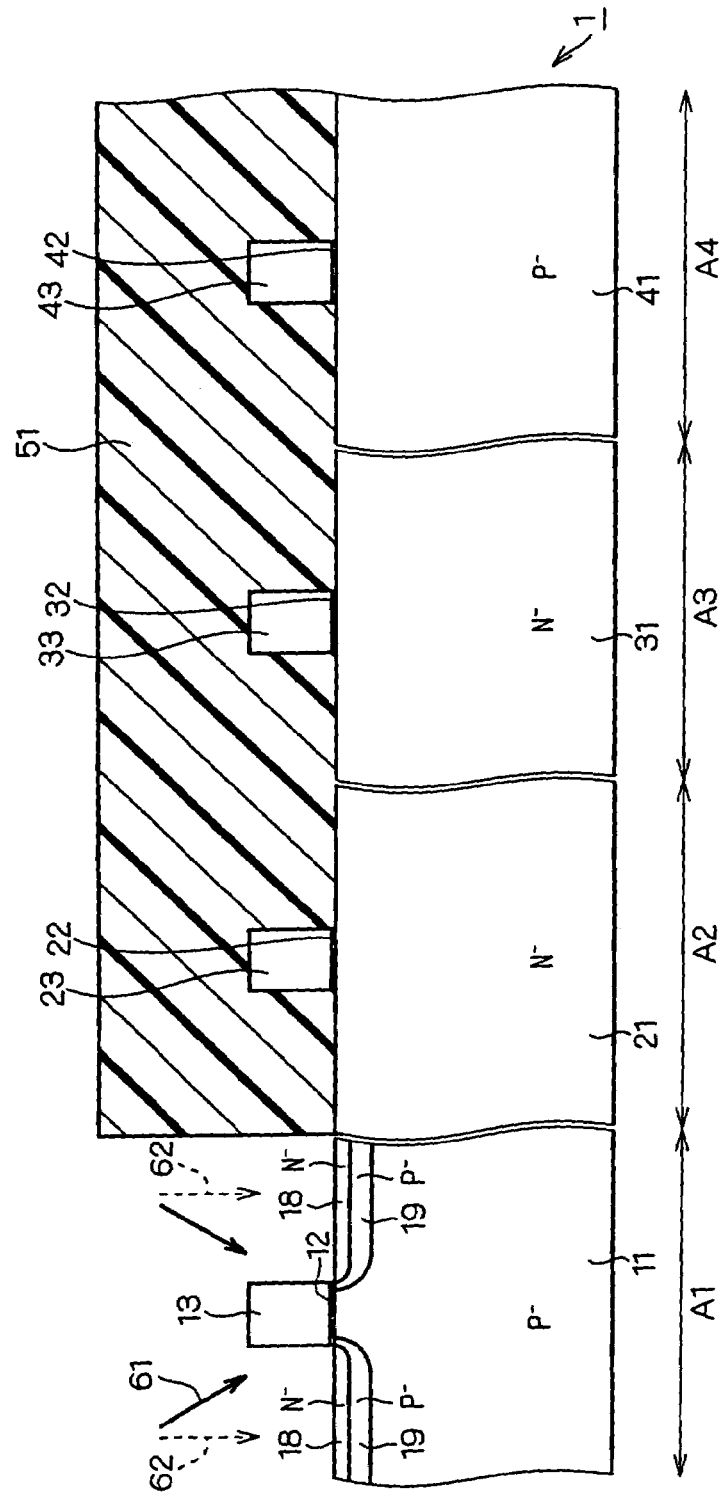

As shown in FIG. 3, a resist 51 is formed on a region other than the NMOS formation region A1, and a P-type impurity ion 61 and an N-type impurity ion 62 are then implanted and diffused sequentially into only the NMOS formation region A1 by varying an implantation energy with the gate electrode 13 to be a mask. Thus, a P⁻ diffusion region 19 and an N⁻ extension region 18 are formed, respectively.

As a specific example of the implantation of the N-type impurity ion 62, it can be proposed that an arsenic ion is implanted at an implantation energy of 3 to 20 keV, a dose of $1\times10^{14}$ to $1\times10^{15}/cm^2$, and an implantation angle of 0 degree.

As a specific example of the implantation of the P-type impurity ion 61, moreover, it can be proposed that a boron ion is implanted at an implantation energy of 10 to 20 keV, a dose of $1\times10^{13}$ to $3\times10^{13}/cm^2$, and an implantation angle of 0 to 45 degrees.

Figure 4:
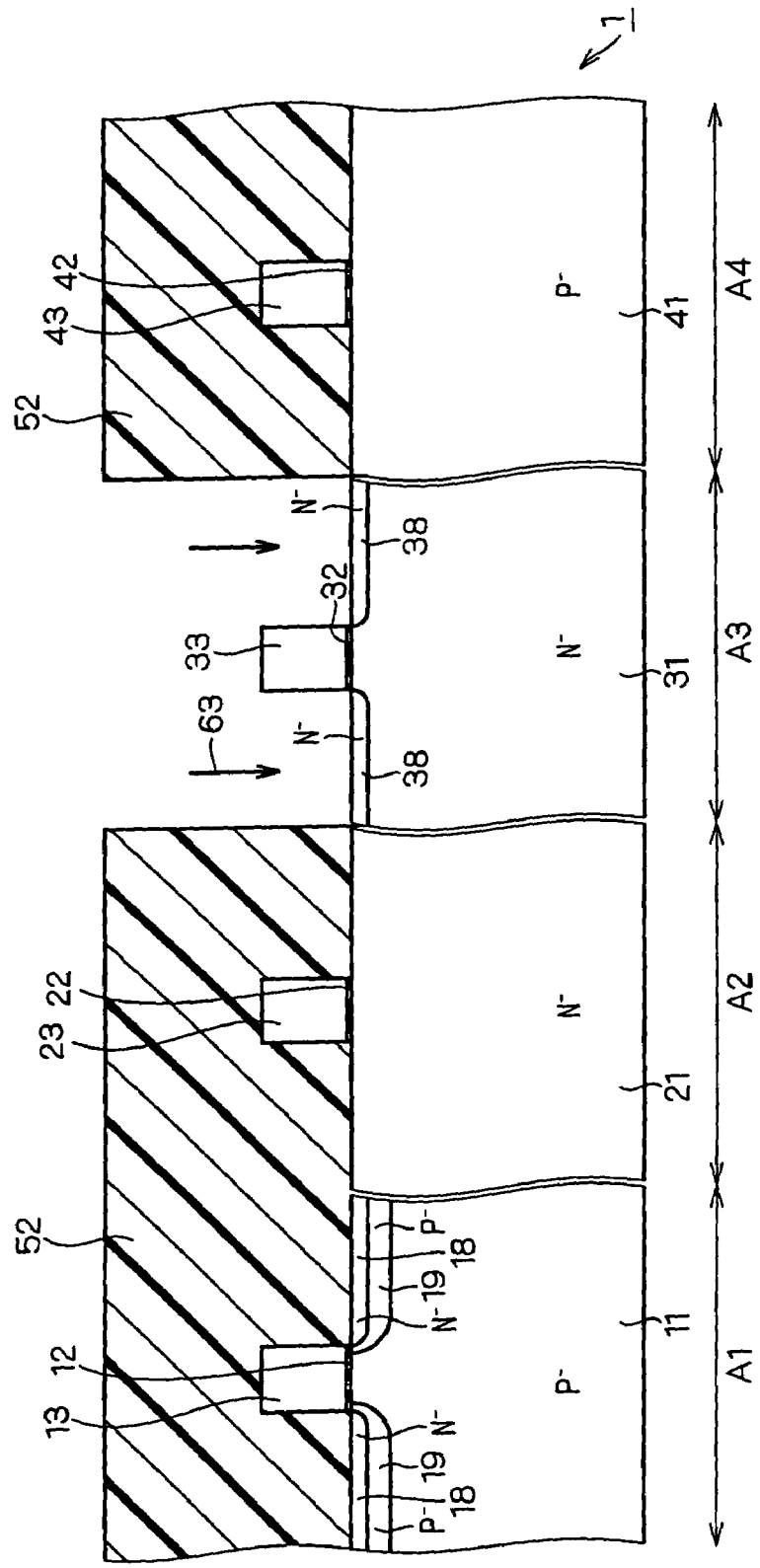

As shown in FIG. 4, subsequently, the resist 51 is removed and a resist 52 is then formed on a region other than the N-type variable capacitance formation region A3 and an N-type impurity ion 63 is thereafter implanted into only the N-type variable capacitance formation region A3 with the same contents as those of the implantation of the N-type impurity ion 62, for example. Consequently, an N⁻ extension region 38 is formed. In this case, it can also be proposed that an N-type impurity ion is implanted on the same conditions as those of an N-type impurity ion 64 which will be described below, thereby further forming N⁻ pocket regions.

Figure 5:
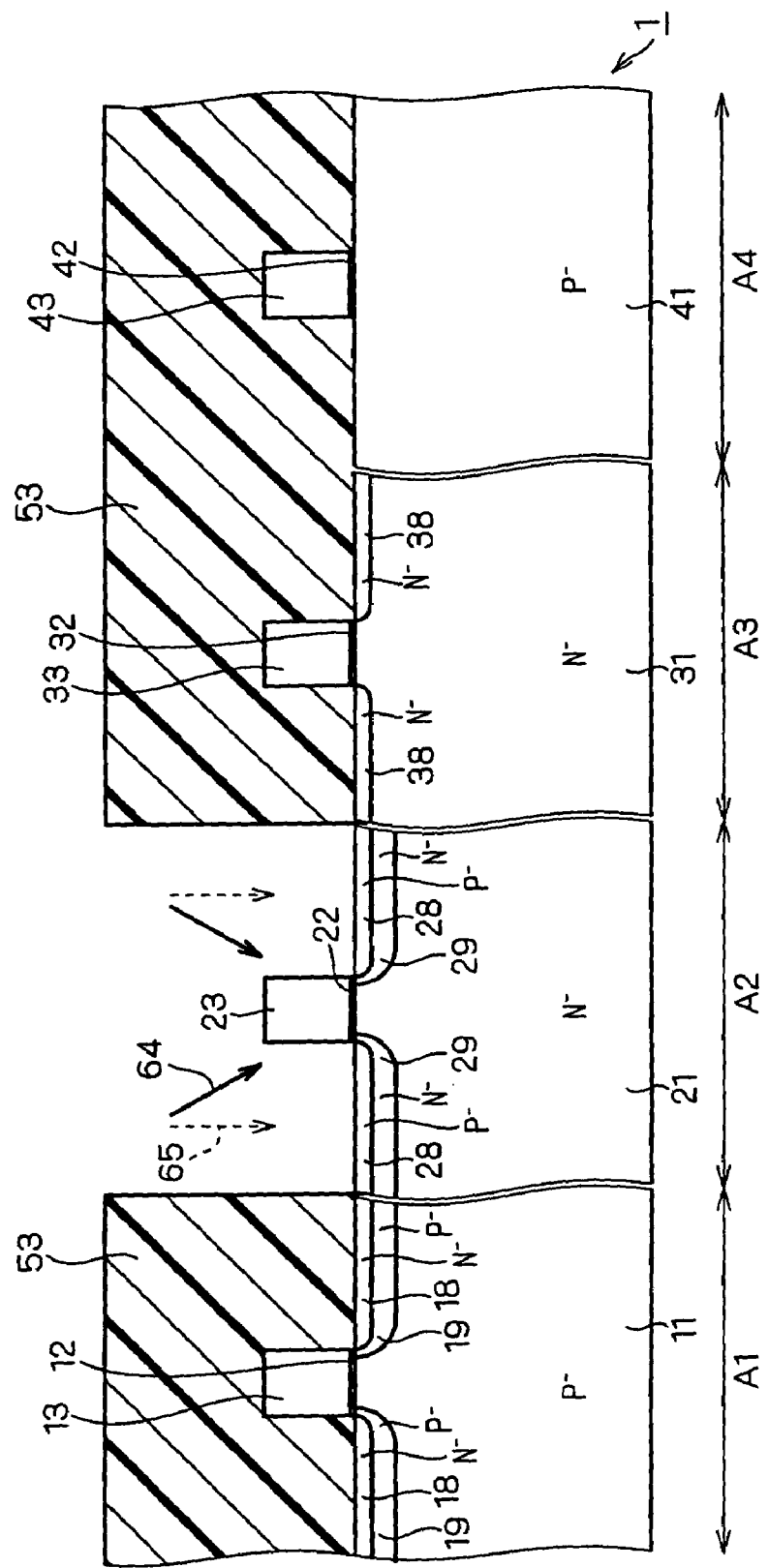

As shown in FIG. 5, next, the resist 52 is removed and a resist 53 is then formed on a region other than the PMOS formation region A2, and the N-type impurity ion 64 and a P-type impurity ion 65 are then implanted and diffused sequentially into only the PMOS formation region A2 by varying an implantation energy with the gate electrode 23 to be a mask. Thus, an N⁻ diffusion region 29 and a P⁻ extension region 28 are formed.

As a specific example of the implantation of the P-type impurity ion 65, moreover, it can be proposed that a BF₂ ion is implanted at an implantation energy of 3 to 10 keV, a dose of $1\times10^{14}$ to $1\times10^{15}/cm^2$, and an implantation angle of 0 degree.

As a specific example of the implantation of the N-type impurity ion 64, furthermore, it can be proposed that an arsenic ion is implanted at an implantation energy of 50 to 150 keV, a dose of $1\times10^{13}$ to $3\times10^{13}/cm^2$, and an implantation angle of 0 to 45 degrees.

Figure 6:
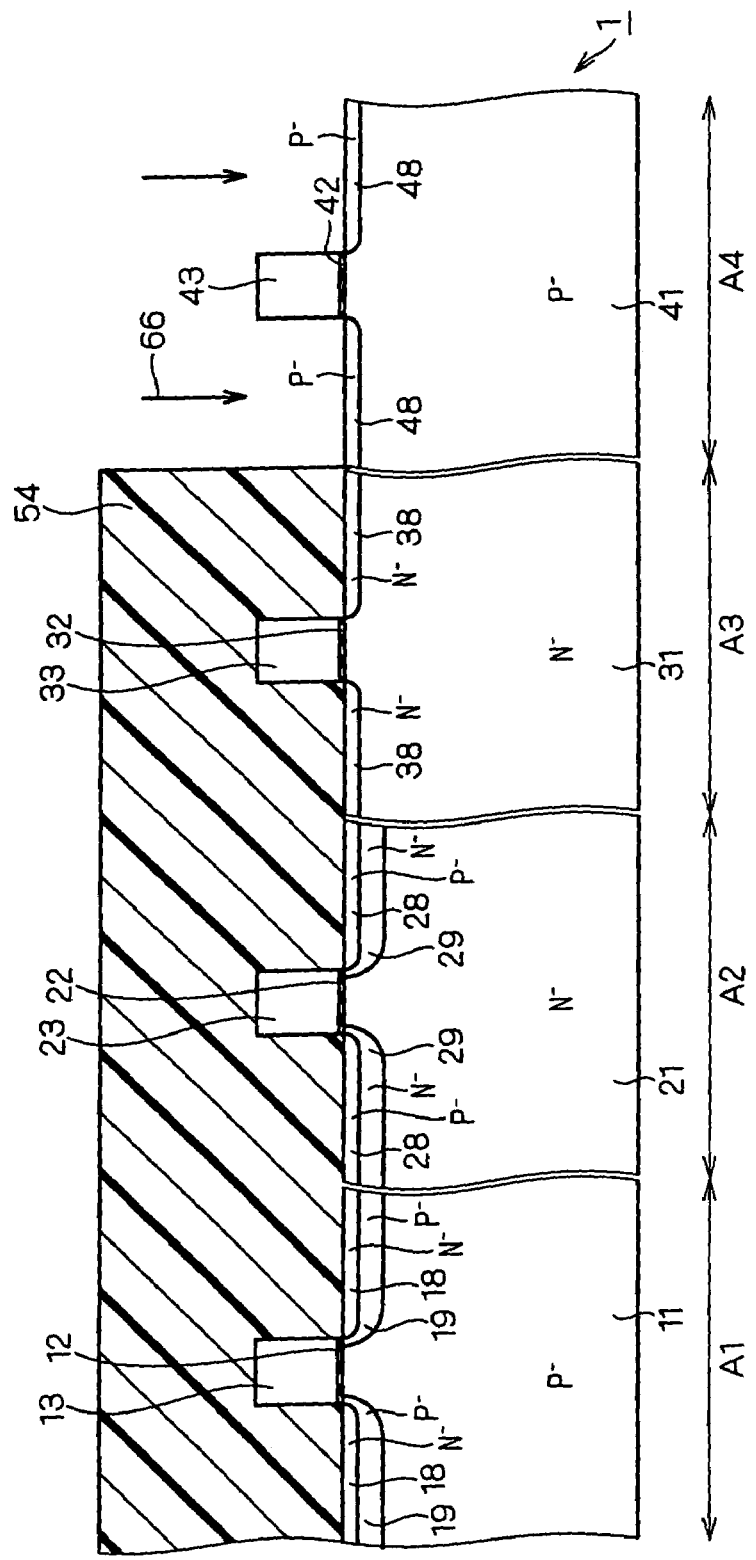

As shown in FIG. 6, subsequently, the resist 53 is removed and a resist 54 is then formed on a region other than the P-type variable capacitance formation region A4 and a P-type impurity ion 66 is thereafter implanted into only the P-type variable capacitance formation region A4 with the same contents as those of the implantation of the P-type impurity ion 65, for example. Consequently, a P⁻ extension region 48 is formed. In this case, it can also be proposed that a P-type impurity ion is implanted on the same conditions as those of the P-type impurity ion 61 to further form P⁻ pocket regions.

Figure 7:
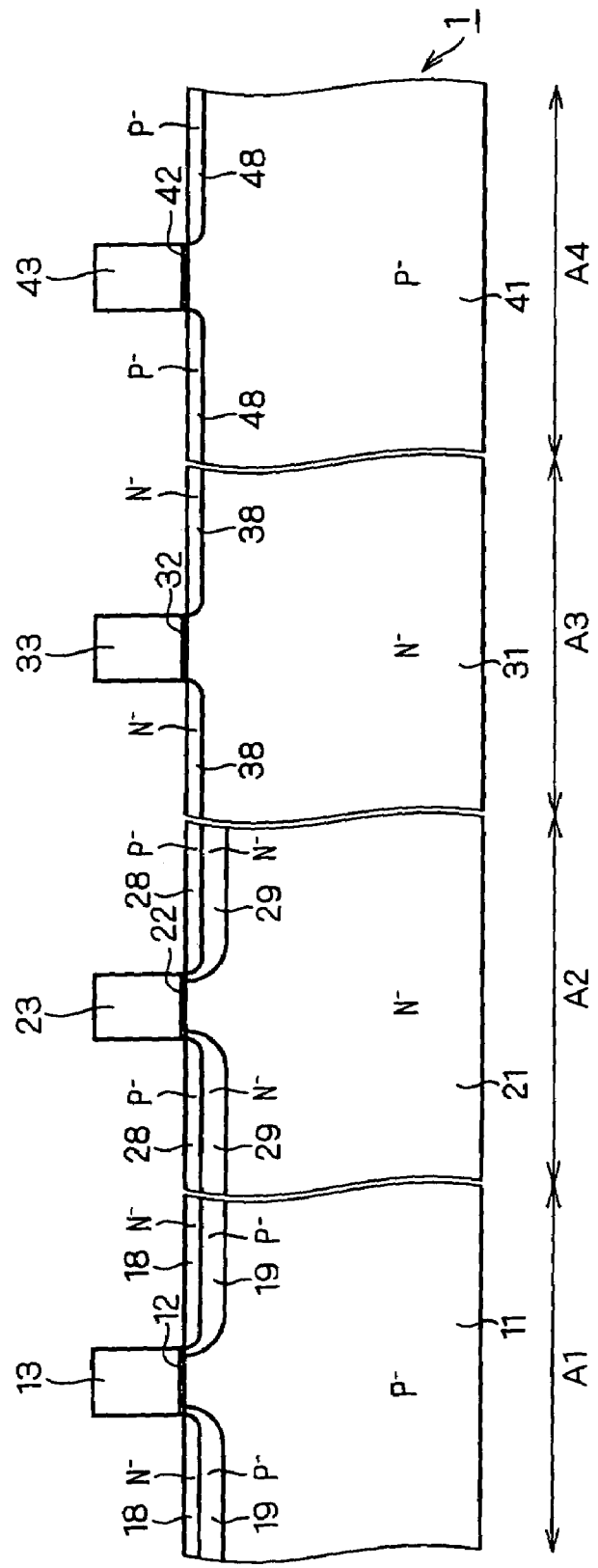

When the resist 54 is removed as shown in FIG. 7, it is possible to obtain such a structure that a P⁻ diffusion region 19 and an N⁻ diffusion region 29 which are to be pocket regions are present in only the MOS transistor formation regions A1 and A2 and a diffusion region to be the pocket regions is not present in the variable capacitance formation regions A3 and A4.

Subsequently, the structure shown in FIG. 1 can be obtained by using an existing method of forming a MOS transistor and a variable capacitance. In the structure shown in FIG. 1, a side wall is formed and source-drain regions (extraction electrode regions) are then formed, and furthermore, the inside of a surface of the source-drain regions (extraction electrode regions) and an upper layer portion of the gate electrode are silicided by a self-align silicide (salicide) process, thereby forming a silicide region and reducing a resistance.

As a specific example of the formation of the $N^+$ source-drain regions 14 of the NMOS transistor Q1, it can be proposed that an arsenic ion is implanted at an implantation energy of 20 to 70 keV, a dose of $1\times10^{15}$ to $1\times10^{16}/cm^2$, and an implantation angle of 0 to 30 degrees.

As a specific example of the formation of the $P^+$ source-drain regions 24 of the PMOS transistor Q2, moreover, it can be proposed that a $BF_2$ ion is implanted at an implantation energy of 10 to 30 keV, a dose of $1\times10^{15}$ to $1\times10^{16}/cm^2$, and an implantation angle of 0 to 30 degrees.

For example, $CoSi_2$, $TiSi_2$, $NiSi_2$ or the like is used for the silicide.

While both of the N- and P-type variable capacitances are formed in the present embodiment, only one of the variable capacitances may be formed. It is preferable that a variable capacitance of such a type as to be convenient for a circuit should be formed, and the N-type variable capacitance has a low resistance value of a series resistance component of a body portion and a great Q-value. In this respect, the N-type variable capacitance is more excellent.

Second Embodiment

Figure 8:
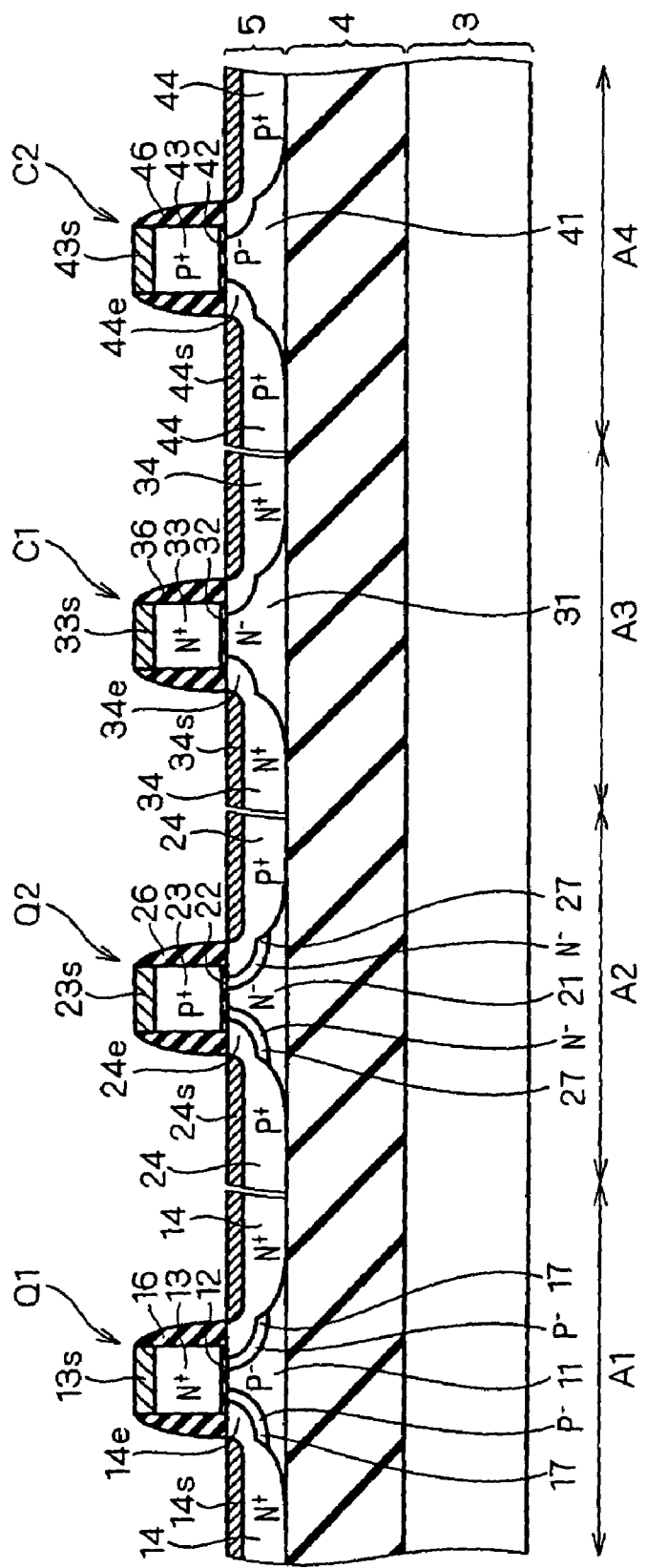
FIG. 8 is a sectional view showing a structure of a semiconductor device according to a second embodiment of the present invention.

FIG. 8 is a sectional view showing a structure of a semiconductor device having a MOS transistor and a variable capacitance according to a second embodiment of the present invention.

As shown in FIG. 8, a buried oxide film 4 is formed on a support substrate 3, and an SOI layer 5 formed on the buried oxide film 4 is isolated into an NMOS formation region A1, a PMOS formation region A2, an N-type variable capacitance formation region A3 and a P-type variable capacitance formation region A4 through an isolating film (not shown) or the like.

An NMOS transistor Q1, a PMOS transistor Q2, an N-type variable capacitance C1 and a P-type variable capacitance C2 which have the same structures as those of the first embodiment are formed in the NMOS formation region A1, the PMOS formation region A2, the N-type variable capacitance formation region A3 and the P-type variable capacitance formation region A4, respectively.

In the semiconductor device according to the second embodiment, thus, the MOS transistors Q1 and Q2 and the variable capacitances C1 and C2 which are similar to those of the first embodiment are formed on the SOI substrate (the support substrate 3, the buried oxide film 4 and the SOI layer 5). Accordingly, the structure and manufacturing method are the same as those in the first embodiment except that a bulk substrate is replaced with the SOI substrate.

Figure 9:
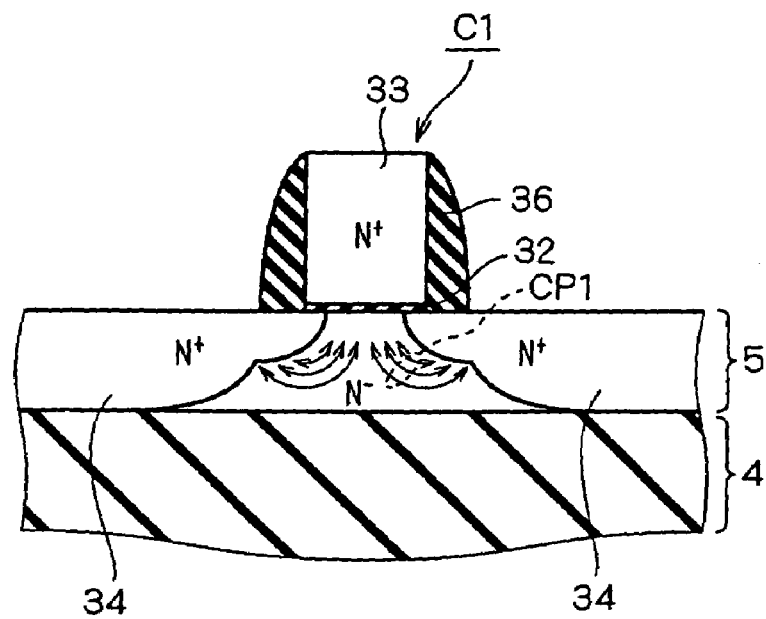
FIG. 9 is a view illustrating the influence of a high frequency current of an N-type variable capacitance according to the second embodiment.

FIG. 9 is a view illustrating the influence of a high frequency current of the N-type variable capacitance according to the second embodiment. As shown in FIG. 9, a high frequency current path CP1 mainly flows in the N-type variable capacitance C1 between $N^+$ extraction electrode regions 34 in the vicinity of a gate oxide film 32 and a gate electrode 33. Therefore, a variable capacitance characteristic is not greatly deteriorated.

Figure 10:
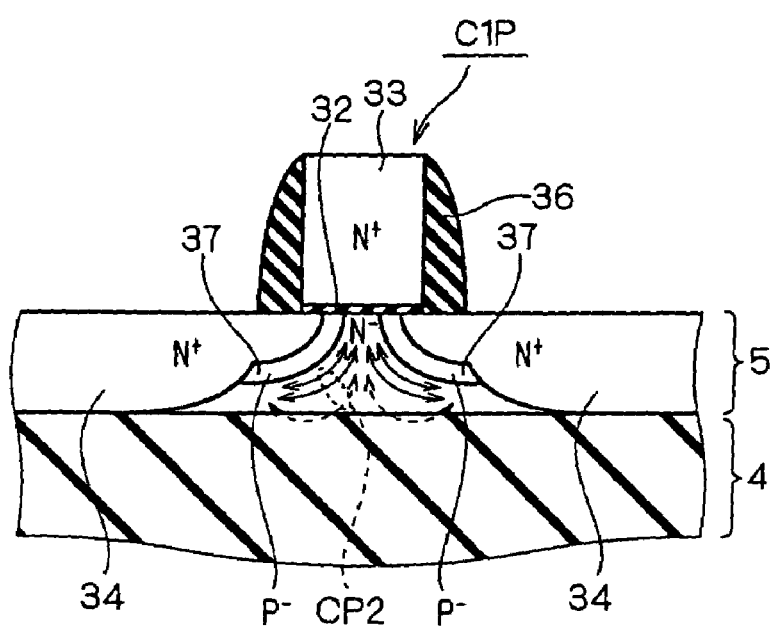
FIG. 10 is a view illustrating the influence of a high frequency current of an N-type variable capacitance having a pocket region formed in an SOI substrate.

FIG. 10 is a view illustrating the influence of a high frequency current of an N-type variable capacitance having pocket regions formed in the SOI substrate. As shown in FIG. 10, a thickness of the SOI layer 5 is smaller than that of the bulk substrate so that a part (shown in a dotted line) of a high frequency current path CP2 flowing in an N-type variable capacitance C1P is made invalid and a series resistance is increased. Consequently, a degree of deterioration is great.

Thus, when $P^-$ pocket regions 37 are present, the bad influence of the high frequency current path CP2 is increased. For the SOI structure, therefore, the structure according to the second embodiment in which the pocket regions are not provided in the variable capacitance is very effective.

Third Embodiment

Figure 11:
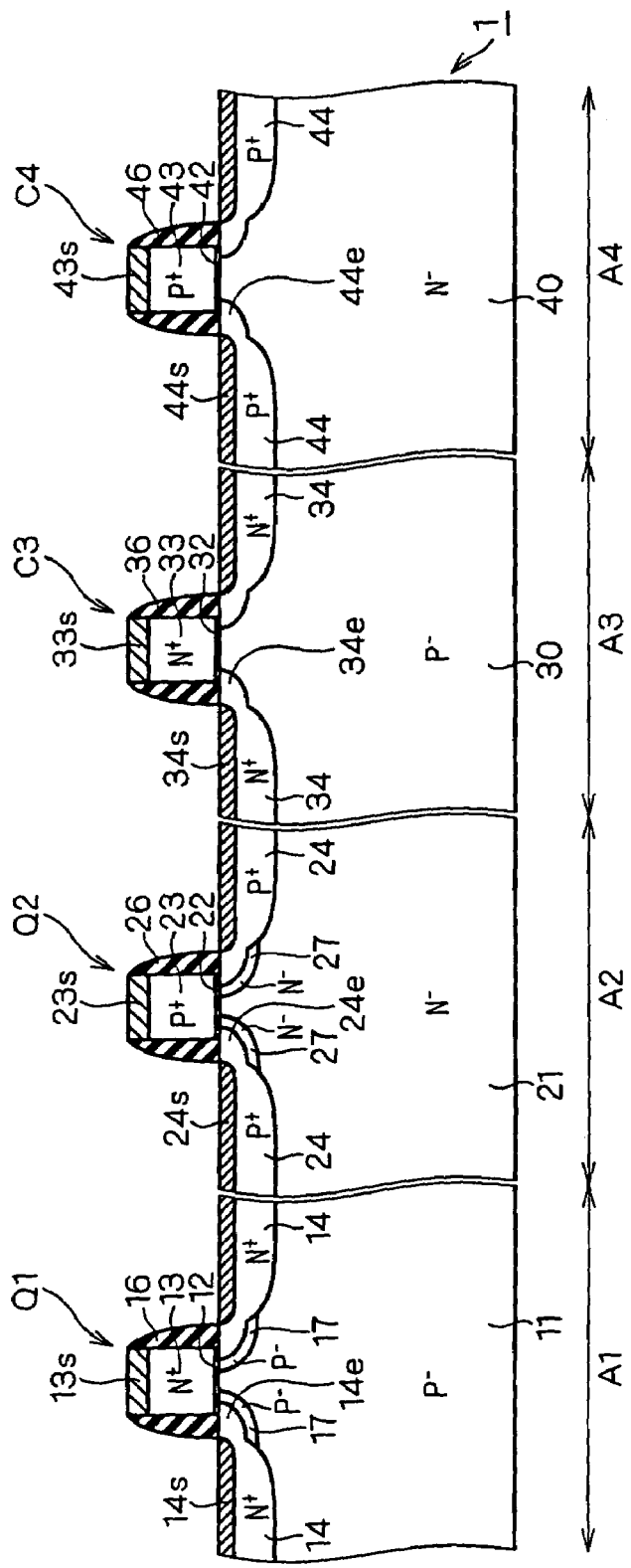
FIG. 11 is a sectional view showing a structure of a semiconductor device according to a third embodiment of the present invention.
Figure 12:
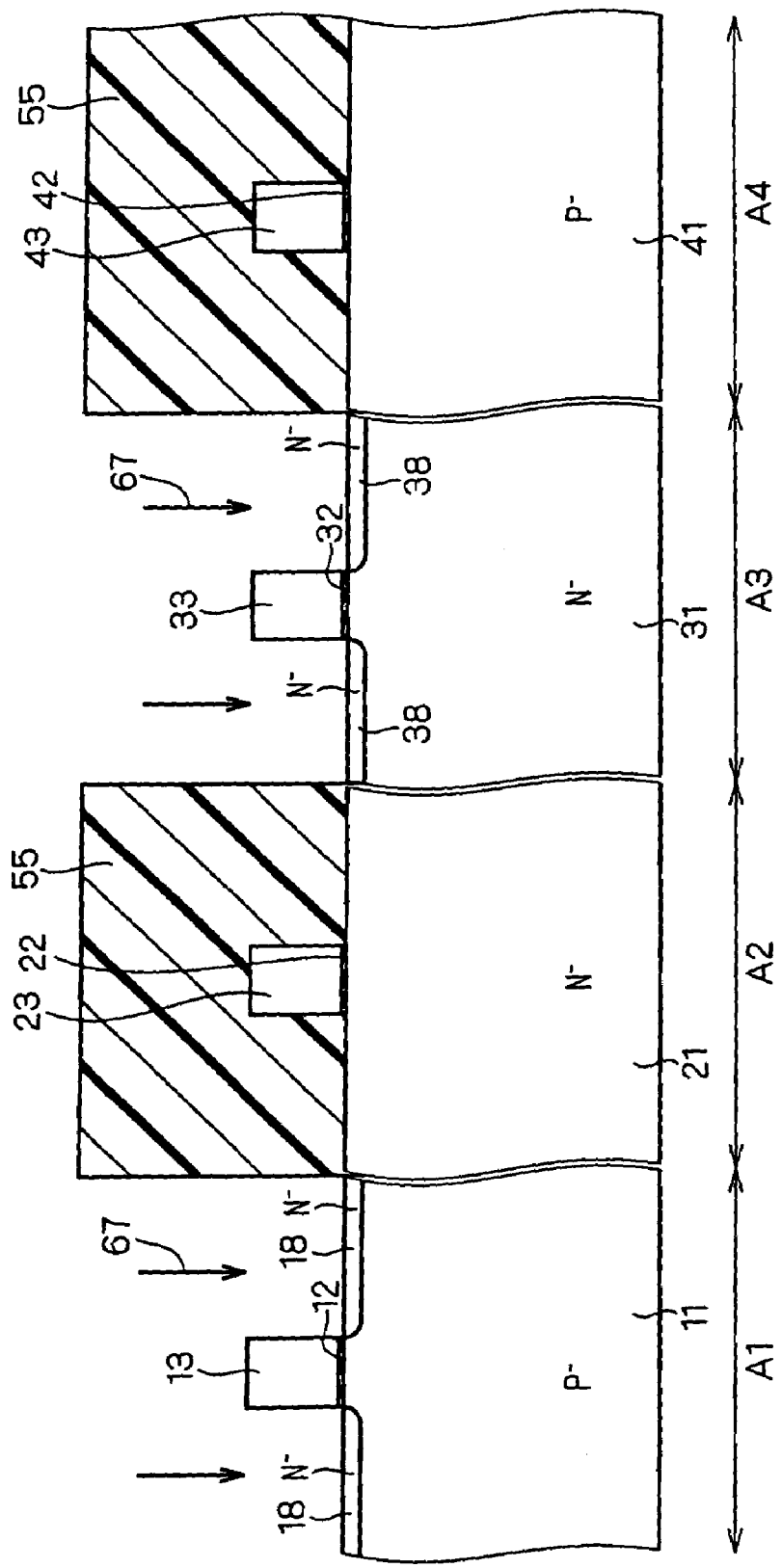
FIGS. 12 to 15 are sectional views showing a method of manufacturing a semiconductor device according to a fourth embodiment.

FIG. 11 is a sectional view showing a structure of a semiconductor device having a MOS transistor and a variable capacitance according to a third embodiment of the present invention.

As shown in FIG. 11, variable capacitances C3 and C4 of an inversion type are provided in place of the variable capacitances C1 and C2 of an accumulation type. More specifically, the structure according to the third embodiment is different from the structure according to the first embodiment shown in FIG. 1 in that a P well region 30 is provided in place of the N well region 31 and an N well region 40 is provided in place of the P well region 41.

More specifically, the N-type ($N^+$ gate/$P^-$ body/$N^+$S/D type) variable capacitance C3 and the P-type ($P^+$ gate/$N^-$ body/$P^+$S/D type) variable capacitance C4 have structures equivalent to the structures of the NMOS transistor and the PMOS transistor, and are different from the NMOS transistor Q1 and the PMOS transistor Q2 in that pocket regions corresponding to the $P^-$ pocket regions 17 and 27 are not provided.

In the variable capacitance having the inversion type structure, the pocket regions and the body region (the P well region 30, the N well region 40) have the same conductivity types even if the pocket regions are provided. Differently from the variable capacitance of the accumulation type, therefore, a resistance value of a series resistance component of the body region is not increased.

However, when the pocket regions are formed, an impurity concentration distribution in a direction of a channel length becomes nonuniform. Therefore, there is a problem in that a distribution in a direction of a channel is generated on a threshold voltage for a MOS transistor and it is hard to estimate a capacitance value of the variable capacitance based on a gate voltage.

By the structure according to the third embodiment in which the pocket regions are not provided in the variable capacitance of the inversion type, accordingly, it is possible to obtain an effect that precision in estimation of the capacitance value of the variable capacitance can be enhanced.

Fourth Embodiment

A fourth embodiment provides a method of manufacturing a semiconductor device which is different from the method of obtaining the structure according to the first embodiment. While the steps of forming the extension regions of the MOS transistor and the variable capacitance are carried out independently in the manufacturing method according to the first embodiment, a plurality of extension regions can be formed at the same time on the same conditions in the fourth embodiment.

FIGS. 12 to 15 are sectional views showing the method of manufacturing a semiconductor device according to the fourth embodiment. With reference to these drawings, description will be given to a procedure for manufacturing a semiconductor device according to the fourth embodiment.

First of all, the structure shown in FIG. 2 is obtained in the same manner as in the first embodiment. As shown in FIG.

12, then, a resist 55 is formed on a region other than an NMOS formation region A1 and an N-type variable capacitance formation region A3, and an N-type impurity ion 67 is thereafter implanted into only the NMOS formation region A1 and the N-type variable capacitance formation region A3 by using a gate electrode 13 and a gate electrode 33 as masks. Consequently, an N⁻ extension region 18 and an N⁻ extension region 38 are obtained at the same time. The N-type impurity ion 67 is implanted at an implantation angle of "0".

Figure 13:
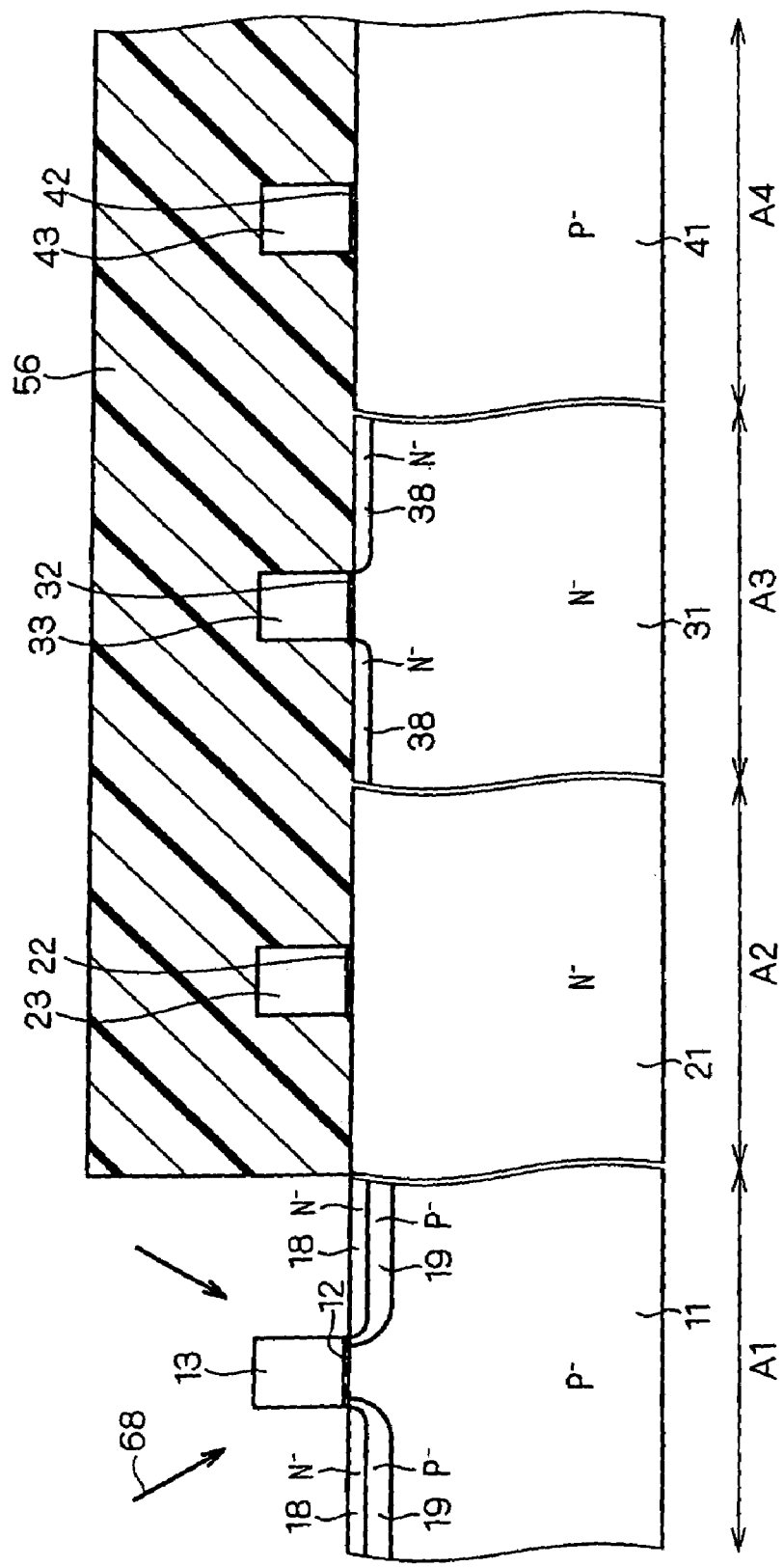

As shown in FIG. 13, subsequently, a resist 56 is formed on a region other than the NMOS formation region A1 and a P-type impurity ion 68 is then implanted and diffused into only the NMOS formation region A1 by using the gate electrode 13 as a mask. Consequently, a P⁻ diffusion region 19 is formed. The P-type impurity ion 68 is obliquely implanted at a higher implantation energy than that of the N-type impurity ion 67.

Figure 14:
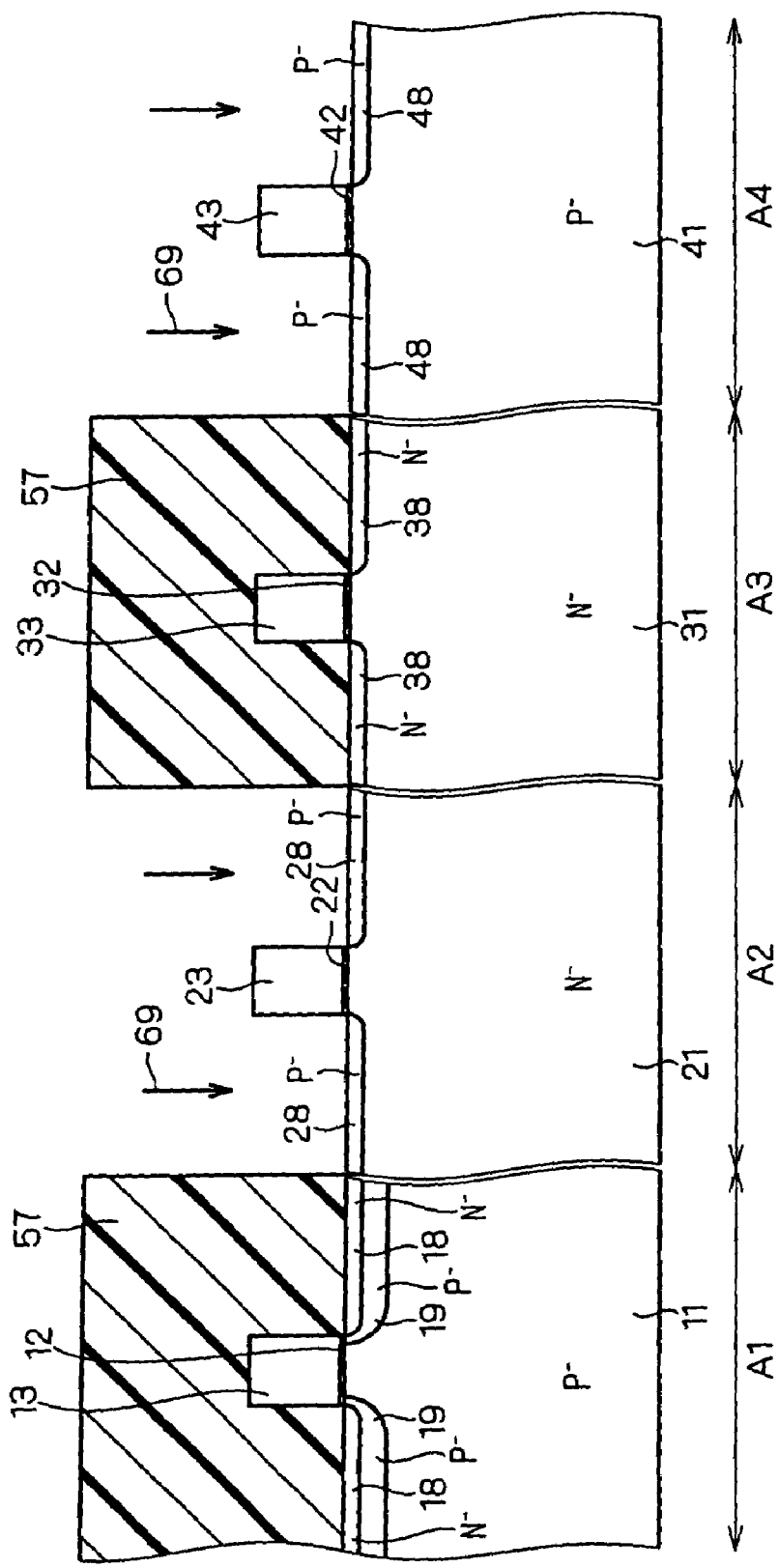

As shown in FIG. 14, then, a resist 57 is formed on a region other than a PMOS formation region A2 and a P-type variable capacitance formation region A4, and a P-type impurity ion 69 is thereafter implanted into only the PMOS formation region A2 and the P-type variable capacitance formation region A4 by using a gate electrode 23 and a gate electrode 43 as masks. Consequently, a P⁻ extension region 28 and a P⁻ extension region 48 are obtained at the same time. The P-type impurity ion 69 is implanted at an implantation angle of "0".

Figure 15:
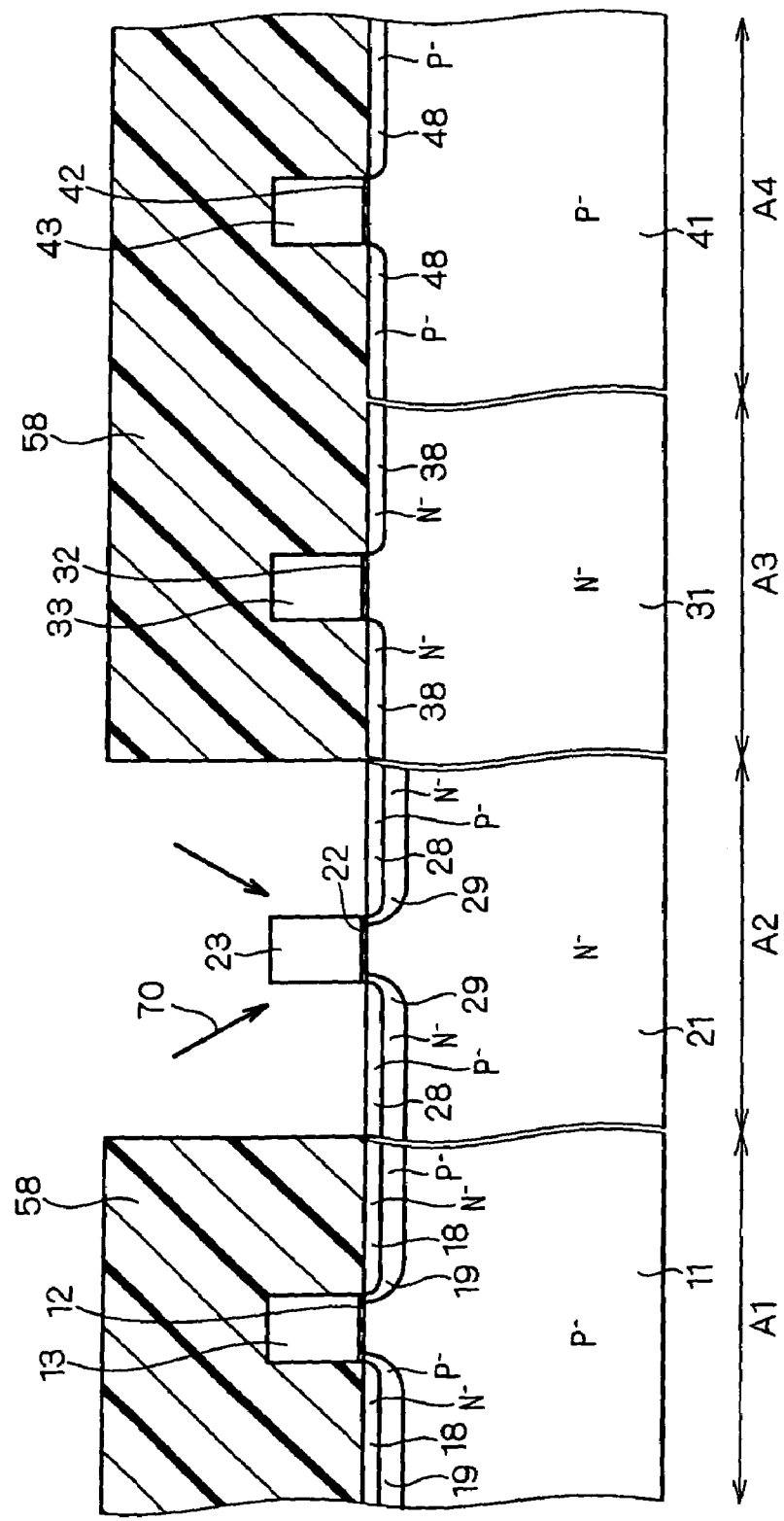

As shown in FIG. 15, subsequently, a resist 58 is formed on a region other than the PMOS formation region A2 and an N-type impurity ion 70 is then implanted and diffused into only the PMOS formation region A2 by using the gate electrode 23 as a mask. Consequently, an N⁻ diffusion region 29 is formed. The N-type impurity ion 70 is obliquely implanted at a higher implantation energy than that of the P-type impurity ion 69.

Subsequently, it is possible to obtain the structure shown in FIG. 1 by using the existing method of forming a MOS transistor and a variable capacitance.

In the method of manufacturing a semiconductor device according to the fourth embodiment, thus, the extension region is simultaneously formed in the MOS transistor and the variable capacitance which have the same conductivity type. As compared with the method of manufacturing a semiconductor device according to the first embodiment, therefore, two ion implanting steps can be eliminated.

Fifth Embodiment

Figure 16:
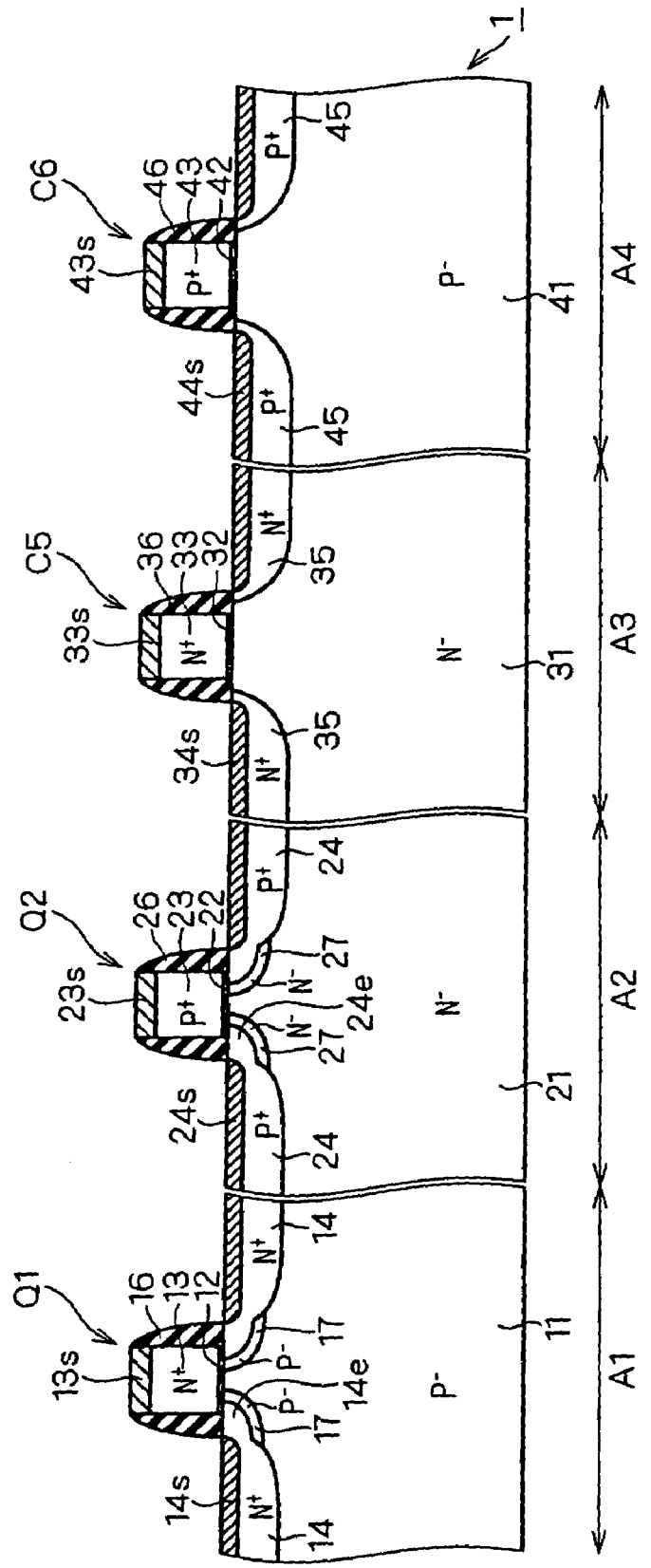
FIG. 16 is a sectional view showing a structure of a semiconductor device according to a fifth embodiment of the present invention.

FIG. 16 is a sectional view showing a structure of a semiconductor device having a MOS transistor and a variable capacitance according to a fifth embodiment of the present invention.

As shown in FIG. 16, variable capacitances C5 and C6 having no extension region are provided in place of the variable capacitances C1 and C2 having the extension regions. More specifically, as compared with the structure according to the first embodiment shown in FIG. 1, the N⁺ extraction electrode regions 34 having the extension portion 34e is replaced with an N⁺ extraction electrode regions 35 having no extension portion and the P⁺ extraction electrode regions 44 having the extension portion 44e is replaced with a P⁺ extraction electrode regions 45 having no extension portion. Other structures are the same as those of the first embodiment shown in FIG. 1.

A method of manufacturing a semiconductor device according to the fifth embodiment is different from the method of manufacturing a semiconductor device according to the first embodiment in that the steps of manufacturing the N⁻ extension region 38 and the P⁻ extension region 48 shown in FIGS. 4 and 6 are omitted.

In the method of manufacturing a semiconductor device according to the fifth embodiment, thus, the step of forming the extension region of a variable capacitance is omitted. Consequently, two steps, that is, the step of forming a resist and the step of implanting an ion can be eliminated as compared with the method of manufacturing a semiconductor device according to the first embodiment.

Although the variable capacitance cannot produce the effect by the provision of the extension portion in the semiconductor device according to the fifth embodiment, the effect of providing no pocket region can be obtained in the same manner as that in each of the first to fourth embodiments.

Sixth Embodiment

Figure 17:
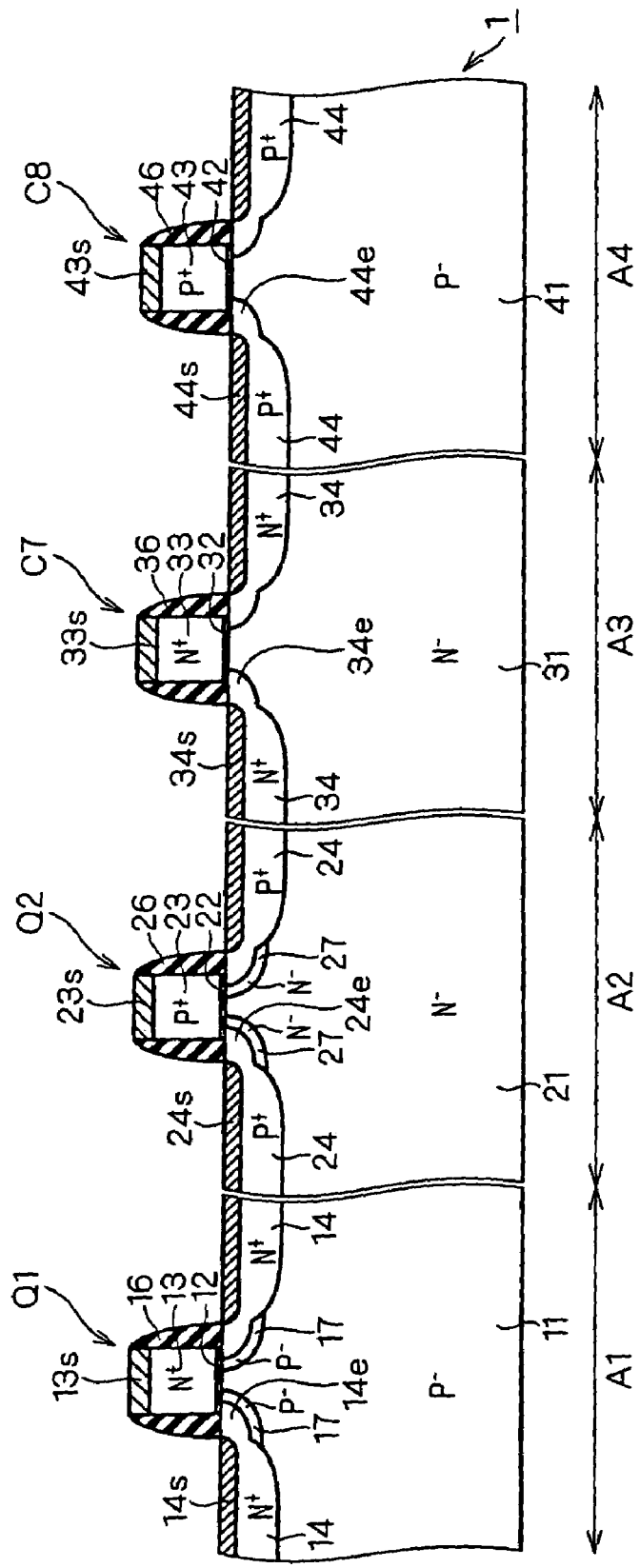
FIG. 17 is a sectional view showing a structure of a semiconductor device according to a sixth embodiment of the present invention.

FIG. 17 is a sectional view showing a structure of a semiconductor device having a MOS transistor and a variable capacitance according to a sixth embodiment of the present invention.

As shown in FIG. 17, variable capacitances C7 and C8 having extension regions in higher concentrations than those of the variable capacitances C1 and C2 are provided in place of the variable capacitances C1 and C2.

More specifically, as compared with the structure according to the first embodiment, the N⁻ extension region 38 and the P⁻ extension region 48 shown in FIGS. 4 and 6 are formed to have impurity concentrations which are approximately twice to 100 times as high as those of the N⁻ extension region 18 and the P⁻ extension region 28 in the MOS transistor.

Although gate lengths of MOS transistors Q1 and Q2 are almost equal to those of the variable capacitances C7 and C8 in FIG. 17, the gate length of the variable capacitance is actually set to be greater than that of the MOS transistor in many cases.

Accordingly, the influence of a short channel effect in the variable capacitance is smaller than that in the MOS transistor. Consequently, a bad effect is lessened with an increase in the impurity concentration of the extension region. To the contrary, it is possible to obtain a greater advantage that a series resistance component of the variable capacitance can be reduced with the increase in the impurity concentration of the extension region.

While the example in which the extension region is formed in a high concentration has been described in the present embodiment, the same effects can be obtained even if an implantation energy of an impurity ion is increased to be approximately 1.2 to 30 times as high as that of the MOS transistor and a depth of the extension region is increased to be approximately 1.2 to 30 times as great as that of the MOS transistor.

Seventh Embodiment

In general, if a device is subjected to scaling, a power supply voltage is also subjected to the scaling and is thereby reduced. Consequently, it is necessary to provide an interface with another chip (device) to be operated at a high voltage.

At this time, it is necessary to fabricate a 3.3 V or 5.0 V compatible MOS transistor for a high voltage (hereinafter referred to as a "transistor for a high voltage"), for example, in addition to a high performance MOS transistor (hereinafter referred to as a "high performance transistor") which is subjected to the scaling in the device.

By a comparison of the transistor for a high voltage with the high performance transistor, a gate length is greater and a gate oxide film has a greater thickness, and furthermore, an extension region is formed on different conditions and pocket regions are not formed in many cases. The extension region is formed on the different conditions in order to increase a hot carrier tolerance such that an S/D breakdown phenomenon such as punch-through is not presented at a high voltage. The pocket regions do not need to be formed because the gate length is great.

Figure 18:
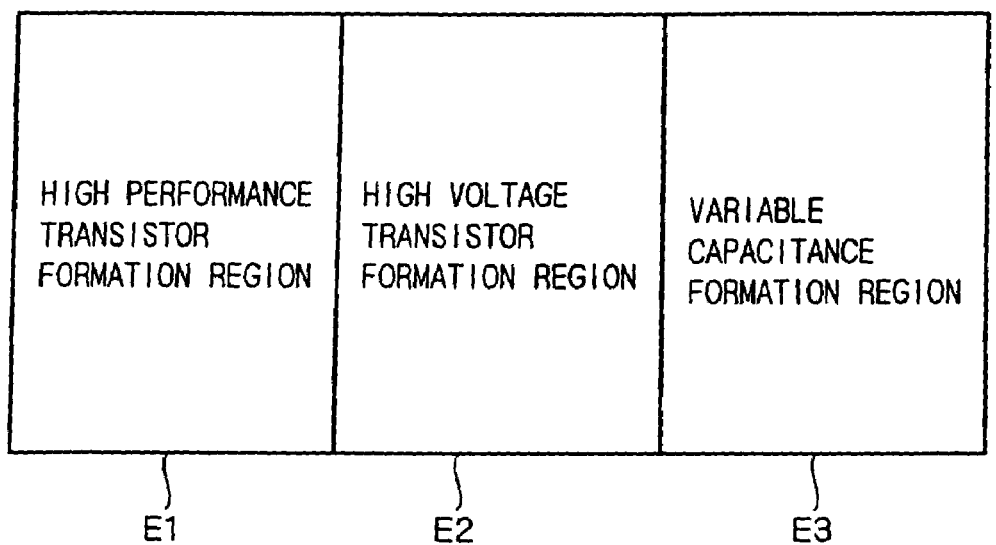
FIG. 18 is a diagram illustrating a layout structure of a semiconductor device according to a seventh embodiment of the present invention.

FIG. 18 is a diagram illustrating a layout structure of a semiconductor device having a MOS transistor and a variable capacitance according to a seventh embodiment of the present invention. As shown in FIG. 18, the semiconductor device is constituted by a high performance transistor formation region E1, a high voltage transistor formation region E2 and a variable capacitance formation region E3 according to the seventh embodiment, and a high performance transistor, a transistor for a high voltage and a variable capacitance are provided in the formation regions E1 to E3, respectively.

Figure 19:
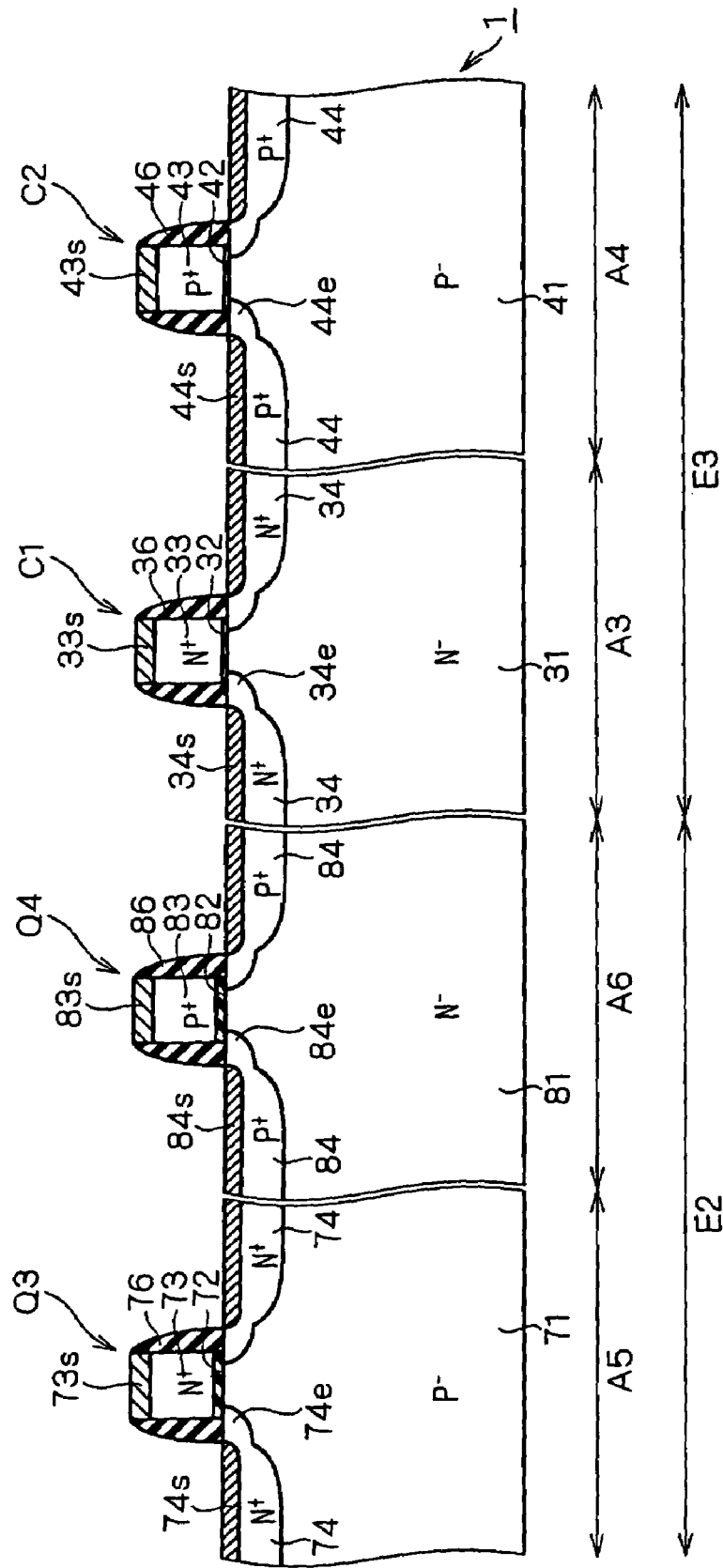
FIG. 19 is a sectional view showing a structure of a high voltage transistor formation region and a variable capacitance formation region in the semiconductor device according to the seventh embodiment.

FIG. 19 is a sectional view showing structures of the high voltage transistor formation region E2 and the variable capacitance formation region E3 in the semiconductor device according to the seventh embodiment.

In an NMOS formation region A5 of the high voltage transistor formation region E2, a gate oxide film 72 is selectively formed on a surface of a P well region 71 to be a body region and an N$^+$-type gate electrode 73 is formed on the gate oxide film 72. N$^+$ source-drain regions 74 and 74 are formed to interpose therebetween a channel region provided under the gate electrode 73 and tip regions opposed to each other between the N$^+$ source-drain regions 74 and 74 are extension portions 74e, respectively.

Moreover, side walls 76 and 76 are formed on both side surfaces of the gate electrode 73, respectively. Furthermore, a silicide region 74s and a silicide region 73s are formed in a surface of the N$^+$ source-drain regions 74 and an upper layer portion of the gate electrode 73, respectively.

Thus, an NMOS transistor Q3 for a high voltage is formed by the gate oxide film 72, the gate electrode 73, the N$^+$ source-drain regions 74 and the side wall 76.

In a PMOS formation region A6 of the high voltage transistor formation region E2, a gate oxide film 82 is selectively formed on a surface of an N well region 81 and a P$^+$-type gate electrode 83 is formed on the gate oxide film 82. P$^+$ source-drain regions 84 and 84 are formed to interpose therebetween a channel region provided under the gate electrode 83 and tip regions opposed to each other between the P$^+$ source-drain regions 84 and 84 are extension portions 84e, respectively.

Moreover, side walls 86 and 86 are formed on both side surfaces of the gate electrode 83, respectively. Furthermore, a silicide region 84s and a silicide region 83s are formed in a surface of the P$^+$ source-drain regions 84 and an upper layer portion of the gate electrode 83, respectively.

Thus, a PMOS transistor Q4 for a high voltage is formed by the gate oxide film 82, the gate electrode 83, the P$^+$ source-drain regions 84 and the side wall 86.

The high performance transistor formed in the high performance transistor formation region E1 is provided to have the same structure as that of each of the NMOS transistor Q1 and the PMOS transistor Q2 according to the first embodiment shown in FIG. 1, for example, which is not shown in FIG. 19.

The NMOS transistor Q3 for a high voltage and the PMOS transistor Q4 for a high voltage are different from the NMOS transistor Q1 and the PMOS transistor Q2 for a high performance in that gate lengths are greater, the gate oxide films have greater thicknesses, the extension regions are set on different conditions and the pocket regions are not formed.

On the other hand, an N-type variable capacitance C1 and a P-type variable capacitance C2 are formed in an N-type variable capacitance formation region A3 and a P-type variable capacitance formation region A4 in the variable capacitance formation region E3, respectively.

The N-type variable capacitance C1 and the P-type variable capacitance C2 have the same basic structures as those of the N-type variable capacitance C1 and the P-type variable capacitance C2 according to the first embodiment shown in FIG. 1.

In each of the N-type variable capacitance C1 and the P-type variable capacitance C2, an extension region is formed to have a higher impurity concentration than that of the extension region of each of the NMOS transistor Q1 and the PMOS transistor Q2 and an equal gate length on the same conditions (at least the impurity concentration is almost equal) as compared with the NMOS transistor Q3 for a high voltage and the PMOS transistor Q4 for a high voltage. In the N-type variable capacitance C1 and the P-type variable capacitance C2, moreover, the gate oxide films have equal thicknesses as compared with the NMOS transistor Q1 and the PMOS transistor Q2.

In the semiconductor device having such a structure according to the seventh embodiment, the extension regions in the NMOS transistor Q3 for a high voltage and the N-type variable capacitance C1 can be formed at the same step and the extension regions of the PMOS transistor Q4 for a high voltage and the P-type variable capacitance C2 can be formed at the same step. Therefore, it is possible to obtain a semiconductor device having a variable capacitance with a series resistance component reduced while minimizing the number of manufacturing steps.

In some cases, moreover, the extension region of the transistor for a high voltage is to be formed as an LDD region to have an impurity concentration which is almost equal to that of the extension region of the high performance transistor. In these cases, an implantation energy is increased and the extension region is formed deeply.

Accordingly, it is possible to obtain the same effects as those in the semiconductor device according to the sixth embodiment by forming the extension region of the variable capacitance comparatively deeply on the same conditions as those of the extension region of the transistor for a high voltage.

Eighth Embodiment

An eighth embodiment provides a semiconductor device having such a structure as to comprise a MOS transistor and a variable capacitance in which channel regions have different impurity concentrations, respectively. In the semiconductor device according to the eighth embodiment, the impurity concentrations of the channel regions in the MOS transistor and the variable capacitance are set to be different from each other so that a degree of freedom of a design in the device can be enhanced, for example, a threshold voltage can be set separately.

FIG. 20 is a sectional view showing a structure of the semiconductor device having the MOS transistor and the variable capacitance according to the eighth embodiment of the present invention. In FIG. 20, a PMOS transistor Q2 to be formed in a PMOS formation region A2 is the same as the PMOS transistor Q2 according to the first embodiment shown in FIG. 1.

On the other hand, an N-type variable capacitance C9 to be formed in an N-type variable capacitance formation region A3 has P⁻ pocket regions 37 in the vicinity of an extension portion 34e and an N well region 31 provided between N⁺ extraction electrode regions 34 and 34 acts as a high concentration channel region 31c. Other structures are the same as the structure of the N-type variable capacitance C1 according to the first embodiment shown in FIG. 1.

The N-type variable capacitance C9 includes the high concentration channel region 31c having a higher N-type impurity concentration than that of other regions of the N well region 31. The high concentration channel region 31c can cancel the P⁻ pocket regions 37 to sufficiently compensate for a reduction in a series resistance component. Therefore, a Q-value of the variable capacitance can be fully increased.

In the structure shown in FIG. 20, thus, when a channel concentration is to be changed between the PMOS transistor Q2 and the N-type variable capacitance C9, the high concentration channel region 31c is provided in the N-type variable capacitance C9, thereby increasing the Q-value of the variable capacitance. More specifically, the structure shown in FIG. 20 is a desirable example in which impurity concentrations in the respective channel regions of the MOS transistor and the variable capacitance are set to be different from each other, thereby enhancing a degree of freedom of a design.

After the N well region 31 is formed, an N-type impurity is further implanted into an upper layer portion of the N well region 31 to obtain the high concentration channel region 31c. More specifically, a step of forming the high concentration channel region 31c is required separately.

While only the PMOS transistor and the N-type variable capacitance are shown in FIG. 20, it is a matter of course that an NMOS transistor and a P-type variable capacitance can also be formed to have the same structures.

Ninth Embodiment

FIG. 21 is a sectional view showing a part of a method of manufacturing a semiconductor device having a MOS transistor and a variable capacitance according to a ninth embodiment of the present invention.

In the method of manufacturing a semiconductor device according to the ninth embodiment, pocket regions are formed in both the MOS transistor and the variable capacitance.

It is assumed that source-drain regions are formed on the MOS transistor side and extraction electrode regions 34 are formed on the variable capacitance side by first ion implantation and diffusion through a forming step based on an existing method.

For the first impurity implantation and diffusion, a heat treatment (for example, RTA (Rapid Thermal Anneal) at 900 to 1100° C. for 10 to 120 seconds in an $N_2$ atmosphere) is carried out after implantation of an N-type impurity. For the heat treatment, a crystal defect formed by the implantation of the N-type impurity is recovered.

Subsequent processings are peculiar to the manufacturing method according to the ninth embodiment. In the ninth embodiment, furthermore, second impurity implantation and diffusion is not carried out over the MOS transistor but only the variable capacitance as shown in FIG. 21. In an example of FIG. 21, for the second impurity implantation, an N-type impurity ion 91 is implanted by using a gate electrode 33 as a mask to carry out a heat treatment. Consequently, N⁺ extraction electrode regions 34h are formed so that an N-type variable capacitance C15 is finally obtained.

Examples of the second impurity implantation and diffusion include annealing to be carried out at a comparatively low temperature of 500 to 800° C. for approximately 10 to 120 minutes after the implantation of the N-type impurity.

The second impurity implantation and diffusion is carried out over only the variable capacitance and the heat treatment is performed at the comparatively low temperature during the diffusion as described above. Therefore, there is presented TED (Transient Enhanced Diffusion) to be a phenomenon in which a crystal defect formed by the second impurity ion implantation is introduced into a well region of the variable capacitance and a defect portion and an impurity are coupled to each other and are greatly diffused.

By the TED phenomenon, impurities in P⁻ pocket regions 37 and the N⁺ extraction electrode regions 34h which are formed in the N-type variable capacitance C15 are diffused again. As a result, the presence of the P⁻ pocket regions 37 do not have such an influence that a series resistance is reduced. Consequently, it is possible to obtain the N-type variable capacitance C15 having a great Q-value.

While FIG. 21 shows the N-type variable capacitance C15, it is a matter of course that the present invention can also be applied to a P-type variable capacitance.

The second implantation may include a process of implanting an impurity ion of the N type in an oblique direction.

In this case, the deterioration in the resistance component by the pocket regions 37 can be effectively suppressed by the ion implantation in the oblique direction.

Tenth Embodiment

FIGS. 22 to 26 are sectional views showing a method of manufacturing an N-type variable capacitance in a semiconductor device having a MOS transistor and a variable capacitance according to a tenth embodiment of the present invention. With reference to these drawings, description will be given to a procedure for manufacturing the N-type variable capacitance according to the tenth embodiment.

Figure 22:
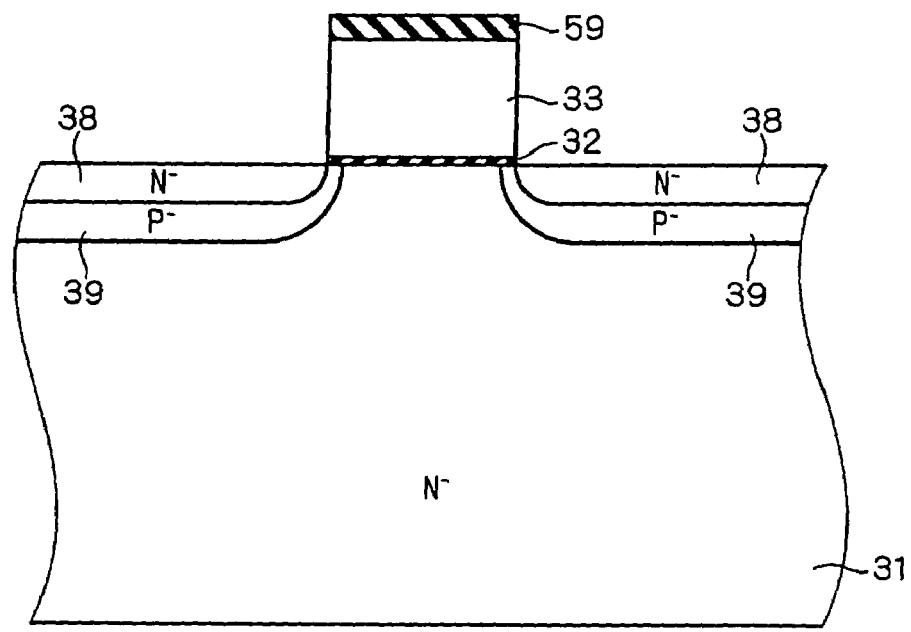
FIGS. 22 to 26 are sectional views showing a method of manufacturing an N-type variable capacitance in a semiconductor device according to a tenth embodiment.

As shown in FIG. 22, first of all, a lamination structure having a gate oxide film 32, a gate electrode 33 and an oxide film 59 for a mask is selectively provided on a surface of an N well region 31. By using the lamination structure as a mask, N- and P-type impurities are introduced to form an N⁻ extension region 38 and a P⁻ diffusion region 39, respectively. For a material of the gate electrode 33 to be formed, polysilicon is used.

Figure 23:
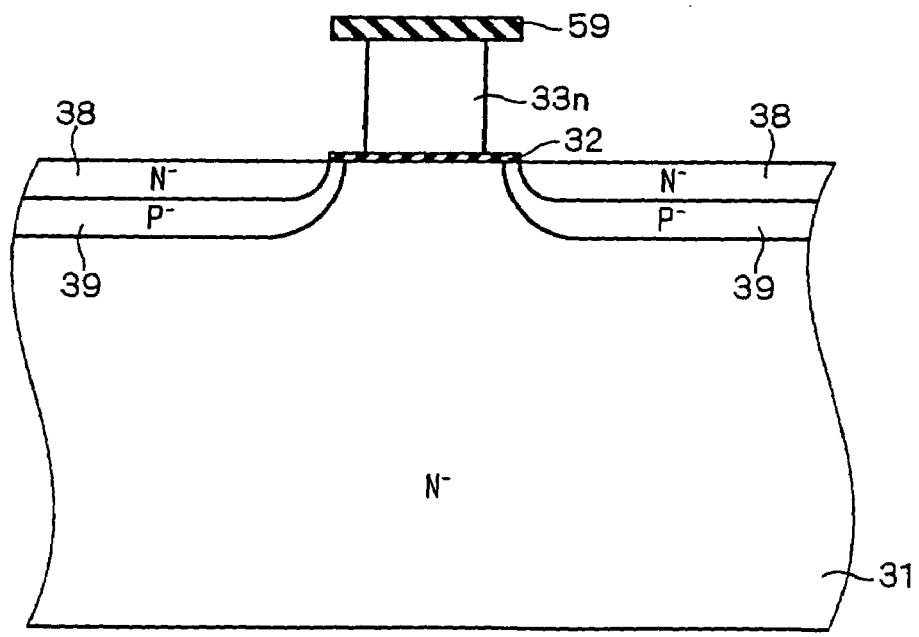

As shown in FIG. 23, next, isotropic polysilicon etching is carried out over the gate electrode 33 to partially remove a peripheral region in a direction of a gate length of the gate electrode 33. Thus, a gate electrode 33n having a small gate length is obtained.

Figure 24:
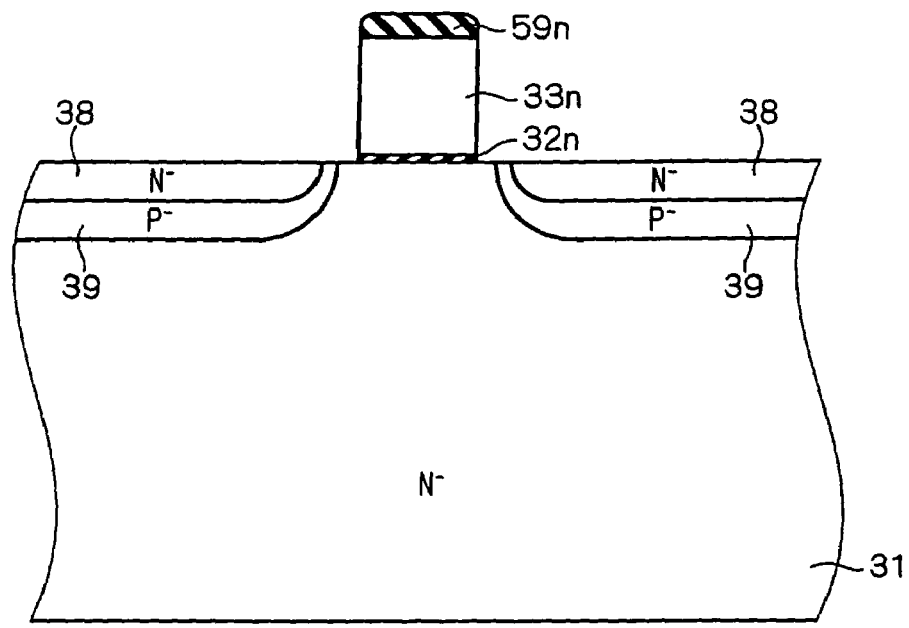

As shown in FIG. 24, then, wet etching for an oxide film is carried out over the oxide film 59 for a mask and the gate oxide film 32. Consequently, an oxide film 59n for a mask and a gate oxide film 32n are obtained by reducing the oxide film 59 for a mask and the gate oxide film 32.

Figure 25:
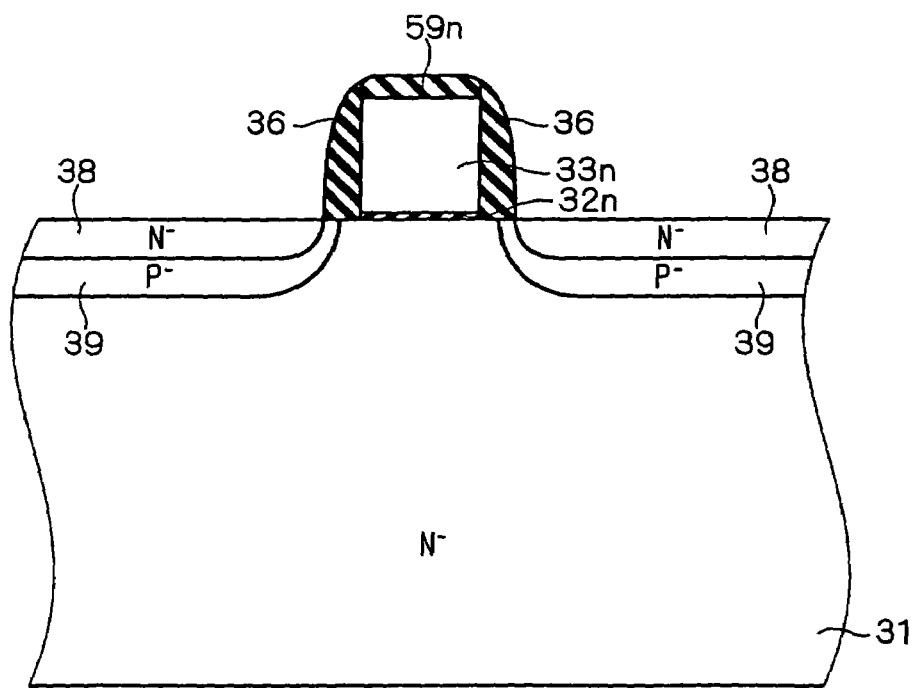

As shown in FIG. 25, then, a side wall 36 is formed on a side surface of the gate electrode 33n.

Figure 26:
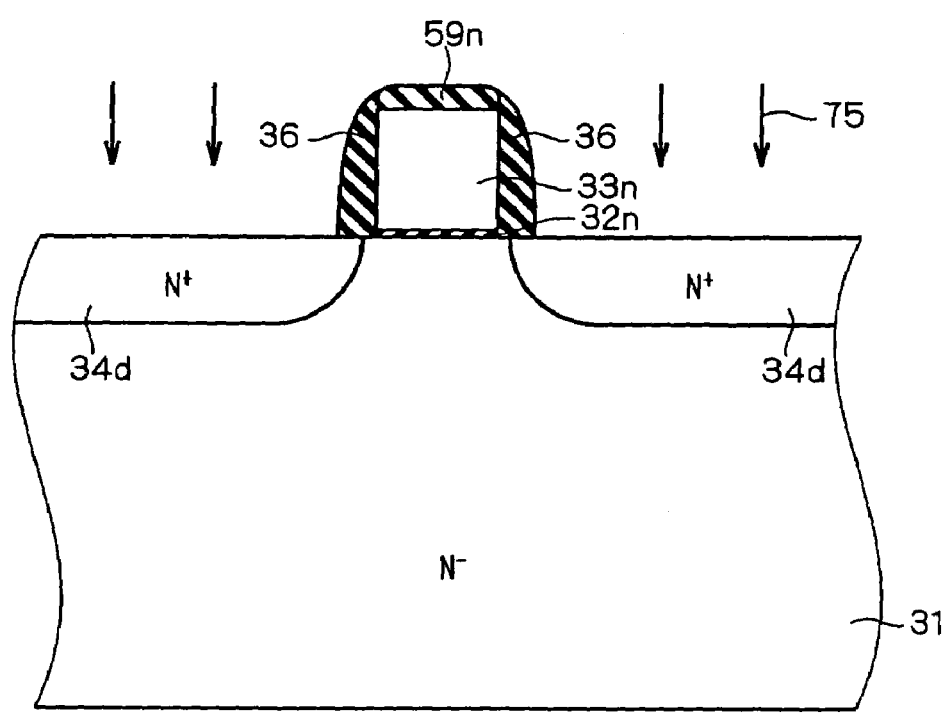

As shown in FIG. 26, thereafter, an N-type impurity ion 75 is implanted and diffused by using the gate electrode 33n and the side wall 36 as masks. Consequently, N⁺ extraction electrode regions 34d are obtained. The N⁺ extraction electrode regions 34d are formed in a region including a whole P⁻ diffusion region 39 and an N-type impurity concentration is higher than a P-type impurity concentration of the P⁻ diffusion region 39. Therefore, the influence of the P⁻ diffusion region 39 can be cancelled completely. More specifically, pocket regions are not present in the finished variable capacitance.

In the tenth embodiment, thus, the side wall is formed and the extraction electrode regions are provided after the gate length of the gate electrode is reduced. Consequently, the finished device can have such a structure that the pocket regions are not present. Therefore, it is possible to obtain an N-type variable capacitance having a great Q-value even if pocket regions forming step is included.

While the method of manufacturing the N-type variable capacitance has been described in the tenth embodiment, it is a matter of course that a P-type variable capacitance can be manufactured in the same manner.

Eleventh Embodiment

Figure 27:
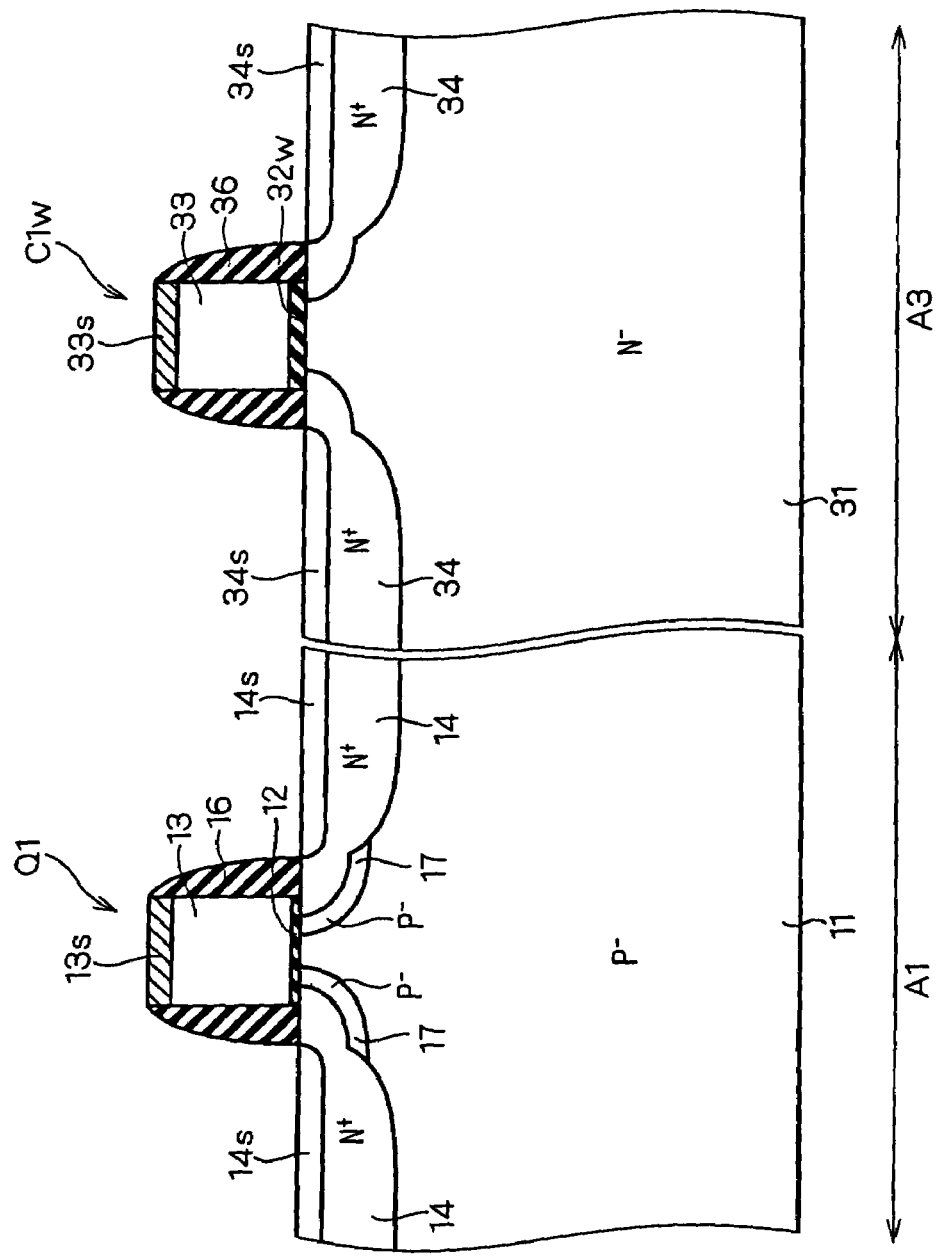
FIG. 27 is a sectional view showing a structure of a semiconductor device according to an eleventh embodiment of the present invention.

FIG. 27 is a sectional view showing a structure of a semiconductor device having a MOS transistor and a variable capacitance according to an eleventh embodiment of the present invention. In FIG. 27, an NMOS transistor Q1 to be formed in an NMOS formation region A1 is the same as the NMOS transistor Q1 according to the first embodiment shown in FIG. 1.

On the other hand, an N-type variable capacitance C1w to be formed in an N-type variable capacitance formation region A3 is different in that a thickness of a gate oxide film 32w is greater than that of a gate oxide film 12. Other structures are the same as those of the N-type variable capacitance C1 according to the first embodiment shown in FIG. 1.

An oscillation frequency f of an LC type VCO is determined by the following equation (2). Therefore, it is desirable that a capacitance component of a variable capacitance should be reduced in order to fabricate an oscillator for oscillation at a high frequency.

[Equation 2]

$$f = \frac{1}{2\pi\sqrt{LC}} \quad (2)$$

However, there is a problem in that a series parasitic resistance is increased if a variable capacitance is manufactured in a small pattern.

As shown in FIG. 27, when the gate oxide film 32w is formed to have a greater thickness than that of the gate oxide film 12, the capacitance component of the variable capacitance can be reduced without changing a pattern size, that is, increasing a parasitic resistance component. Furthermore, a Q-value can also be enhanced by a reduction in the capacitance component in accordance with the equation (1).

Moreover, in the case in which a transistor for a high voltage is provided in addition to a high performance transistor as in the semiconductor device according to the seventh embodiment, the gate oxide film 32w is formed during formation of a gate oxide film of the transistor for a high voltage which has a greater thickness than that of a gate oxide film in the high performance transistor. Consequently, it is possible to obtain the gate oxide film 32w having a smaller thickness than that of the high performance transistor without increasing the number of manufacturing steps.

While only the NMOS transistor and the N-type variable capacitance are shown in FIG. 27, it is a matter of course that a PMOS transistor and a P-type variable capacitance can also be formed to have the same structures.

Twelfth Embodiment (First Mode)

Figure 28:
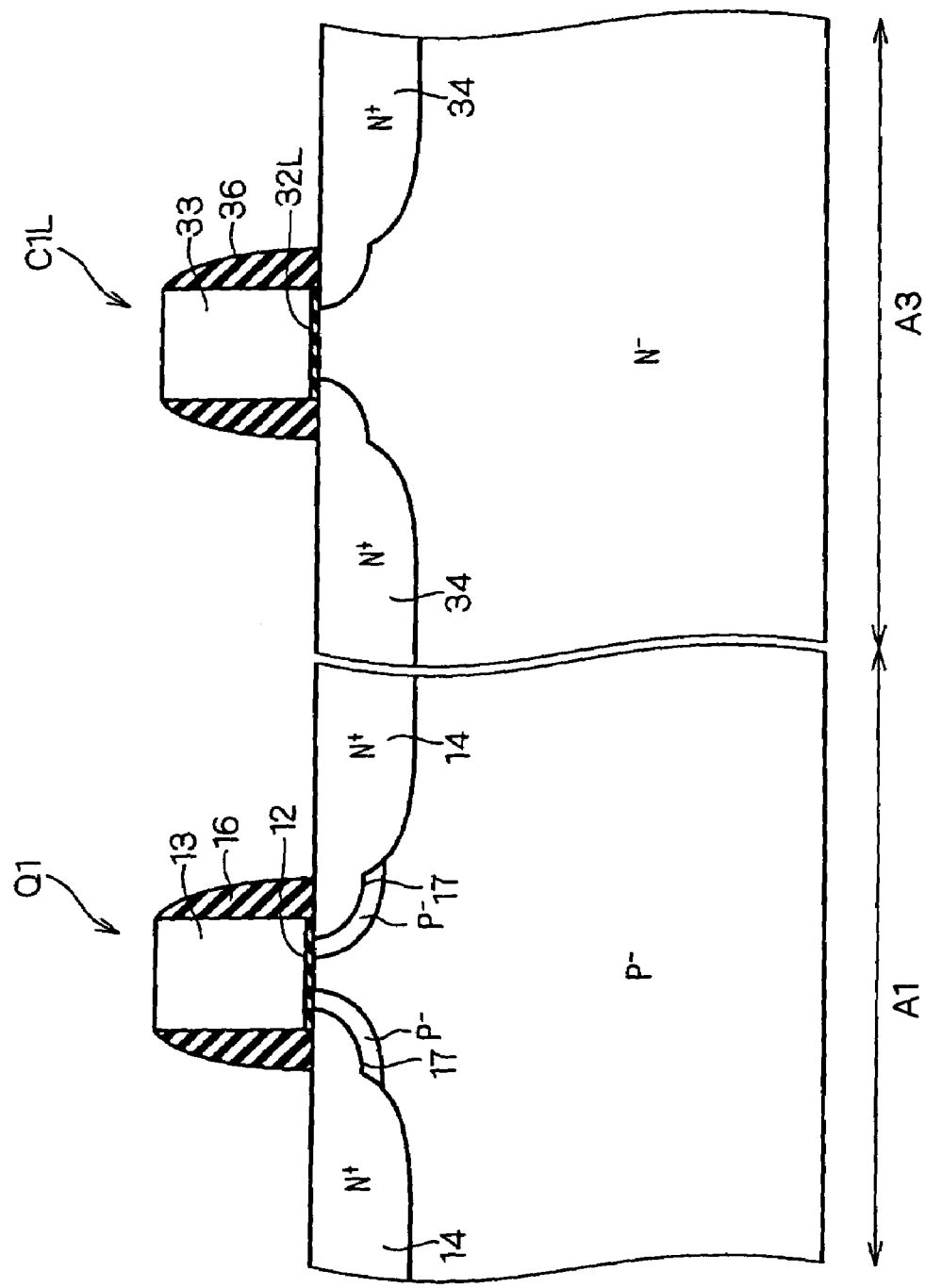
FIG. 28 is a sectional view showing a structure of a first mode of a semiconductor device according to a twelfth embodiment of the present invention.

FIG. 28 is a sectional view showing a structure of a first mode of a semiconductor device having a MOS transistor and a variable capacitance according to a twelfth embodiment of the present invention. In FIG. 28, an NMOS transistor Q1 to be formed in an NMOS formation region A1 is the same as the NMOS transistor Q1 according to the first embodiment shown in FIG. 1.

On the other hand, an N-type variable capacitance C1L to be formed in an N-type variable capacitance formation region A3 is different in that a material of a gate oxide film 32L has a lower dielectric constant than that of a material of a gate oxide film 12. Other structures are the same as those of the N-type variable capacitance C1 according to the first embodiment shown in FIG. 1.

In order to obtain the gate oxide film 32L, for example, it is proposed that F (fluorine) is implanted into only a gate oxide film 32 of the N-type variable capacitance C1L.

In the first mode of the twelfth embodiment, thus, a capacitance component of the variable capacitance can be reduced without increasing a parasitic resistance component. Therefore, the same effects as those in the eleventh embodiment can be obtained.

While only the NMOS transistor and the N-type variable capacitance are shown in FIG. 28, it is a matter of course that a PMOS transistor and a P-type variable capacitance can be formed to have the same structures.

(Second Mode)

Figure 29:
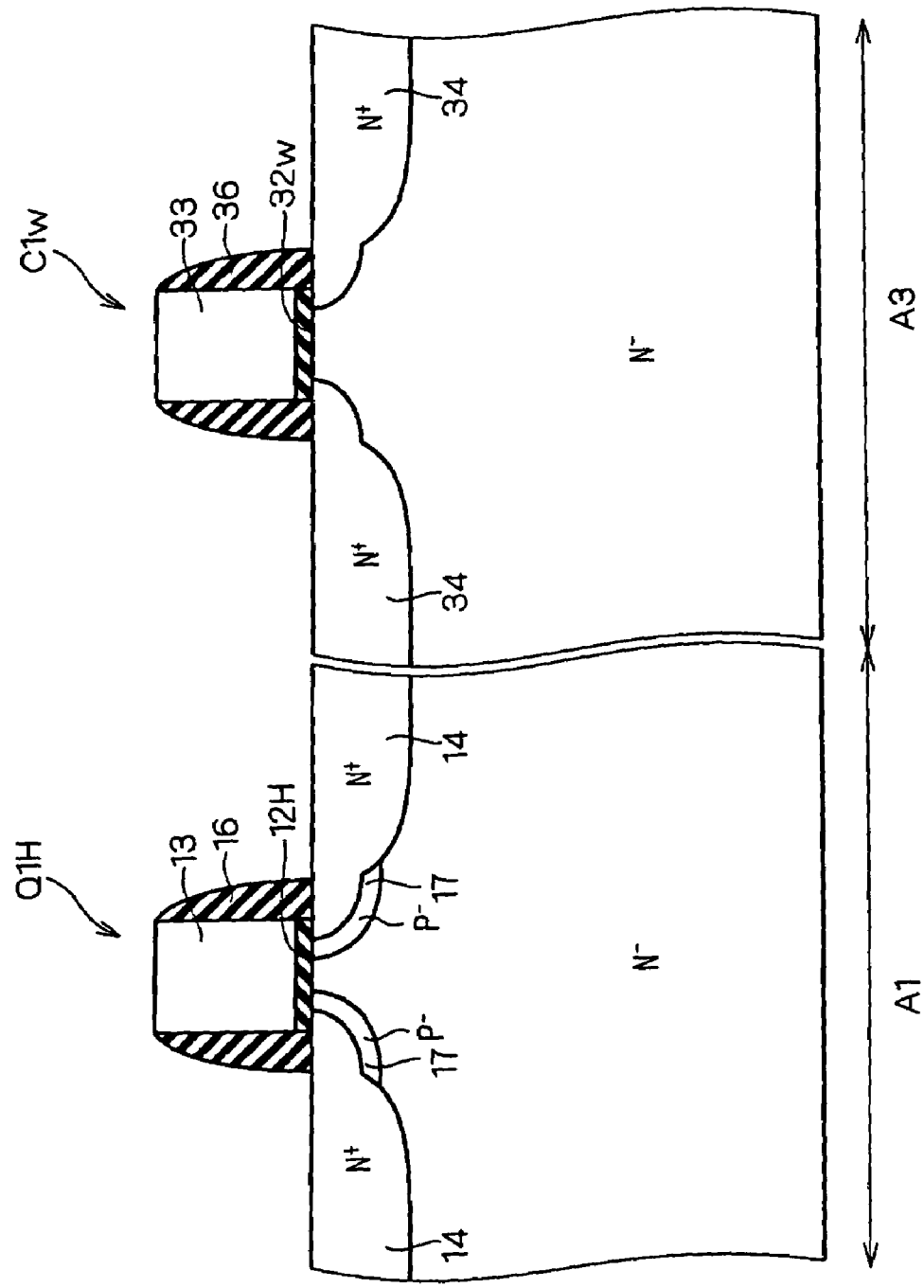
FIG. 29 is a sectional view showing a structure of a second mode of the semiconductor device according to the twelfth embodiment of the present invention.

FIG. 29 is a sectional view showing a structure of a second mode of the semiconductor device having a MOS transistor and a variable capacitance according to a twelfth embodiment of the present invention. In FIG. 29, an N-type variable capacitance C1w to be formed in an N-type variable capacitance formation region A3 is different in that a thickness of a gate oxide film 32w is greater than that of a gate oxide film 12. Other structures are the same as those of the N-type variable capacitance C1 according to the first embodiment shown in FIG. 1.

An NMOS transistor Q1 to be formed in an NMOS formation region A1 is different in that a gate insulating film 12H is formed by using a High-k material having a higher dielectric constant than that of a silicon oxide film and the gate insulating film 12H is formed to have an almost equal thickness to that of the gate oxide film 32w. Other structures are the same as those of the NMOS transistor Q1 according to the first embodiment shown in FIG. 1.

Examples of the High-k material include $Si_3N_4$, $Ta_2O_5$, $Al_2O_3$, $HfO_2$, $ZrO_2$ and the like.

In the first mode of the twelfth embodiment, thus, it is possible to reduce a capacitance component of the variable capacitance without increasing a parasitic resistance component. Therefore, the same effects as those in the eleventh embodiment can be obtained.

The thickness of the gate insulating film 12H is almost equal to that of the gate oxide film 32w. Therefore, the gate insulating film 12H and the gate oxide film 32w can be manufactured at the same step. Consequently, it is possible to obtain the gate oxide film 32w having a smaller thickness than that of a high performance transistor without increasing the number of manufacturing steps. In this case, since the gate insulating film 12H is formed of the High-k material, an electrical characteristic of an NMOS transistor Q1H is not adversely affected.

While only the NMOS transistor and the N-type variable capacitance are shown in FIG. 29, it is a matter of course that a PMOS transistor and a P-type variable capacitance can be formed to have the same structures.

Thirteenth Embodiment

Figure 30:
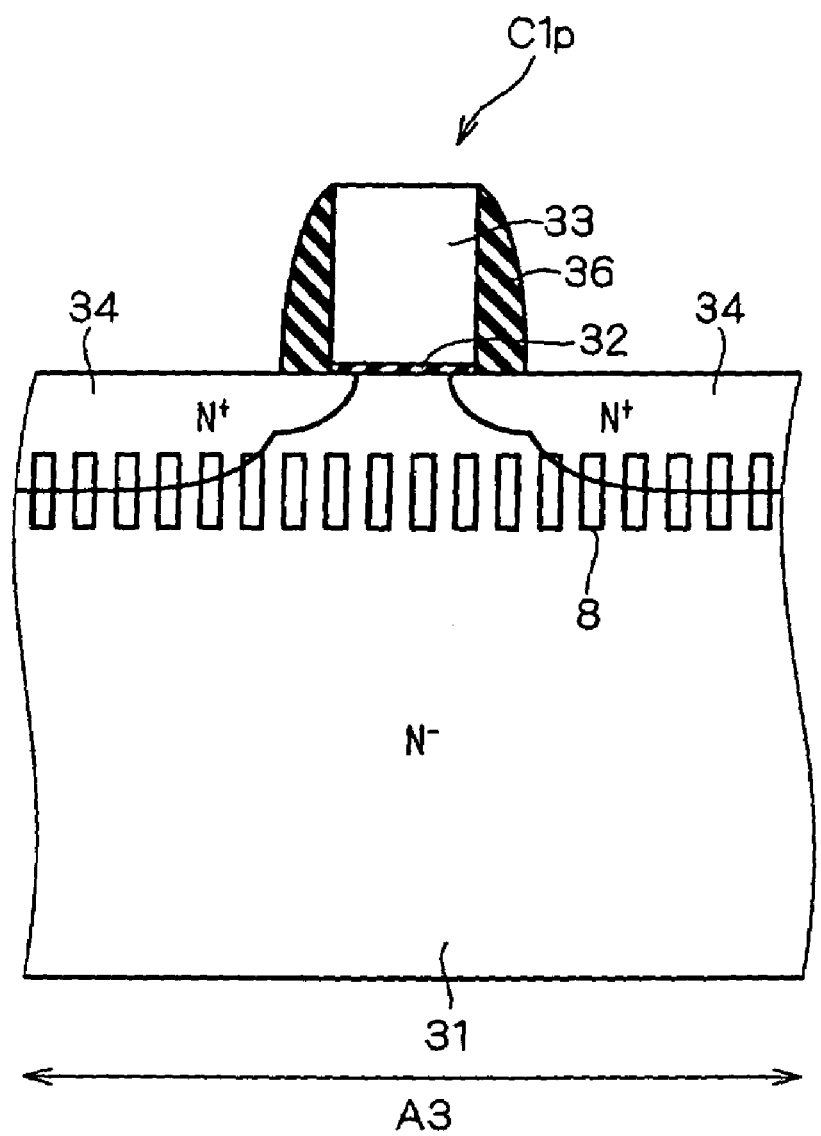
FIG. 30 is a sectional view showing a structure of a first mode of a semiconductor device according to a thirteenth embodiment of the present invention.

FIG. 30 is a sectional view showing a structure of a semiconductor device having a MOS transistor and a variable capacitance according to a thirteenth embodiment of the present invention. In FIG. 30, an N-type variable capacitance C1p to be formed in an N-type variable capacitance formation region A3 is different in that a porous silicon layer 8 is formed in an upper layer portion of an N well region 31. Other structures are the same as those of the N-type variable capacitance C1 according to the first embodiment shown in FIG. 1.

By the provision of the porous silicon layer 8, an effective dielectric constant of silicon is decreased so that a capacitance component of the N-type variable capacitance C1p can be reduced. When a vacancy is continuously formed so that a rate (vacancy ratio) of the vacancy occupying the upper layer portion of the N well region 31 is too high, a resistance of the N well region 31 is increased. Therefore, it is desirable that the vacancy ratio should be 50% or less.

Since a capacitance component of the variable capacitance can be thus reduced without greatly increasing a parasitic resistance component in the thirteenth embodiment, the same effects as those in the eleventh embodiment can be obtained.

While only the N-type variable capacitance is shown in FIG. 30, it is a matter of course that a P-type variable capacitance can also be formed to have the same structure.

(Formation of Porous Silicon Layer)

FIGS. 31 to 35 are sectional views showing a method of forming a porous silicon layer which has been disclosed in Japanese Patent Application Laid-Open No. 2000-307112, for example. With reference to these drawings, a procedure for forming the porous silicon layer will be described below.

Figure 32:
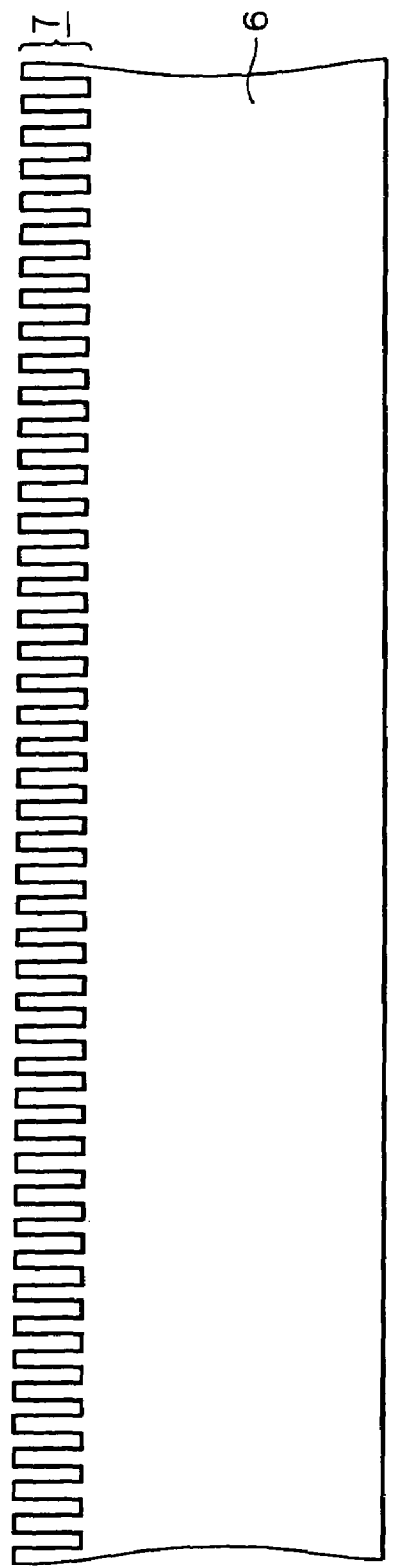

As shown in FIG. 31, first of all, a porous silicon layer 7 is formed in an upper surface of an N-type silicon substrate 6 by anode formation. More specifically, the silicon substrate 6 is immersed in an HF solution 152 in a formation layer 151 and a current is caused to flow to the silicon substrate 6 by setting an upper platinum electrode 153 to be a cathode and a lower platinum electrode 154 to be an anode. For conditions, a formation time of 30 seconds and a formation current density of 10 mA/cm² are set. As shown in FIG. 32, consequently, the upper surface of the silicon substrate 6 is made porous and the porous silicon layer 7 having a thickness of approximately 0.2 µm is formed in the upper surface of the silicon substrate 6.

Figure 33:
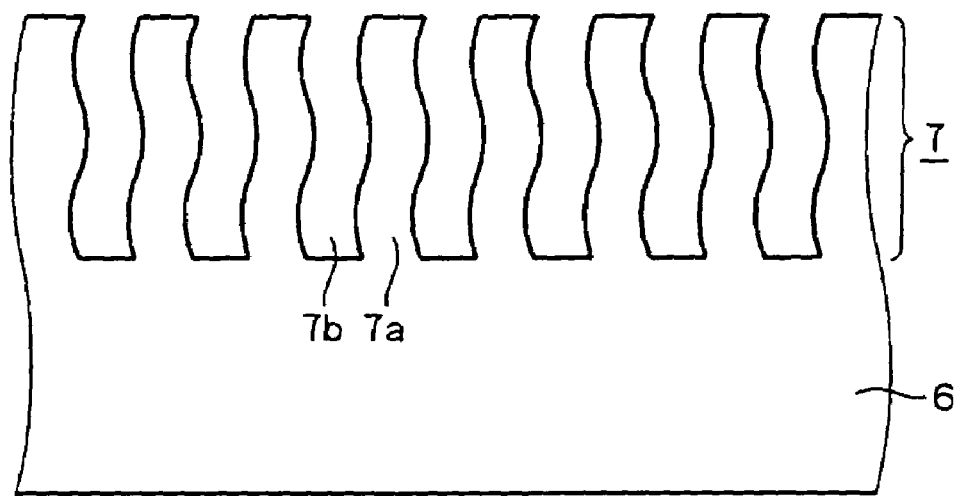

FIG. 33 is a sectional view specifically showing a shape of the porous silicon layer 7. The porous silicon layer 7 has a complicated shape as shown in FIG. 33 (more specifically, see Document 2, pp 470, FIG. 4 or Document 3, pp 379, FIG. 2 which will be described below). In this specification, the shape of the porous silicon layer 7 is simplified for description as shown in FIG. 32. A thickness of the porous silicon layer 7 can be controlled based on a formation time and a formation current density, and furthermore, the vacancy ratio of the porous silicon layer 7 (a density corresponding to a ratio of a silicon portion 7a to a vacancy portion 7b) can be controlled by a concentration of the HF solution 152 (see SOI structure forming technique, pp 181 to 185, written by Seijiro Furukawa, 1987, Sangyo Tosho: (Document 1)).

Figure 34:
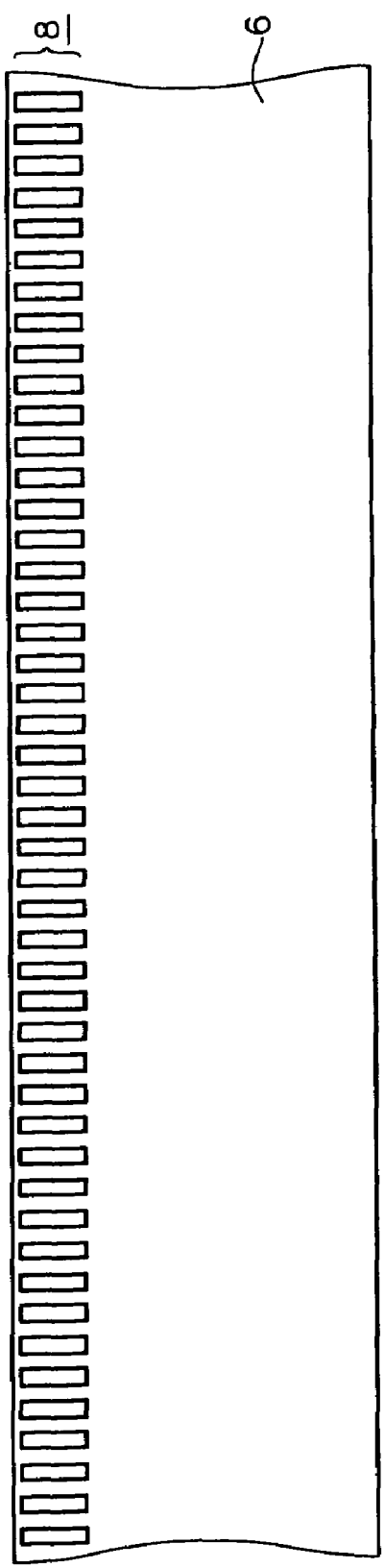

In order to maintain stability of the porous structure of the porous silicon layer 7 for a heat treatment, next, preoxidation is carried out at a low temperature of approximately 400° C. In order to reduce the quantity of crystal defects of an expitaxial layer 9 to be formed at a subsequent step, then, the heat treatment is carried out at a temperature of 1000° C. or more for a few seconds in a hydrogen atmosphere. Consequently, a mobility of surface atoms is dramatically increased by minimization of a surface energy of the porous silicon layer 7 and a surface hole (not shown) generated in an upper surface of the porous silicon layer 7 due to natural oxidation of a surface is reduced and removed. As a result, as shown in FIG. 34, a porous silicon layer 8 is formed by sufficiently smoothening the upper surface of the porous silicon layer 7.

Figure 35:
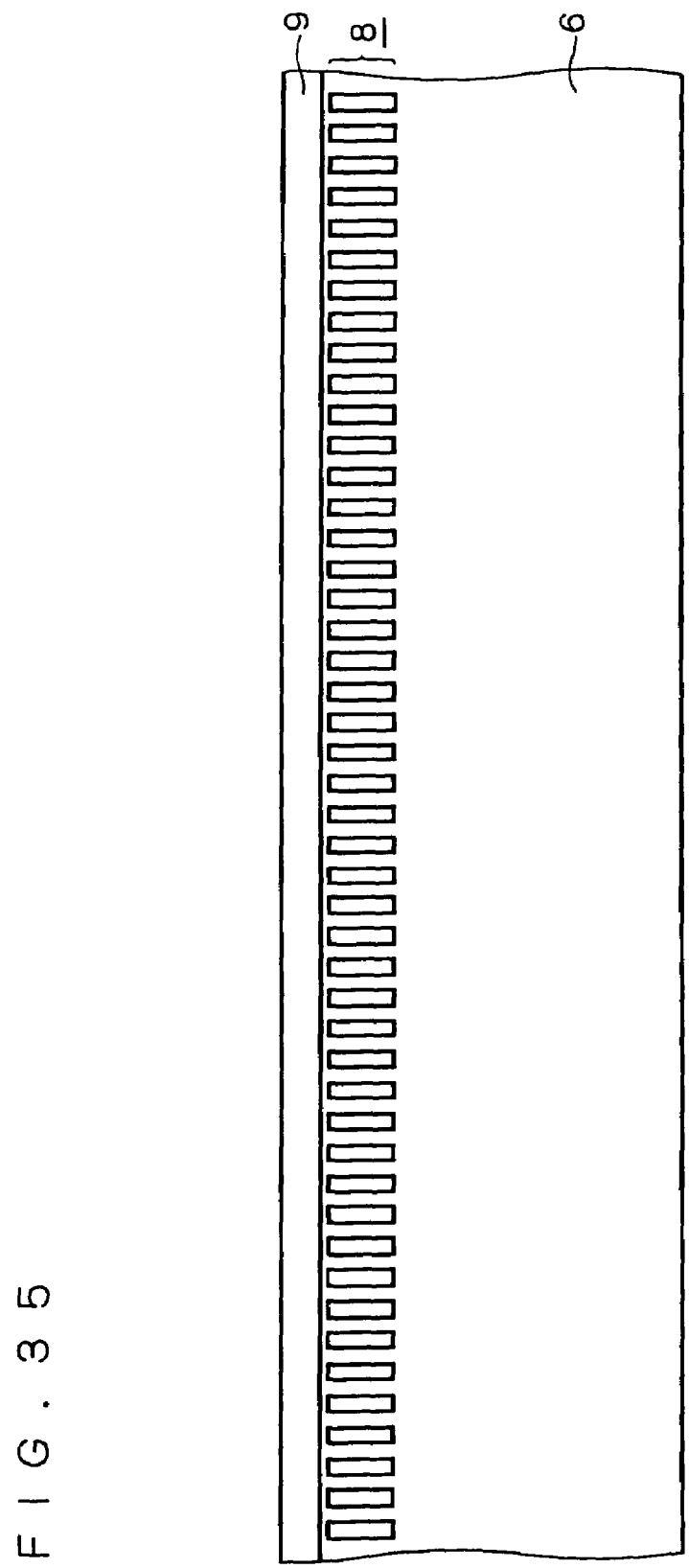

An upper surface of the porous silicon layer 8 maintains a single crystal structure of the silicon substrate 6 and has the same crystal orientation as that of the silicon substrate 6. As shown in FIG. 35, the epitaxial layer 9 having a thickness of approximately 100 nm is formed on the upper surface of the porous silicon layer 8 by an epitaxial growth method. See "Science of Silicon, pp 467-475, edited by Tadahiro Ohmi et al., REALIZE INC." (Document 2), "IEICE TRANS. ELECTRON., VOL. E80-C, NO. 3, MARCH 1997, K. SAKAGUCHI et al., pp 378-387" (Document 3), and "Extended Abstracts of the 1998 International Conference on Solid State Devices and Materials, Hiroshima, 1998, pp 302-303" (Document 4) for the epitaxial growth of silicon on the porous silicon layer.

In the thirteenth embodiment, the porous silicon layer 8 is selectively formed in the N-type variable capacitance formation region A3 and a P-type variable capacitance formation region A4. Thus, in the case in which porous silicon is to be partially formed, surfaces of an NMOS formation region A1 and a PMOS formation region A2 are covered with a resist mask during the anode formation shown in FIG. 31 such that the porous silicon layer 7 is not formed.

Fourteenth Embodiment

A fourteenth embodiment provides a parallel connection type variable capacitance in which an effective Q-value is enhanced by connecting a junction capacitance type variable capacitance (hereinafter referred to as a "junction type variable capacitance") having a great Q-value to an insulated gate type capacitance in parallel because an enhancement in the Q-value is limited with only the insulated gate type capacitance.

Figure 36:
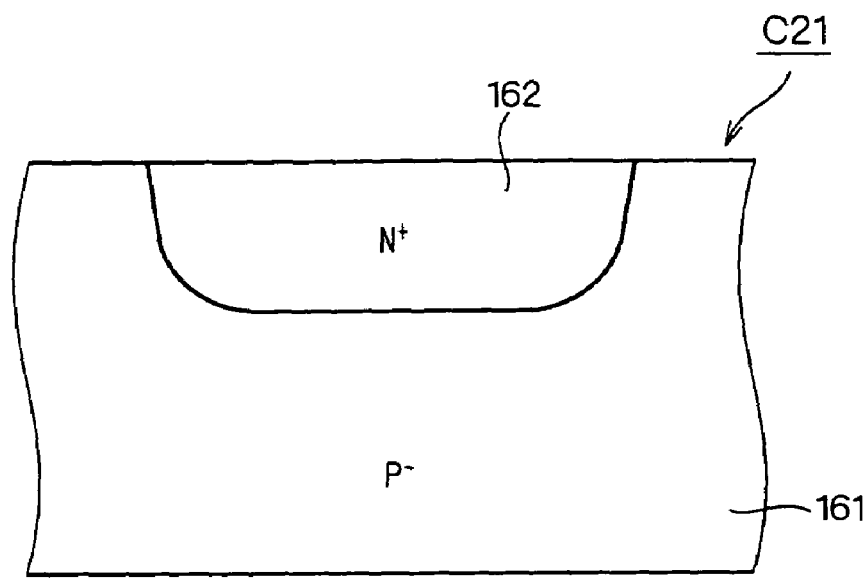
FIG. 36 is a sectional view showing a structure of a junction type variable capacitance according to a fourteenth embodiment.

FIG. 36 is a sectional view showing a structure of a junction type variable capacitance. As shown in FIG. 36, an N⁺ diffusion region 162 is formed in an upper layer portion of a P⁻ substrate 161 to be a bulk substrate so that a junction type variable capacitance C21 having a PN junction surface between the P⁻ substrate 161 and the N⁺ diffusion region 162 can be obtained.

Figure 37:
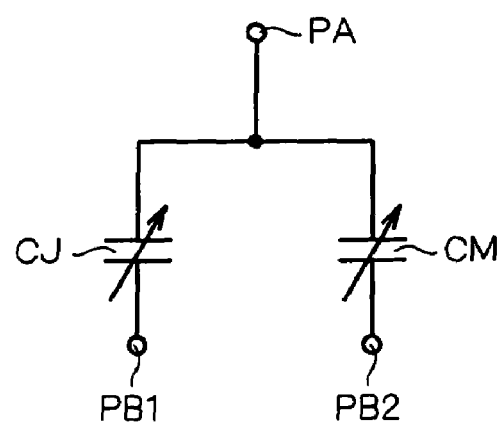
FIG. 37 is a view illustrating an equivalent circuit of a parallel connection type variable capacitance according to the fourteenth embodiment.

FIG. 37 is a diagram illustrating an equivalent circuit of the parallel connection type variable capacitance according to the fourteenth embodiment. As shown in FIG. 37, a junction type variable capacitance CJ (C21) having a great Q-value and an insulated gate type capacitance CM are connected to each other in parallel between a terminal PA and a terminal PB (PB1, PB2). Consequently, an effective Q-value can be increased. Different electric potentials or an equal electric potential may be applied to the terminals PB1 and PB2.

The junction type variable capacitance CJ can variably set a capacitance value depending on a voltage to be applied to the terminal PB1. More specifically, a PN junction is the sum of a depletion layer capacitance and a diffusion capacitance, and the diffusion capacitance can be disregarded in backward biasing and the depletion layer capacitance has a bias voltage dependency. Therefore, a junction capacitance can be used as the variable capacitance.

The insulated gate type variable capacitance CM corresponds to any of the insulated gate type capacitances according to the first to thirteenth embodiments, for example. In this case, a fixed electric potential is applied to an insulated gate (an insulated gate receives a fixed electric potential) so that the insulated gate type variable capacitance CM can be utilized as a fixed capacitance having a structure using an insulated gate structure. More specifically, the circuit structure shown in FIG. 37 can be regarded as a parallel connection of the variable capacitance and the fixed capacitance.

Figure 38:
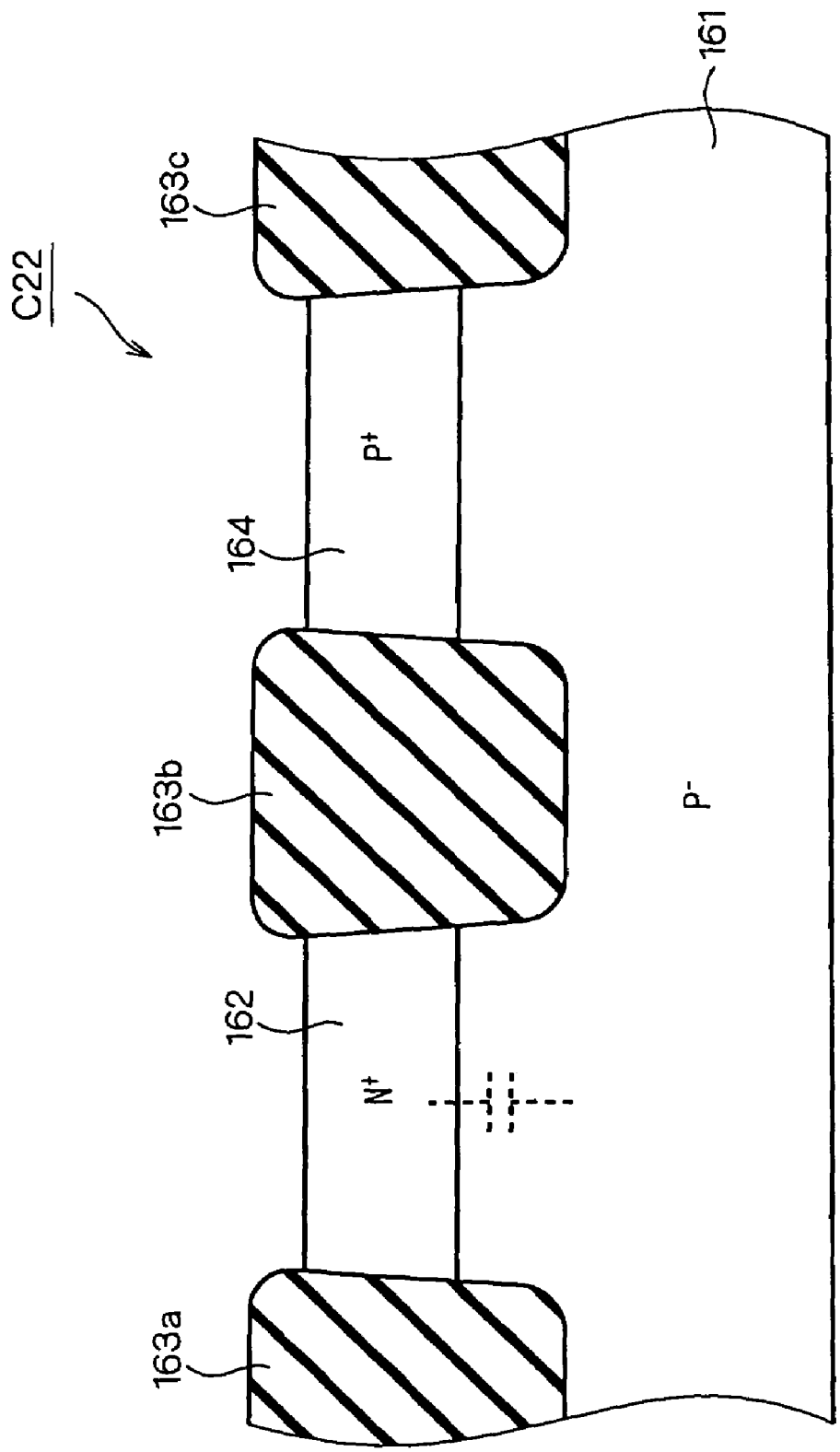
FIG. 38 is a sectional view showing a structure of a junction type variable capacitance in which an isolation is carried out.

FIG. 38 is a sectional view showing a structure of a junction type variable capacitance in a bulk substrate having a structure in which an isolation is carried out. As shown in FIG. 38, an isolating oxide film 163 (163a to 163c) is selectively formed in the upper layer portion of the P$^-$ substrate 161 so that an isolation structure can be obtained.

The N$^+$ diffusion region 162 is formed on the P$^-$ substrate 161 between the isolating oxide films 163a and 163b and a P$^+$ diffusion region 164 is formed on the P$^-$ substrate 161 between the isolating oxide films 163b and 163c. More specifically, a junction type variable capacitance C22 having a PN junction surface of the P$^-$ substrate 161 and the N$^+$ diffusion region 162 is obtained.

In the junction type variable capacitance, the N$^+$ diffusion region 162 and the P$^+$ diffusion region 164 are isolated from each other through the isolating oxide film 163. Therefore, it is possible to obtain the junction type variable capacitance C22 having a sufficient breakdown voltage.

Figure 39:
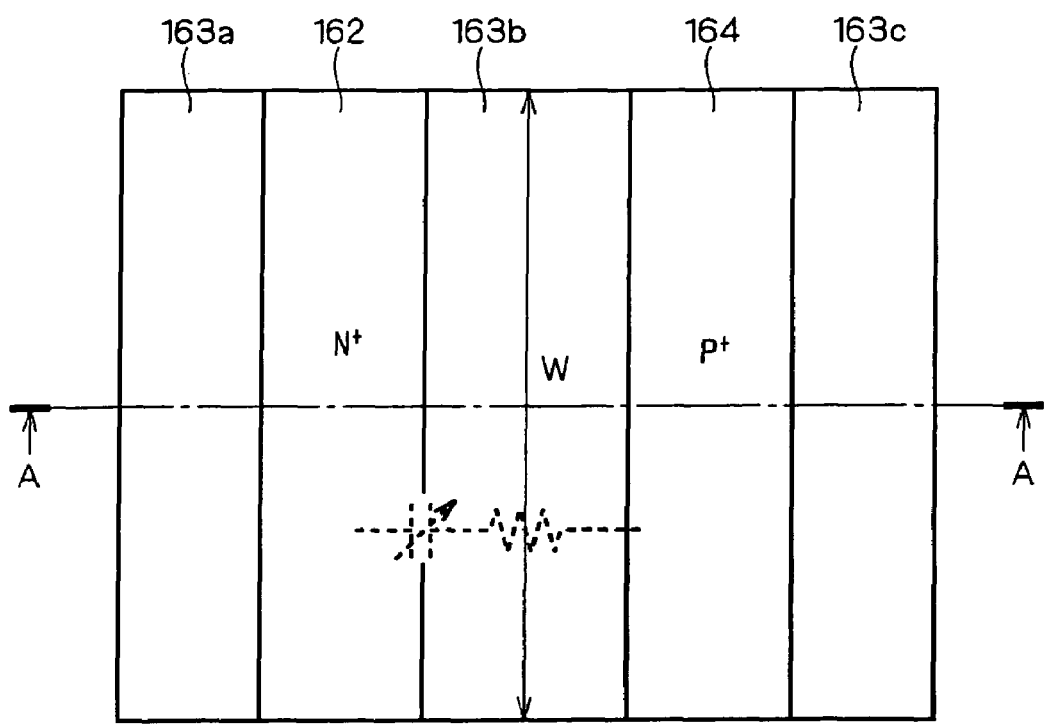
FIG. 39 is a plan view showing a planar structure of the junction type variable capacitance in FIG. 38.

FIG. 39 is a plan view showing a planar structure of the junction type variable capacitance. An A-A section in FIG. 39 corresponds to FIG. 38.

As shown in FIG. 39, a formation width W between the N$^+$ diffusion region 162 and the P$^+$ diffusion region 164 is sufficiently increased so that a d.c. resistance component between the terminals PA and PB1 can be fully reduced.

Fifteenth Embodiment

Figure 40:
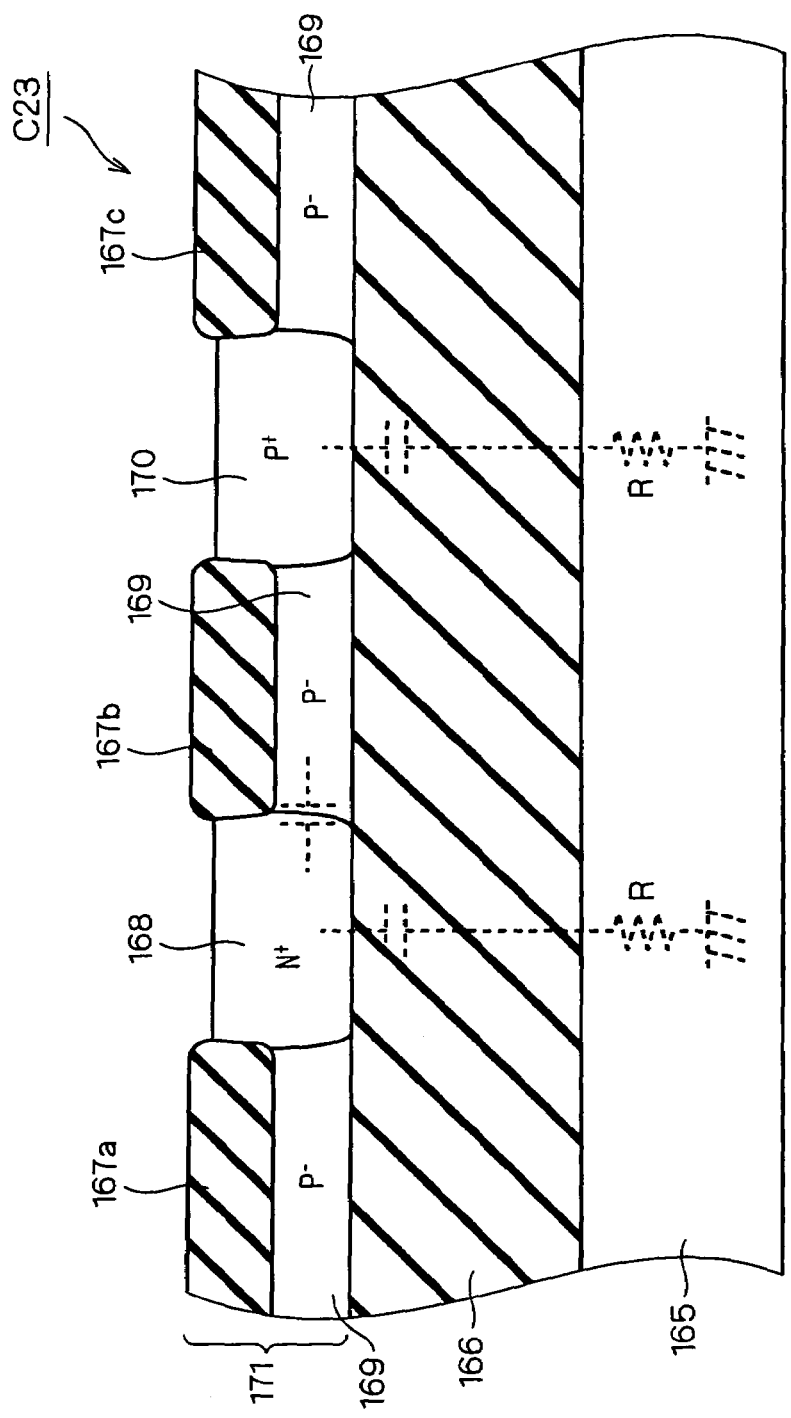
FIG. 40 is a sectional view showing a structure of a junction type variable capacitance according to a fifteenth embodiment of the present invention.

FIG. 40 is a sectional view showing a structure of a junction type variable capacitance according to a fifteenth embodiment of the present invention. As shown in FIG. 40, the junction type variable capacitance according to the fifteenth embodiment is formed on an SOI substrate comprising a support substrate 165, a buried oxide film 166 and an SOI layer 171.

As shown in FIG. 40, the buried oxide film 166 is formed on the support substrate 165 and the SOI layer 171 is provided on the buried oxide film 166. Then, an isolating oxide film 167 (167a to 167c) is selectively formed in an upper layer portion of the SOI layer 171 with a part of the SOI layer 171 remaining as a P$^-$ well region 169. Thus, an isolation (partial isolation) structure can be obtained.

Subsequently, an N$^+$ diffusion region 168 is formed in the SOI layer 171 between the isolating oxide films 167a and 167b and a P$^+$ diffusion region 170 is formed in the SOI layer 171 between the isolating oxide films 167b and 167c. Accordingly, a junction type variable capacitance C23 having a PN junction surface of the P$^-$ well region 169 and the N$^+$ diffusion region 168 can be obtained.

By the presence of the buried oxide film 166, the PN junction surface is provided on only side surfaces of the P$^-$ well region 169 and the N$^+$ diffusion region 168. For this reason, it is necessary to increase a formation region on the side surfaces of the N$^+$ diffusion region 168 and the P$^-$ well region 169, thereby obtaining a necessary junction capacitance.

However, if the formation area on the side surface is made larger to increase the formation areas of the P$^-$ well region 169 and the P$^+$ diffusion region 170, a parasitic capacitance is generated between the support substrate 165 and the buried oxide film 166. If an AC current flows to the support substrate 165 through the parasitic capacitance, a signal loss might be caused by a resistance component of the support substrate 165 and an influence thereof is small in the SOI structure.

By increasing a formation width of the PN junction surface in the N$^+$ diffusion region 168 and the P$^-$ well region 169 in the same manner as a formation width W of the N$^-$ diffusion region 162 or the like in FIG. 39, moreover, the junction type variable capacitance can be increased and a d.c. resistance component can be sufficiently reduced. As a result, a Q-value can be enhanced.

The junction type variable capacitance according to the fifteenth embodiment may be used independently and may be connected to an insulated gate type capacitance in parallel as in the fourteenth embodiment.

Sixteenth Embodiment (First Mode)

Figure 41:
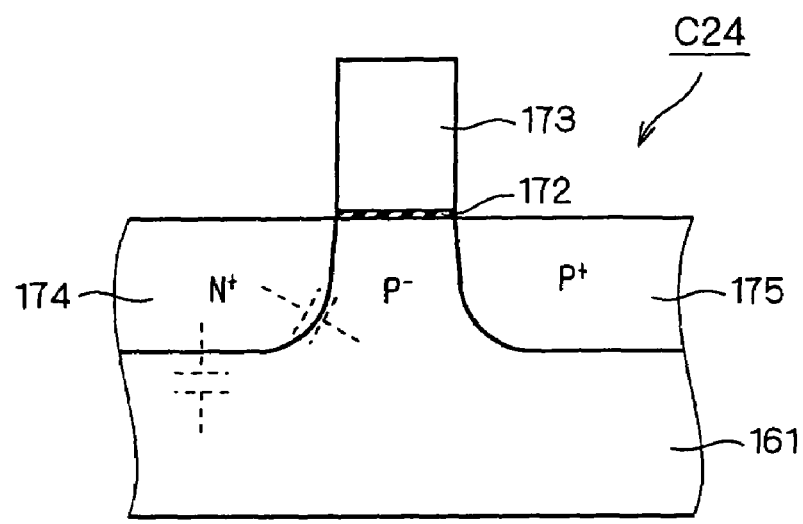
FIG. 41 is a sectional view showing a structure of a first mode of a junction type variable capacitance according to a sixteenth embodiment of the present invention.

FIG. 41 is a sectional view showing a structure of a first mode of a junction type variable capacitance according to a sixteenth embodiment of the present invention. As shown in FIG. 41, an N$^+$ diffusion region 174 and a P$^+$ diffusion region 175 are selectively formed on a P$^-$ substrate 161 to be a bulk substrate and a gate electrode 173 is formed on the P$^-$ substrate 161 between the N$^+$ diffusion region 174 and the P$^+$ diffusion region 175 through a gate oxide film 172.

Accordingly, a junction type variable capacitance C24 having a PN junction surface of the N$^+$ diffusion region 174 and the P$^-$ substrate 161 is obtained.

In the first mode, in the case in which the N$^+$ diffusion region 174 and the P$^+$ diffusion region 175 are to be provided after the formation of the gate electrode 173, a surface (body region) of the P$^-$ substrate 161 provided under the gate electrode 173 is masked by the gate electrode 173. Consequently, it is possible to reduce an impurity concentration in the body region comparatively easily.

As a result, a PN junction of regions having high concentrations can be avoided so that the junction type variable capacitance C24 having a sufficient breakdown voltage can be obtained.

(Second Mode)

Figure 42:
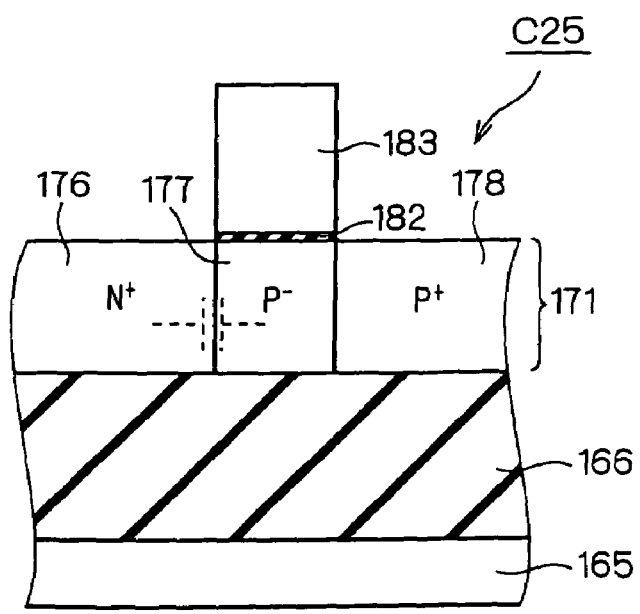
FIG. 42 is a sectional view showing a structure of a second mode of the junction type variable capacitance according to the sixteenth embodiment of the present invention.

FIG. 42 is a sectional view showing a structure of a second mode of the junction type variable capacitance according to the sixteenth embodiment of the present invention. As shown in FIG. 42, an N+ diffusion region 176 and a P+ diffusion region 178 are selectively formed in an SOI layer 171 of an SOI substrate comprising a support substrate 165, a buried oxide film 166 and the SOI layer 171, and a gate electrode 183 is formed on a P− well region 177 to be a region of the SOI layer 171 between the N+ diffusion region 176 and the P+ diffusion region 178 through a gate oxide film 182.

Accordingly, a junction type variable capacitance C25 having a PN junction surface of the N+ diffusion region 176 and the P− well region 177 is obtained.

Also in the second mode, in the same manner as in the first mode, the P− well region 177 (body region) provided under the gate electrode 183 is masked by the gate electrode 183. Consequently, it is possible to reduce an impurity concentration of the P− well region 177 comparatively easily.

As a result, a PN junction of regions having high concentrations can be avoided so that the junction type variable capacitance C25 having a sufficient breakdown voltage can be obtained.

(Third Mode)

FIG. 43 is a sectional view showing a structure of a junction type variable capacitance C26 according to a third mode of the sixteenth embodiment of the present invention. A shown in FIG. 43, an N+ diffusion region 174 and a P+ diffusion region 175 are selectively formed in an upper layer portion of a P− substrate 161, and silicide regions 180 and 181 are formed in upper layer portions of the N+ diffusion region 174 and the P+ diffusion region 175, respectively.

Then, a silicide protection 187 is provided on the P− substrate 161 between the silicide regions 180 and 181.

(Fourth Mode)

FIG. 44 is a sectional view showing a structure of a junction type variable capacitance C27 according to a fourth mode of the sixteenth embodiment of the present invention. As shown in FIG. 44, silicide regions 184 and 185 are formed in upper layer portions of an N+ diffusion region 176 and a P+ diffusion region 178, respectively.

Then, a silicide protection 188 is provided on an SOI layer 171 between the silicide regions 184 and 185. Other structures are the same as those in the second mode shown in FIG. 42.

Thus, the first and second modes of the sixteenth embodiment provide the same structure as that of the MOS transistor excluding conductivity types of the P+ diffusion regions 175 and 178. Therefore, it is possible to carry out manufacture by using most of the process for manufacturing the MOS transistor.

In the third and fourth modes, moreover, the silicide protections 187 and 188 are provided to form the silicide region. Consequently, a resistance can be reduced.

Also in the first and second modes, a side wall can be formed on a side surface of the gate electrode 173 (183) and the silicide region can be formed in the upper layer portions of the N+ diffusion region 174 (176) and the P+ diffusion region 175 (178) by using the gate electrode and the side wall as the silicide protections. Also in the sixteenth embodiment shown in FIG. 40, moreover, it is possible to form the silicide region on surfaces of the N+ diffusion region 168 and the P+ diffusion region 170 by an existing method.

It is desirable that the junction type variable capacitances according to the first to fourth modes should be connected to an insulated gate type capacitance in parallel as in the fourteenth embodiment. Moreover, the second and fourth modes may be used independently.

While the PN junction of N+/P− formed on the P− substrate (well region) has been described in the first to fourth modes, a PN junction of P+/N− formed on an N− substrate (well region) may be used or a junction type variable capacitance may be formed on the N− substrate.

Seventeenth Embodiment (Structure)

Figure 45:
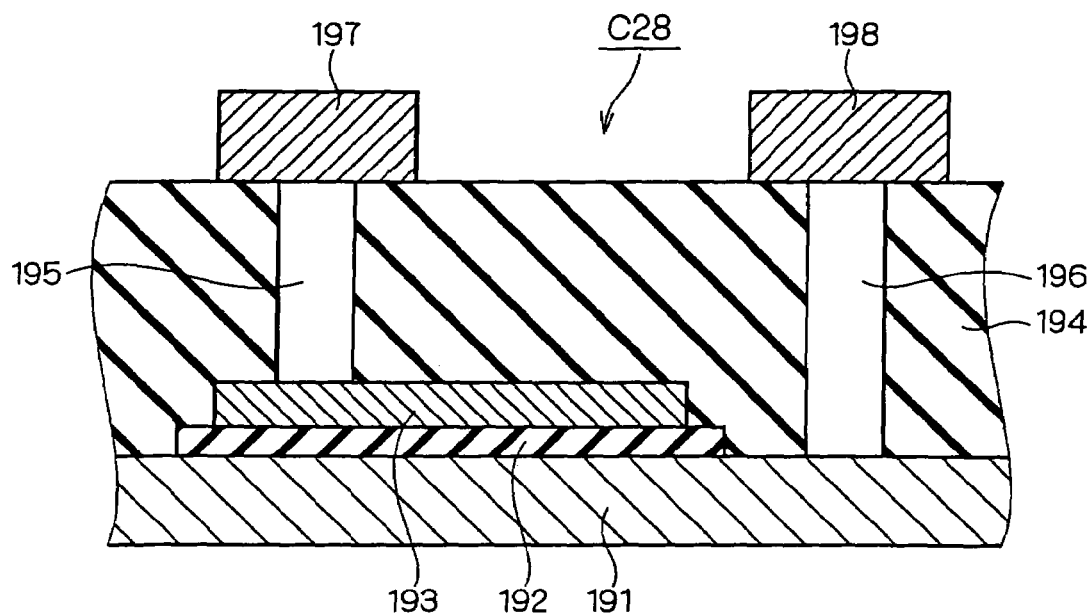
FIG. 45 is a sectional view showing a structure of an MIM type capacitance according to a seventeenth embodiment of the present invention.

FIG. 45 is a sectional view showing a structure of an MIM (Metal Insulator Metal) type capacitance according to a seventeenth embodiment of the present invention.

As shown in FIG. 45, a TiN electrode 193 is formed on an Al electrode 191 through a p (plasma)-SiN film 192. The TiN electrode 193 is electrically connected to an aluminum wiring 197 via a through hole 195 provided in an interlayer insulating film 194. Moreover, the Al electrode 191 penetrates through the interlayer insulating film 194 and is electrically connected to an aluminum wiring 198 via a through hole 196 provided independently of the through hole 195.

In the seventeenth embodiment, thus, an MIM type capacitance C28 is formed by the Al electrode 191, the p-SiN film 192 and the TiN electrode 193. It is desirable that the MIM type capacitance should be connected to an insulated gate type capacitance in parallel as in the junction type variable capacitance according to the fourteenth embodiment.

While the Al electrode 191 and the TiN electrode 193 are formed as electrodes in FIG. 45, a resistance component can be further reduced by using copper (Cu). Moreover, if a ferroelectric film is used in place of the p-SiN film 192, a capacitance component can be increased. Alternatively, a formation area can be reduced with the same capacitance component.

Application Example

Figure 46:
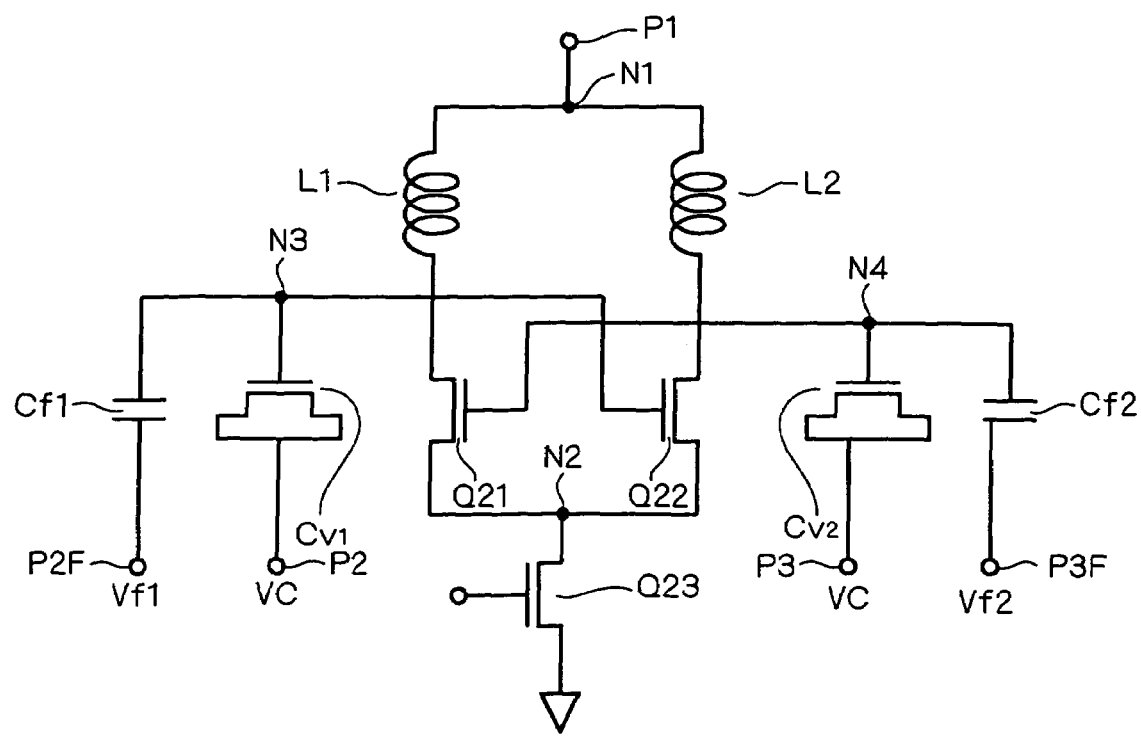
FIG. 46 is a circuit diagram showing an example of a VCO.

FIG. 46 is a circuit diagram showing an example of a VCO. As shown in FIG. 46, a coil L1 and an NMOS transistor Q21 are connected to a coil L2 and an NMOS transistor Q22 in parallel between nodes N1 and N2, respectively. The node N1 is connected to a terminal P1 and the node N2 is grounded through an NMOS transistor Q23. A low voltage V23 is applied to a gate of the NMOS transistor Q23.

A gate of the NMOS transistor Q21 is connected to a node N4, a gate of the NMOS transistor Q22 is connected to a node N3, one of ends of each of a fixed capacitance Cf1 and a variable capacitance Cv1 is connected to the node N3 in parallel, a constant voltage Vf1 is applied to a terminal P2F of the fixed capacitance Cf1, and a control voltage VC is applied to a terminal P2 of the variable capacitance Cv1. On the other hand, one of ends of each of a fixed capacitance Cf2 and a variable capacitance Cv2 is connected to the node N4 in parallel, a constant voltage Vf2 is applied to a terminal P3F of the fixed capacitance Cf2, and the control voltage VC is applied to a terminal P3 of the variable capacitance Cv2.

The VCO having such a structure is operated as an LC type oscillator for changing capacitance values of the variable capacitances Cv1 and Cv2 by the control voltage VC.

For the variable capacitance Cv1, the junction capacitance, the insulated gate type capacitance or the like can be proposed. For the fixed capacitance Cf1, the insulated gate type capacitance having a fixed electric potential of a gate electrode, the MIM type capacitance, a PIP type capacitance which will be described below or the like can be proposed.

The control voltage VC is applied to the terminals P2 and P3, and the variable capacitances Cv of the variable capacitance Cv1 and the variable capacitance Cv2 are changed according to the control voltage VC. On the other hand, fixed capacitances Cf of the fixed capacitance Cf1 and the fixed capacitance Cf2 are constant.

More specifically, C in the equation (2) is determined by the sum of the variable capacitance Cv and the fixed capacitance Cf. Therefore, the equation (2) can be expressed in an equation (3). Accordingly, it is preferable that the variable capacitance Cv should be set by the control voltage VC such that (Cv+Cf) has a desirable value.

[Equation 3]

$$f = \frac{1}{2\pi\sqrt{L(Cv + Cf)}} \quad (3)$$

Description will be given to control for reducing df/dVC to be an amount of a change in an oscillation frequency f for a change in the control voltage VC, thereby suppressing a jitter. The oscillation frequency f of the VCO is determined by the equation (2). More specifically, the oscillation frequency f can be expressed in the following equation (4).

[Equation 4]

$$f = \frac{1}{2\pi} L^{-\frac{1}{2}} C^{-\frac{1}{2}} \quad (4)$$

Accordingly, df/dVC can be obtained by the following equation (5).

[Equation 5]

$$\frac{df}{dVC} = \frac{1}{2\pi} L^{-\frac{1}{2}} \left(-\frac{1}{2}\right) C^{-\frac{3}{2}} \frac{dC}{dVC} \quad (5)$$

In the equation (5), it is necessary to reduce dC/dVC (=dCv/dVC) in order to decrease df/dVC to be referred to as a gain of the VCO.

More specifically, as described above, C in the equation (2) is determined by the sum of the variable capacitance Cv and the fixed capacitance Cf. Therefore, it is possible to decrease a ratio of the variable capacitance Cv to the fixed capacitance Cf, thereby reducing df/dVC. Thus, the jitter of the VCO can be reduced.

Accordingly, the fixed capacitance Cf is implemented by the MIM type capacitance according to the seventeenth embodiment and the variable capacitance Cv is implemented by the insulated gate type capacitance. Consequently, it is possible to obtain a VCO in which the jitter can be reduced at a desirable oscillation frequency f.

While the insulated gate type capacitance is used as the variable capacitance Cv and the MIM type capacitance is used as the fixed capacitance Cf in the application example, a junction type variable capacitance can also be used for the variable capacitance Cv in place of the insulated gate type capacitance.

Moreover, in the case in which a d.c. resistance component can be reduced by a processing such as siliciding, the PIP type capacitance may be used for the fixed capacitance Cf. The PIP type capacitance is of a polysilicon-insulator-polysilicon type.

Eighteenth Embodiment

Figure 47:
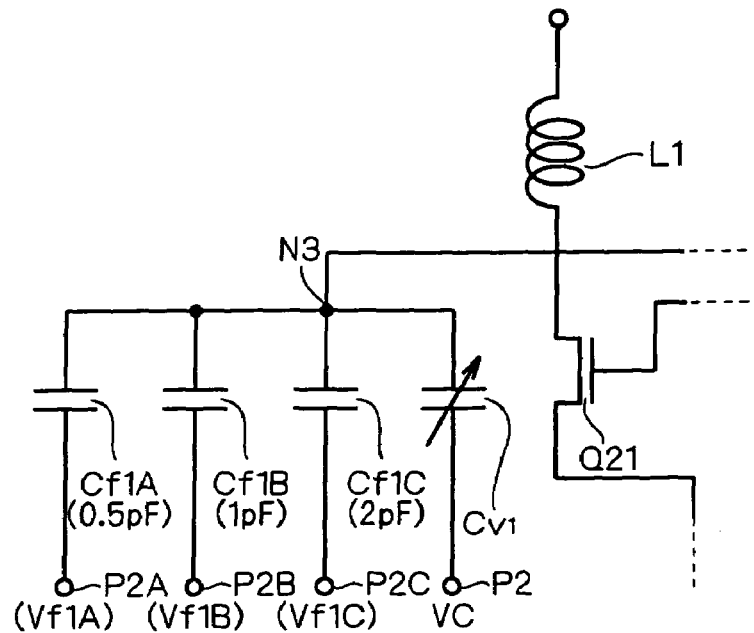
FIG. 47 is a circuit diagram showing a part of a circuit structure of a VCO according to an eighteenth embodiment of the present invention.

FIG. 47 is a circuit diagram showing a part of a circuit structure of a VCO according to an eighteenth embodiment of the present invention. A basic structure is the same as that of the circuit shown in FIG. 46 and different portions will be described below.

One of ends of each of a variable capacitance Cv1 and fixed capacitances Cf1A to Cf1C is connected to a node N3 in parallel, a terminal P2 is connected to the other end of the variable capacitance Cv1, a terminal P2A is connected to the other end of the fixed capacitance Cf1A (a capacitance value of 0.5 pF), a terminal P2B is connected to the other end of the fixed capacitance Cf1B (a capacitance value of 1.0 pF), and a terminal P2C is connected to the other end of the fixed capacitance Cf1C (a capacitance value of 2.0 pF). Three fixed capacitances corresponding to the fixed capacitances Cf1A to Cf1C are connected in parallel to a node N4 together with a variable capacitance Cv2 on the node N4 side in the same manner as the node N3 side, which is not shown in FIG. 47. In the terminals P2A to P2C, presence of a connection can be controlled depending on application (a floating state) of a constant voltage (Vf1A to Vf1C).

In the eighteenth embodiment, thus, the fixed capacitances Cf1A to Cf1C having a plurality of capacitance values with a variation in a size or the like are connected as the fixed capacitances and a predetermined voltage is selectively applied to the terminals P2A to P2C of the fixed capacitances Cf1A to Cf1C so that a plurality of capacitance values can optionally be selected. For example, the fixed capacitance value of 0.5 pF is obtained if a constant voltage Vf1A is applied to only the terminal P2A to bring the terminals P2B and P2C into the floating state, and a fixed capacitance value of 1.5 pF is obtained if constant voltages Vf1A and Vf1B are applied to the terminals P2A and P2B to bring the terminal P2C into the floating state.

In the eighteenth embodiment, thus, the application of a constant voltage to the terminals P2A to P2C is optionally selected so that the fixed capacitance value can be selected at an interval of 0.5 pF between 0.0 pF and 3.5 pF. Consequently, a central value of an oscillation frequency f can be changed greatly.

Examples of the fixed capacitances Cf1A to Cf1C include an MIM type capacitance, a PIP type capacitance, an invariable insulated gate type capacitance and the like.

Nineteenth Embodiment

Figure 48:
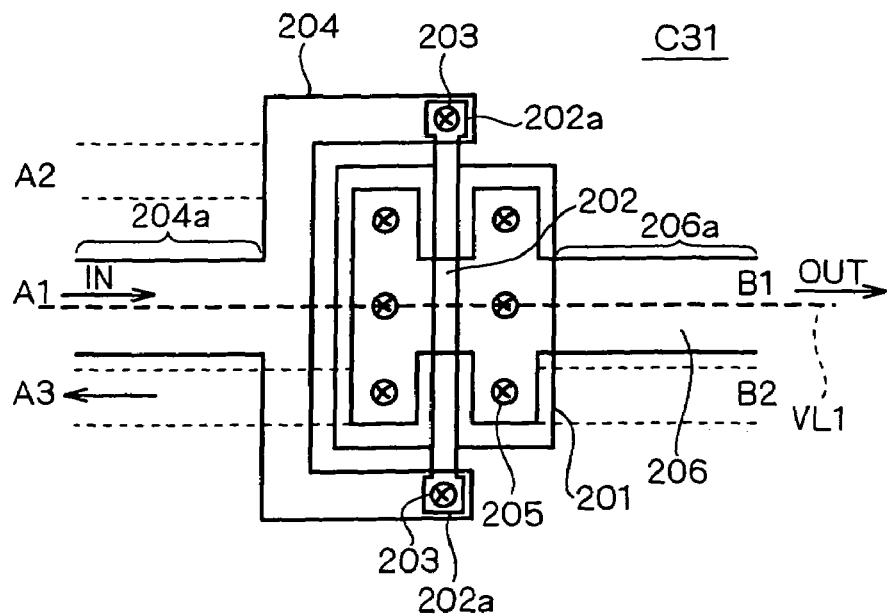
FIG. 48 is a plan view showing a gate contact structure of an insulated gate type capacitance according to a nineteenth embodiment of the present invention.

It is important that a resistance value of a gate resistor should be decreased in an insulated gate type capacitance. FIG. 48 is a plan view showing a gate contact structure of an insulated gate type capacitance according to a nineteenth embodiment of the present invention.

As shown in FIG. 48, a gate electrode 202 provided on a field region 201 has a gate contact pad 202a provided on both ends thereof, and a metal wiring 204 provided around the field region 201 is electrically connected to the gate contact pad 202a on both ends through a gate contact 203.

In an insulated gate type capacitance C31, moreover, the field region 201 and a metal wiring 206 are electrically connected to each other through a plurality of contacts 205. The metal wirings 204 and 206 have signal propagating portions 204a and 206a formed along a virtual line VL1, respectively. More specifically, an input signal IN to be propagated to the signal propagating portion 204a of the metal wiring 204 is sent as an output signal OUT from the signal propagating portion 206a of the metal wiring 206.

In the insulated gate type capacitance C31 according to the nineteenth embodiment, thus, the gate contact 203 is provided in the gate contact pad 202a on both ends of the gate electrode 202, and the gate electrode 202 and the metal wiring 204 are electrically connected to each other. Consequently, it is possible to reduce a gate resistance of the gate electrode 202.

Moreover, since the signal propagating portion 204a of the metal wiring 204 and the signal propagating portion 206a of the metal wiring 206 are formed along the virtual line VL1, a high frequency signal can be sent linearly. Consequently, it is possible to obtain a desirable layout structure for a high frequency device in which a resistance can be reduced and signal propagation has no loss.

While the signal propagating portion 204a of the metal wiring 204 is formed in a position indicated as A1 in FIG. 48, it may be formed in a position indicated as A2 or A3. While the signal propagating portion 206a of the metal wiring 206 is formed in a position indicated as B1 in FIG. 48, it may be formed in a position indicated as B2.

For example, if the signal propagating portion 204a is formed in the position indicated as A2 and the signal propagating portion 206a is formed in the position indicated as B2, the signal propagating portion 204a and the signal propagating portion 206a are not formed along a virtual line such as the virtual line VL1. Therefore, a transmission efficiency is decreased and a jitter component of a VCO is increased. Thus, a circuit performance is reduced.

Twentieth Embodiment (First Mode)

Figure 49:
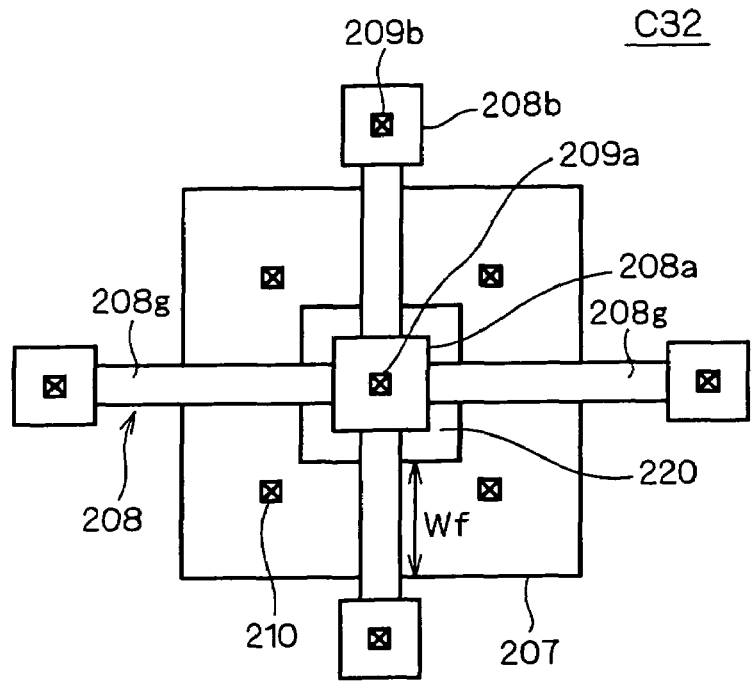
FIG. 49 is a plan view showing a first mode of a gate contact structure of an insulated gate type capacitance according to a twentieth embodiment of the present invention.

FIG. 49 is a plan view showing a first mode of a gate contact structure of an insulated gate type capacitance according to a twentieth embodiment of the present invention. As shown in FIG. 49, a field region 207 provided with a rectangular hollow portion on a center and having a rectangular peripheral shape is formed and a gate electrode 208 is formed with four partial gate electrode portions 208g uniformly extended in four directions around a gate contact pad 208a provided on a hollow portion 220. Gate contact pads 208b are formed on tips of the four partial gate electrode portions 208g, respectively. A sectional structure of the insulated gate type capacitance is the same as the sectional structure of the insulated gate type capacitance described in each of the first to thirteenth embodiments or the like.

One gate contact pad 208a and four gate contact pads 208b can be electrically connected to an aluminum wiring (not shown) or the like through one gate contact 209a and four gate contacts 209b, respectively.

In an insulated gate type capacitance C32 having such a structure, the partial gate electrode portion 208g is extended from the hollow portion 220 in four directions so that the gate electrode 208 is formed. Therefore, it is possible to reduce a gate resistance by decreasing a gate width Wf defined by a formation width of the partial gate electrode portion 208g.

As shown in FIG. 49, moreover, the four partial gate electrode portions 208g are uniformly formed in the four directions (upward, downward, left and right). Consequently, it is possible to form the gate electrode 208 in a pattern shape which can be formed comparatively easily without an oblique direction.

While only the gate contact pad 208a may be provided, four gate contact pads 208b can be added to increase an electrical connecting portion to an aluminum wiring or the like, thereby further reducing the gate resistance.

Moreover, since a body electrode portion can be enlarged in the first mode, a parasitic resistance in that portion can be decreased.

(Second Mode)

Figure 50:
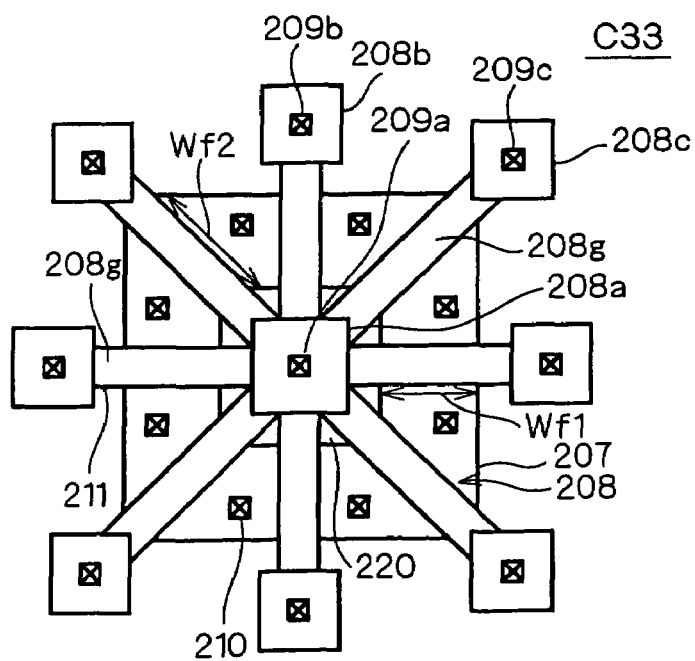
FIG. 50 is a plan view showing a second mode of the gate contact structure of the insulated gate type capacitance according to the twentieth embodiment of the present invention.

FIG. 50 is a plan view showing a second mode of the gate contact structure of the insulated gate type capacitance according to the twentieth embodiment of the present invention. As shown in FIG. 50, a field region 207 provided with a rectangular hollow portion on a center and having a rectangular peripheral shape is formed and a gate electrode 208 uniformly has eight partial gate electrode portions 208g in eight directions around a gate contact pad 208a provided on a hollow portion 220. Gate contact pads 208b and 208c (a pad in the vicinity of a central portion on the outer periphery of the field region 207 and a pad in a corner portion on the outer periphery of the field region 207) are formed on tips of the partial gate electrode portions 208g, respectively.

One gate contact pad 208a, four gate contact pads 208b and four gate contact pads 208c can be electrically connected to an aluminum wiring (not shown) or the like through one gate contact 209a, four gate contacts 209b and four gate contacts 209c, respectively.

An insulated gate type capacitance C33 having such a structure is provided with the partial gate electrode portion 208g extended from the hollow portion 220 in the eight directions. In the same manner as in the first mode, therefore, it is possible to further reduce a gate resistance by decreasing individual gate widths (Wf1, Wf2).

While only the gate contact pad 208a may be provided, eight gate contact pads 208b and 208c in total can be added to increase an electrical connecting portion to an aluminum wiring or the like, thereby further reducing the gate resistance.

Moreover, since a body electrode portion can be enlarged in the second mode, a parasitic resistance in that portion can be decreased.

(Third Mode)

Figure 51:
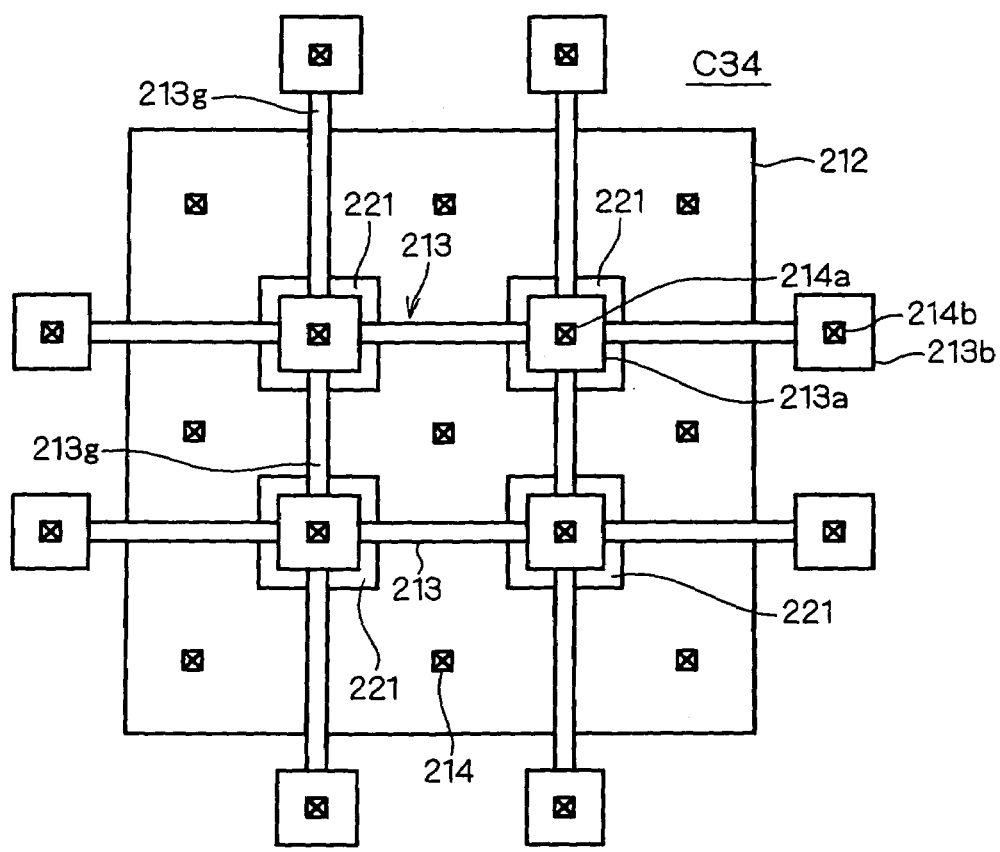
FIG. 51 is a plan view showing a third mode of the gate contact structure of the insulated gate type capacitance according to the twentieth embodiment of the present invention.
Figure 52:
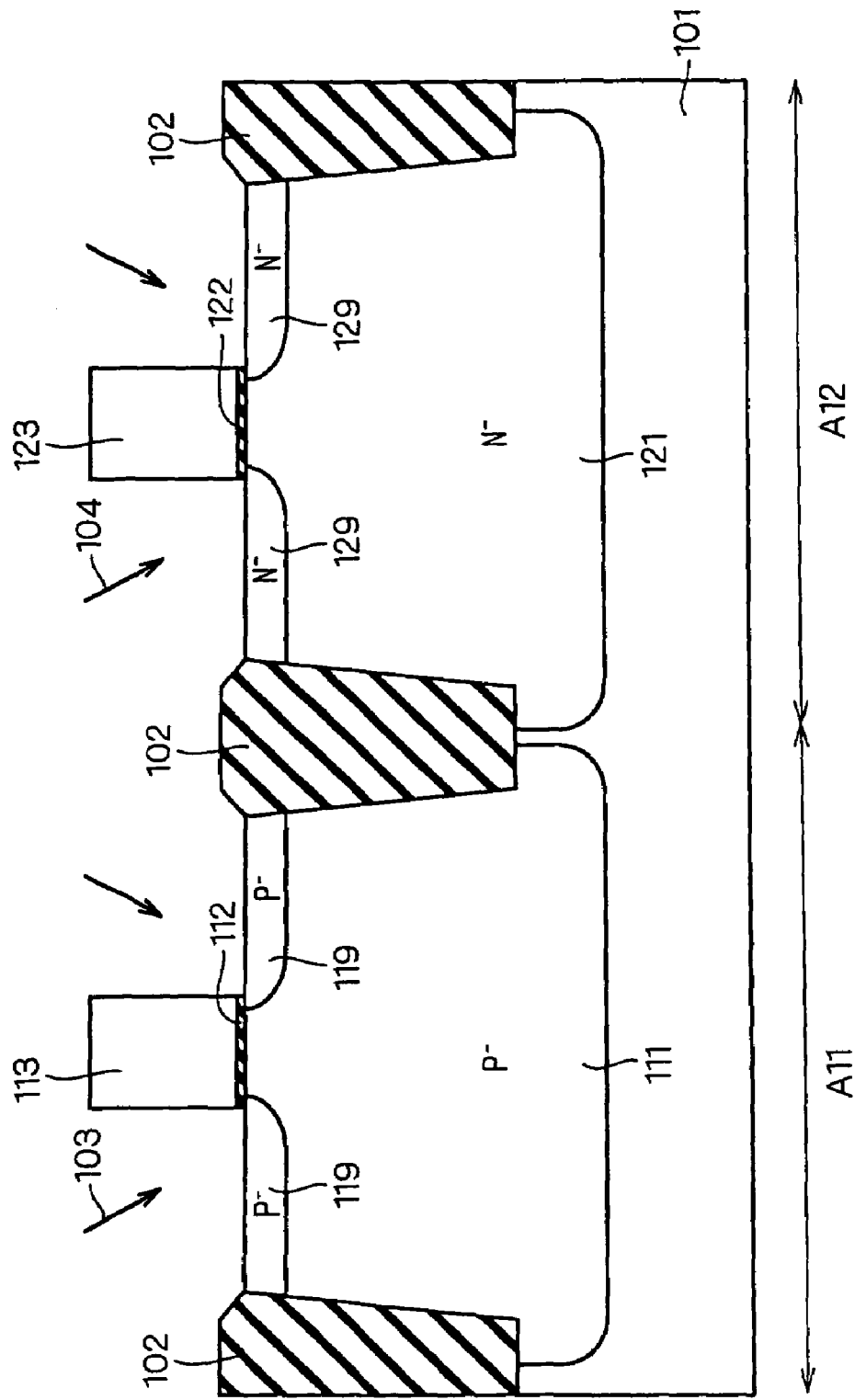
FIGS. 52 and 53 are sectional views showing a method of manufacturing a MOS transistor having a pocket region according to a conventional art.
Figure 53:
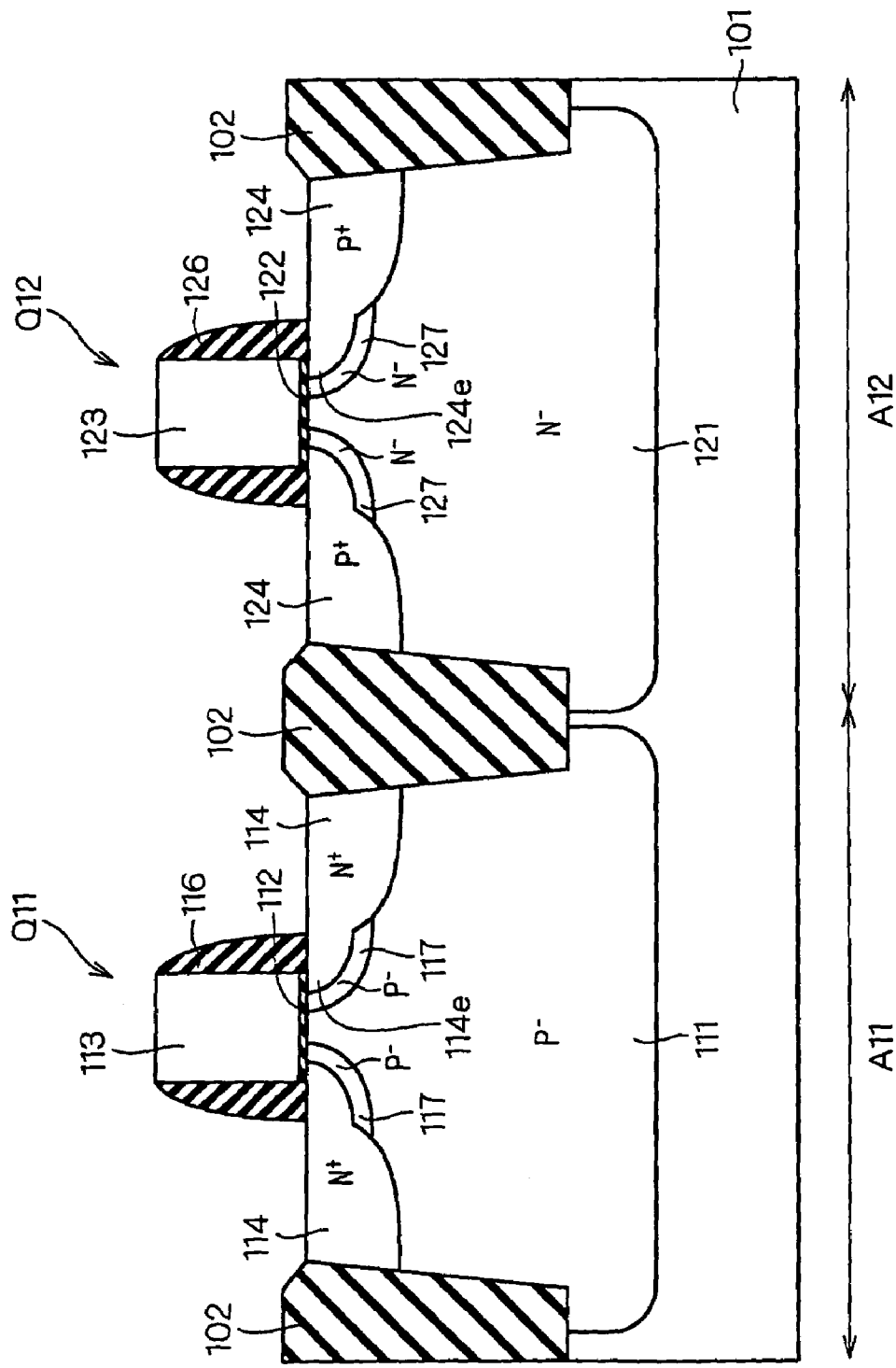
Figure 54:
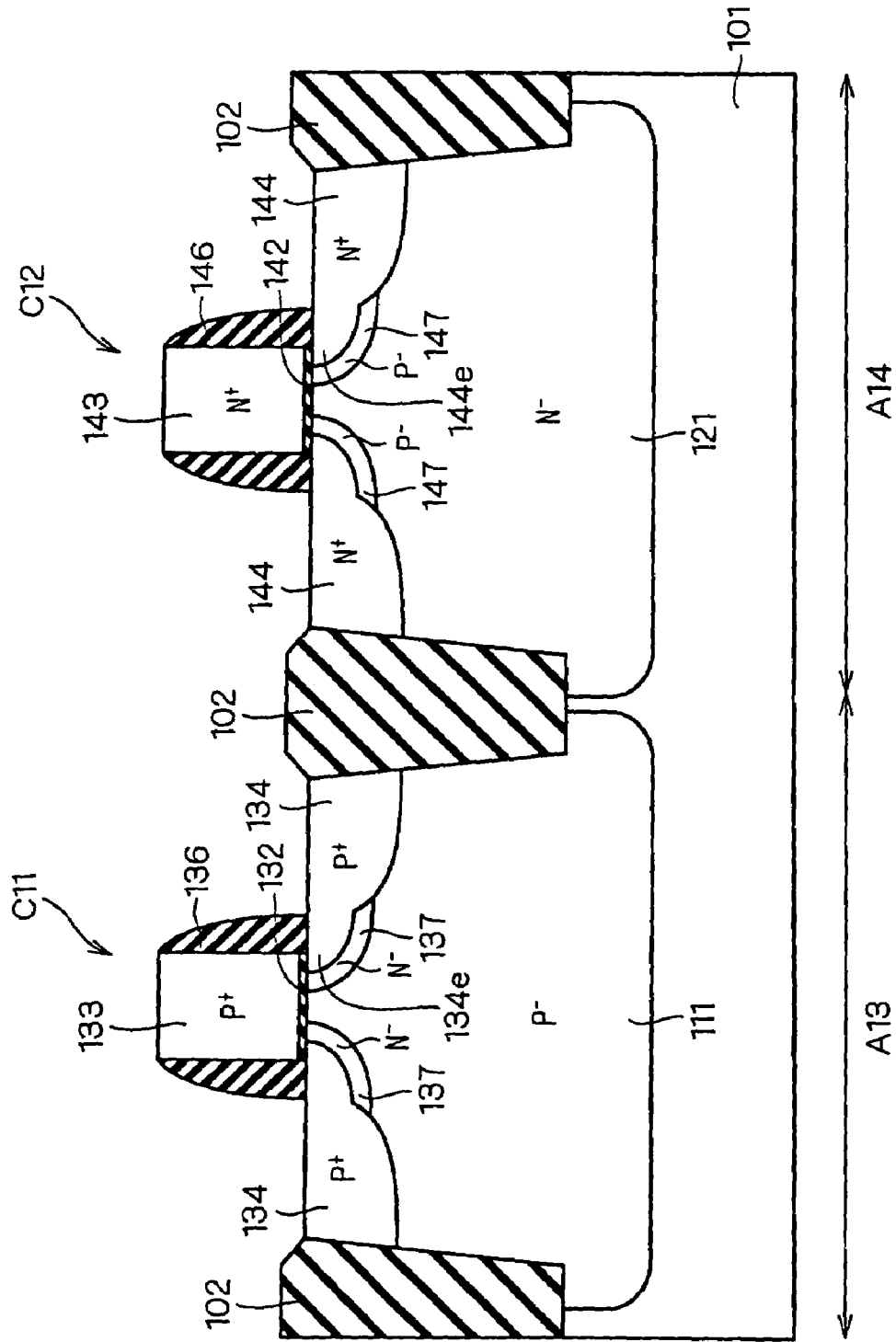
FIG. 54 is a sectional view showing a structure of a variable capacitance.
Figure 55:
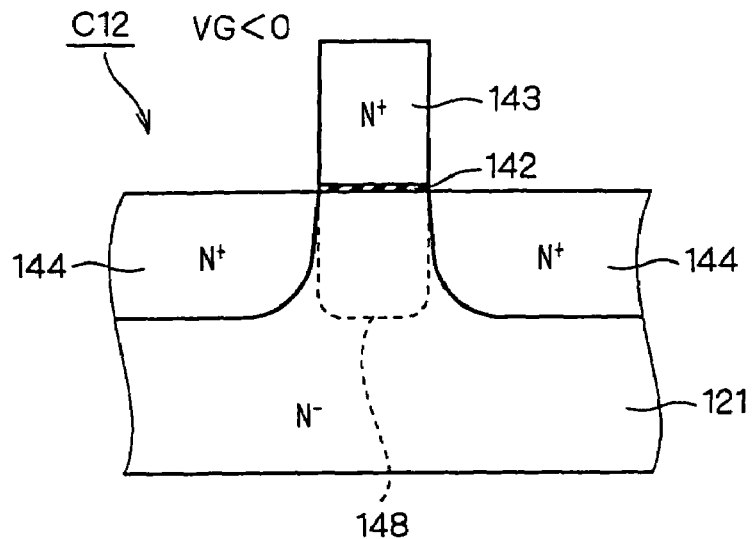
FIGS. 55 and 56 are views illustrating an operation for setting a capacitance value of the variable capacitance.
Figure 56:
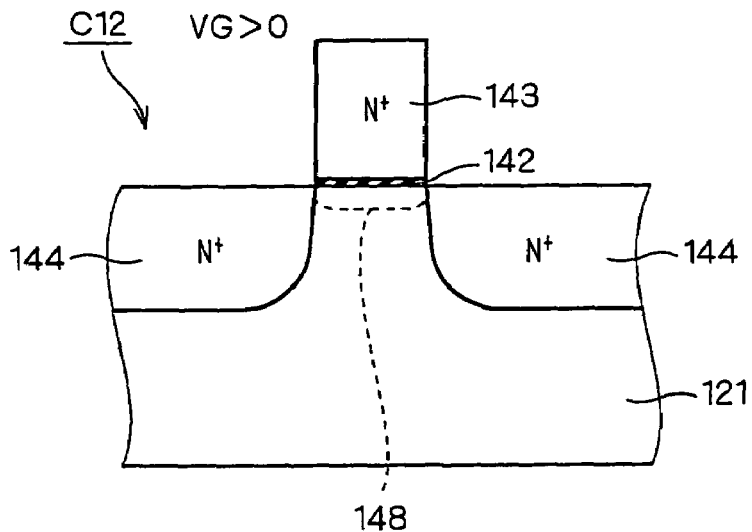
Figure 57:
FIG. 57 is a circuit diagram showing an equivalent circuit of the variable capacitance illustrated in FIG. 54.

FIG. 51 is a plan view showing a third mode of the gate contact structure of the insulated gate type capacitance according to the twentieth embodiment of the present invention. As shown in FIG. 51, a field region 212 provided with a rectangular hollow portion 221 on four portions therein and having a rectangular peripheral shape is formed and a gate electrode 213 is formed with four partial gate electrode portions 213g uniformly extended in four directions around a gate contact pad 213a provided on each hollow portion 221. Then, a gate contact pad 213b is formed on a tip of the partial gate electrode portion 213g which is provided on the outside of the field region 212.

Four gate contact pads 213a and eight gate contact pads 213b can be electrically connected to an aluminum wiring (not shown) or the like through four gate contacts 214b and eight gate contacts 214b, respectively.

An insulated gate type capacitance C34 according to the third mode has an equivalent structure to a structure in which four insulated gate type capacitances according to the first mode are arranged on a plane in vertical and transverse directions. The partial gate electrode portion 213g is extended from each hollow portion 221 in the four directions. By decreasing individual gate widths, therefore, it is possible to reduce a gate resistance depending on the number of the hollow portions 221.

While only the four gate contact pads 213a may be provided, eight gate contact pads 213b can be added to increase an electrical connecting portion to an aluminum wiring or the like, thereby further reducing the gate resistance.

Moreover, since a body electrode portion can be enlarged in the third mode, a parasitic resistance in that portion can be decreased.

<Others>

In the structures according to the fourteenth to twentieth embodiments, the insulated gate type capacitance can be added to the semiconductor device according to each of the first to thirteenth embodiments or can be used for further improving the insulated gate type capacitance of the semiconductor device according to each of the first to thirteenth embodiments. Thus, various combinations can be applied.

While the invention has been shown and described in detail, the foregoing description is in all aspects illustrative and not restrictive. It is therefore understood that numerous modifications and variations can be devised without departing from the scope of the invention. hollow portion 221. Then, a gate contact pad 213b is formed on a tip of the partial gate electrode portion 213g which is provided on the outside of the field region 212.

Four gate contact pads 213a and eight gate contact pads 213b can be electrically connected to an aluminum wiring (not shown) or the like through four gate contacts 214b and eight gate contacts 214b, respectively.

An insulated gate type capacitance C34 according to the third mode has an equivalent structure to a structure in which four insulated gate type capacitances according to the first mode are arranged on a plane in vertical and transverse directions. The partial gate electrode portion 213g is extended from each hollow portion 221 in the four directions. By decreasing individual gate widths, therefore, it is possible to reduce a gate resistance depending on the number of the hollow portions 221.

While only the four gate contact pads 213a may be provided, eight gate contact pads 213b can be added to increase an electrical connecting portion to an aluminum wiring or the like, thereby further reducing the gate resistance.

Moreover, since a body electrode portion can be enlarged in the third mode, a parasitic resistance in that portion can be decreased.

<Others>

In the structures according to the fourteenth to twentieth embodiments, the insulated gate type capacitance can be added to the semiconductor device according to each of the first to thirteenth embodiments or can be used for further improving the insulated gate type capacitance of the semiconductor device according to each of the first to thirteenth embodiments. Thus, various combinations can be applied.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising an insulated gate type capacitance formed in a semiconductor substrate, said insulated gate type capacitance including: a gate insulating film for a capacitance selectively formed on said semiconductor substrate; a gate electrode for a capacitance formed on said gate insulating film for a capacitance; and extraction electrode regions formed to interpose therebetween a body region for a capacitance which is provided under said gate electrode for a capacitance in a surface of said semiconductor substrate, wherein each of said extraction electrode regions have a hollow portion in a central region seen on a plane, and said gate electrode for a capacitance has a plurality of partial gate portions extended from said hollow portion radially as seen on a plane.

2. The semiconductor device according to claim 1, wherein said plurality of partial gate portions include four partial gate portions which are uniformly extended from said hollow portion in four directions.

3. The semiconductor device according to claim 1, wherein said plurality of partial gate portions include eight partial gate portions which are extended from said hollow portion in eight directions.

4. The semiconductor device according to claim 1, wherein said hollow portion includes a plurality of hollow portions, wherein predetermined numbers of said partial gate portions are respectively extended from said hollow portion radially as seen on a plane to form said plurality of partial gate portions.

* * * * *